United States Patent
Oka et al.

(10) Patent No.: US 7,652,917 B2
(45) Date of Patent: Jan. 26, 2010

(54) SEMICONDUCTOR DEVICE

(75) Inventors: Yasushi Oka, Tokyo (JP); Kazuyoshi Shiba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/260,124

(22) Filed: Oct. 29, 2008

(65) Prior Publication Data

US 2009/0059677 A1 Mar. 5, 2009

Related U.S. Application Data

(63) Continuation of application No. 11/470,651, filed on Sep. 7, 2006, now Pat. No. 7,460,396.

(30) Foreign Application Priority Data

Sep. 13, 2005 (JP) .............................. 2005-265548
May 19, 2006 (JP) .............................. 2006-139823

(51) Int. Cl.
*G11C 11/34* (2006.01)
*G11C 16/04* (2006.01)
(52) U.S. Cl. ............................ 365/185.01; 365/185.26; 365/185.28; 365/185.29; 257/316
(58) Field of Classification Search ............ 365/185.01, 365/185.26, 185.28, 185.29; 257/315, 316
See application file for complete search history.

(56) References Cited

U.S. PATENT DOCUMENTS

| | | | |
|---|---|---|---|
| 5,301,150 A | 4/1994 | Sullivan et al. | |
| 6,466,482 B2 | 10/2002 | Shukuri et al. | |
| 6,788,574 B1 | 9/2004 | Han et al. | |
| 6,906,954 B2 | 6/2005 | Shukuri et al. | |
| 7,388,777 B2 | 6/2008 | Shiba et al. | |
| 2002/0012272 A1* | 1/2002 | Shukuri et al. | 365/185.24 |
| 2004/0245567 A1* | 12/2004 | Kawasaki | 257/315 |
| 2005/0041477 A1* | 2/2005 | Lee et al. | 365/185.29 |
| 2005/0270850 A1* | 12/2005 | Wang et al. | 365/185.28 |
| 2006/0050566 A1* | 3/2006 | Shiba et al. | 365/185.28 |
| 2007/0007577 A1* | 1/2007 | Bandyopadhyay et al. | 257/315 |

FOREIGN PATENT DOCUMENTS

| | | | |
|---|---|---|---|
| JP | 2001-185633 A | | 7/2001 |
| JP | 2001-257324 A | | 9/2001 |

OTHER PUBLICATIONS

Carman et al., "Single Poly EEPROM for Smart Power IC's", ISPSO, May 2000, pp. 177-179.

* cited by examiner

*Primary Examiner*—Pho M Luu
*Assistant Examiner*—Toan Le
(74) *Attorney, Agent, or Firm*—Miles & Stockbridge P.C.

(57) ABSTRACT

In a data program/erase device of a nonvolatile memory cell, data are re-written by means of an FN tunnel current of an entire channel surface. In a buried n-well of a semiconductor substrate in a flash memory formation region, p wells are placed in the form isolated from each other. In each of the p wells, a capacitor portion, a capacitor portion for programming/erasing data and an MIS•FET for reading data are placed. In the capacitor portion for programming/erasing data, rewriting (programming and erasing) of data is performed by means of an FN tunnel current of an entire channel surface.

28 Claims, 52 Drawing Sheets

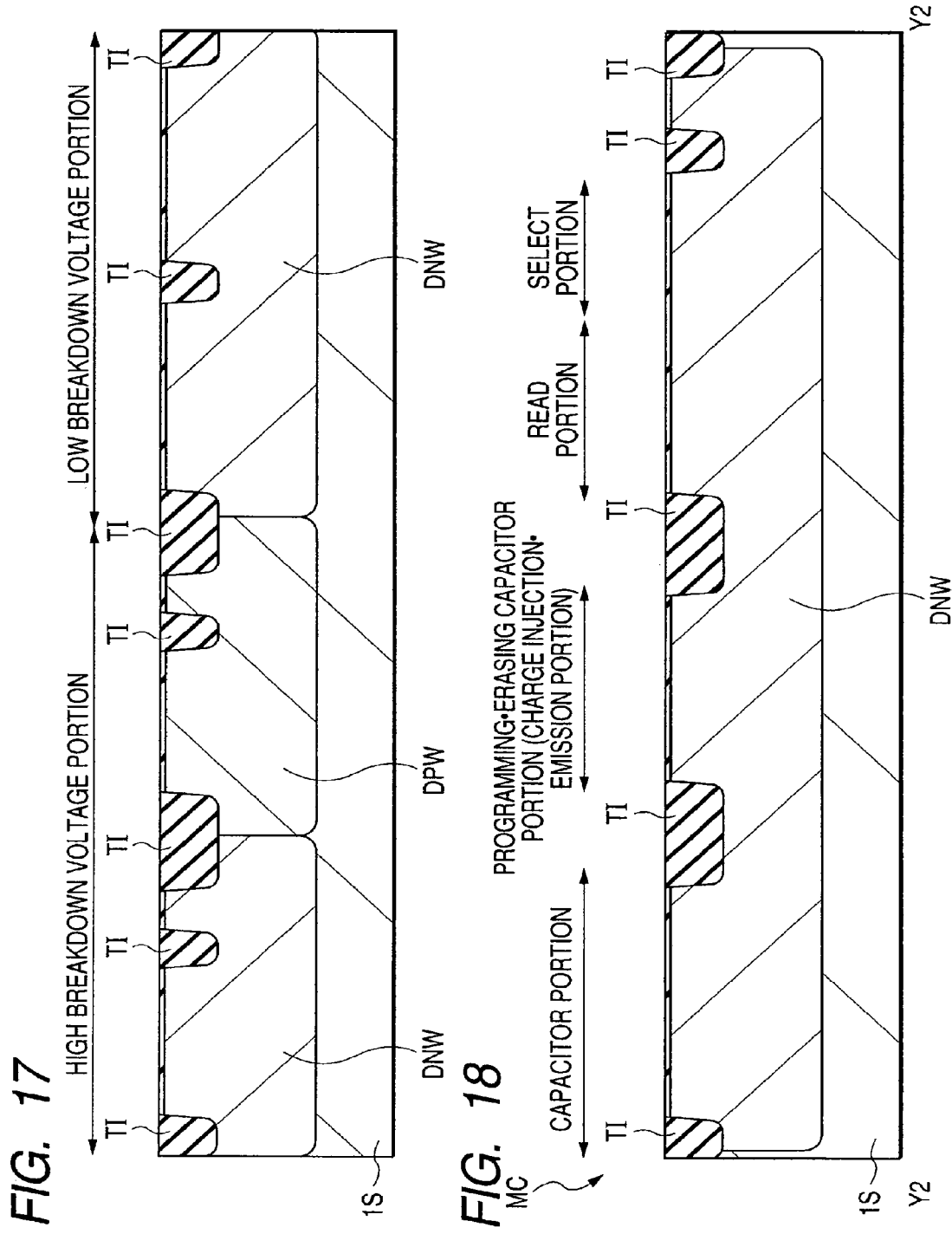

SEMICONDUCTOR DEVICE

CROSS-REFERENCE TO RELATED APPLICATION

This application is a continuation of application Ser. No. 11/470,651 filled Sep. 7, 2006, now U.S. Pat. No. 7,460,396, issued Dec. 2, 2008. The present application also claims priority from Japanese patent applications No. 2006-139823 filed on May 19, 2006, and No. 2005-265548 filed on Sep. 13, 2005, the contents of which are hereby incorporated by reference into this application.

BACKGROUND OF THE INVENTION

The present invention relates to a manufacturing technology of a semiconductor device, in particular, to a technology effective when applied to a semiconductor device having a nonvolatile memory.

Some semiconductor devices have, therein, a nonvolatile memory circuit portion for storing data of a relatively small capacity to be used, for example, during trimming, data rescue or image adjustment of LCD (Liquid Crystal Device), or storing production number of the devices.

A semiconductor device having such a nonvolatile memory circuit portion is described, for example, in Japanese Unexamined Patent Publication No. 2001-185633 (Patent Document 1). This document discloses a single level•poly-EEPROM device which is an EEPROM (Electric Erasable Programmable Read Only Memory) device formed over a single conductive layer placed over a semiconductor substrate while being isolated therefrom via an insulating layer and can have a reduced area per bit.

Japanese Unexamined Patent Publication No. 2001-257324 (Patent Document 2) discloses a technology capable of improving the long-term data retaining capacity of a nonvolatile memory device formed by the single-layer poly-flash technology.

For example, in FIG. 7 of U.S. Pat. No. 6,788,574 (Patent Document 3), disclosed is a structure having a capacitor portion, a program transistor and a readout transistor, each isolated by an n well. In columns 6 and 7 of FIGS. 4A to 4C of Patent Document 3, disclosed is a constitution in which program/erase is effected by means of an FN tunneling current.

SUMMARY OF THE INVENTION

The present inventors have investigated, in the above-described nonvolatile memory, programming of data in a programmable field effect transistor while utilizing an FN tunneling current of an entire channel surface. As a result it has been found that data programming using the FN tunneling current causes various problems, for example, the programmable field effect transistor is deteriorated, rewriting of data cannot be performed stably, and data cannot be programmed successfully because the junction breakdown voltage between semiconductor regions for source and drain of a programmable field effect transistor and a well thereof exceeds the limit to cause breakdown.

An object of the present invention is to provide a technology, in an element of a nonvolatile memory cell for programming and erasing data, capable of rewriting the data by utilizing an FN tunneling current of an entire channel surface.

The above-described and the other objects and novel features of the present invention will be apparent by the description herein and accompanying drawings.

Outline of the typical invention, of the inventions disclosed by the present invention, will hereinafter be described.

In the present invention, there is thus provided a nonvolatile memory cell having an element for programming and erasing data and a transistor for reading the data, which use a floating gate electrode in common as a gate electrode, wherein the element for programming and erasing data and the transistor for reading the data are placed in respective wells having the same conductivity type but electrically isolated from each other; and a pair of semiconductor regions of the element for programming and erasing data are made of a semiconductor region having a conductivity type equal to that of the well.

Advantages available by the typical invention, among the inventions disclosed by the present application, will next be described briefly.

In a nonvolatile memory cell having an element for programming and erasing data and a transistor for reading the data which have a floating gate electrode in common as a gate electrode, the element for programming and erasing data and the transistor for reading the data are disposed in wells having the same conductivity type but electrically separated from each other; and a pair of semiconductor regions of the element for programming and erasing data are made of a semiconductor region having a conductivity type equal to that of the well. This makes it possible, in the element of the nonvolatile memory cell for programming and erasing data, to rewrite data by means of an FN tunneling current of an entire channel surface.

BRIEF DESCRIPTION OF THE DRAWINGS

FIG. 17 is a fragmentary cross-sectional view of a semiconductor substrate in a main circuit formation region during a manufacturing step of a semiconductor device according to another embodiment of the present invention;

FIG. 18 is a fragmentary cross-sectional view of a semiconductor substrate in a nonvolatile memory region in the same step as that of FIG. 17;

DETAILED DESCRIPTION OF THE PREFERRED EMBODIMENTS

Figure 1:
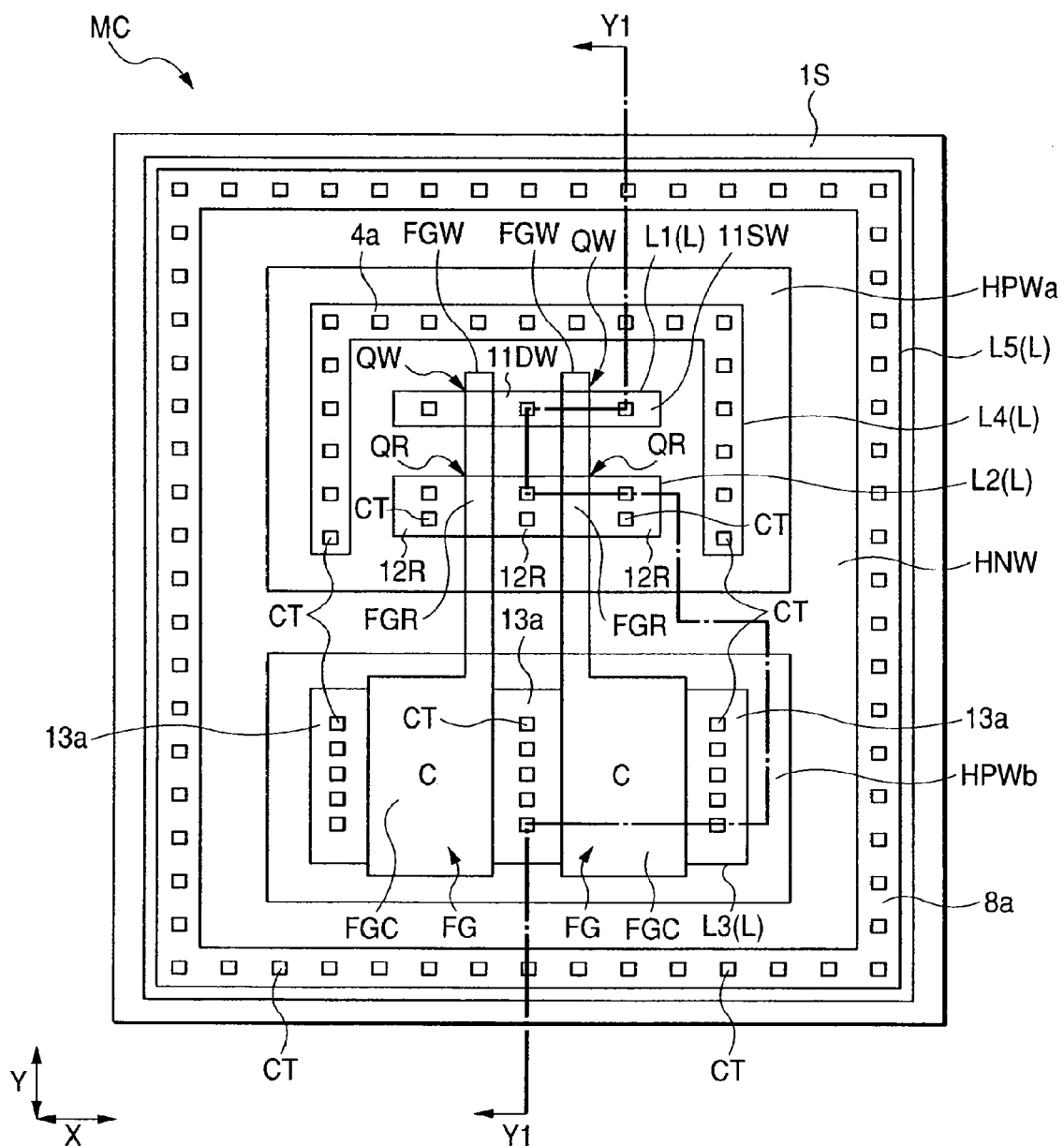
FIG. 1 is a plan view of a memory cell of a nonvolatile memory investigated by the present inventors.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range. In all the drawings for describing the below-described embodiments, elements having like function will be identified by like reference numerals and overlapping descriptions will be omitted as much as possible. Embodiments of the present invention will next be described in detail based on accompanying drawings.

Embodiment 1

Figure 2:
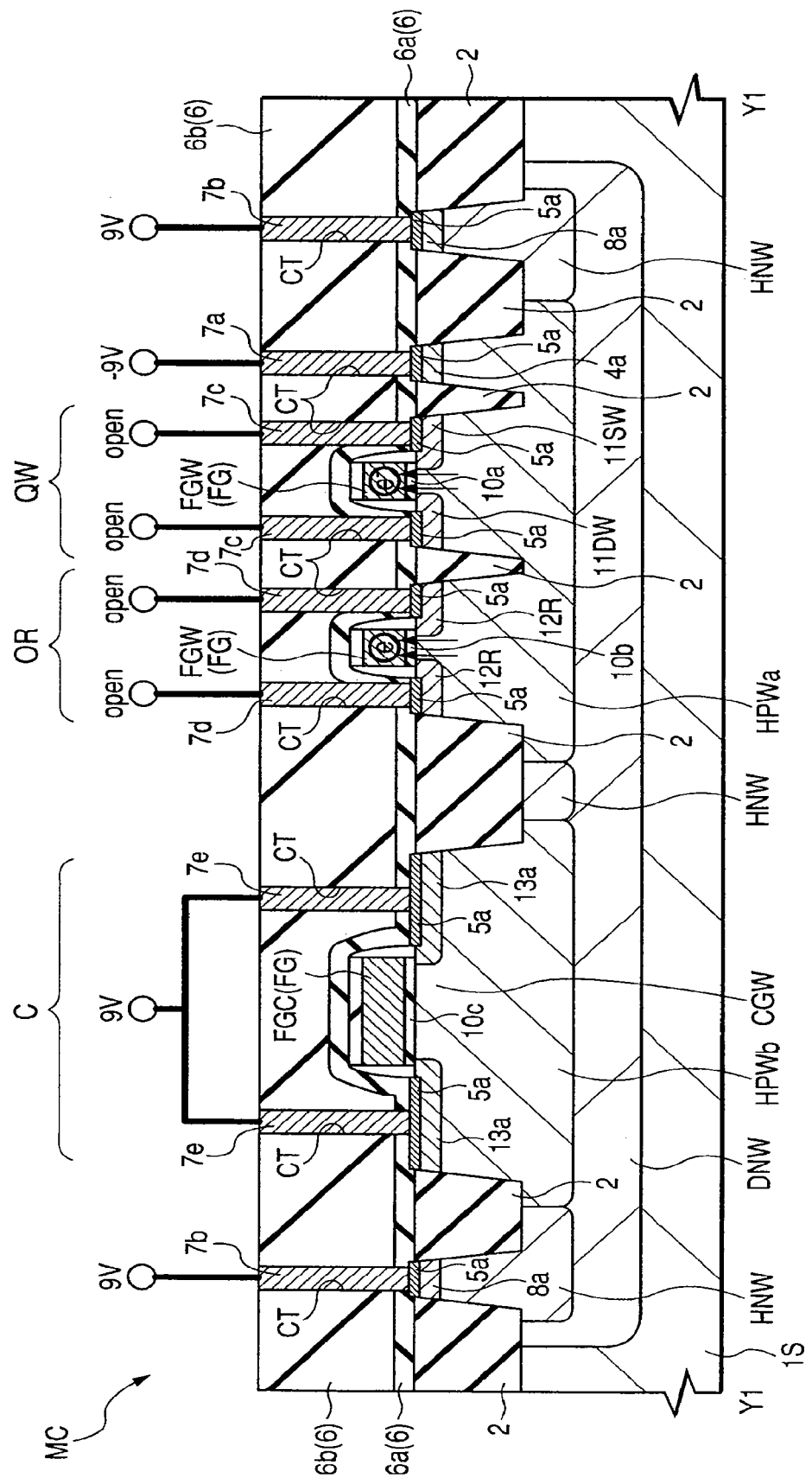
FIG. 2 is a cross-sectional view taken along a line Y1-Y1 of FIG. 1.
Figure 3:
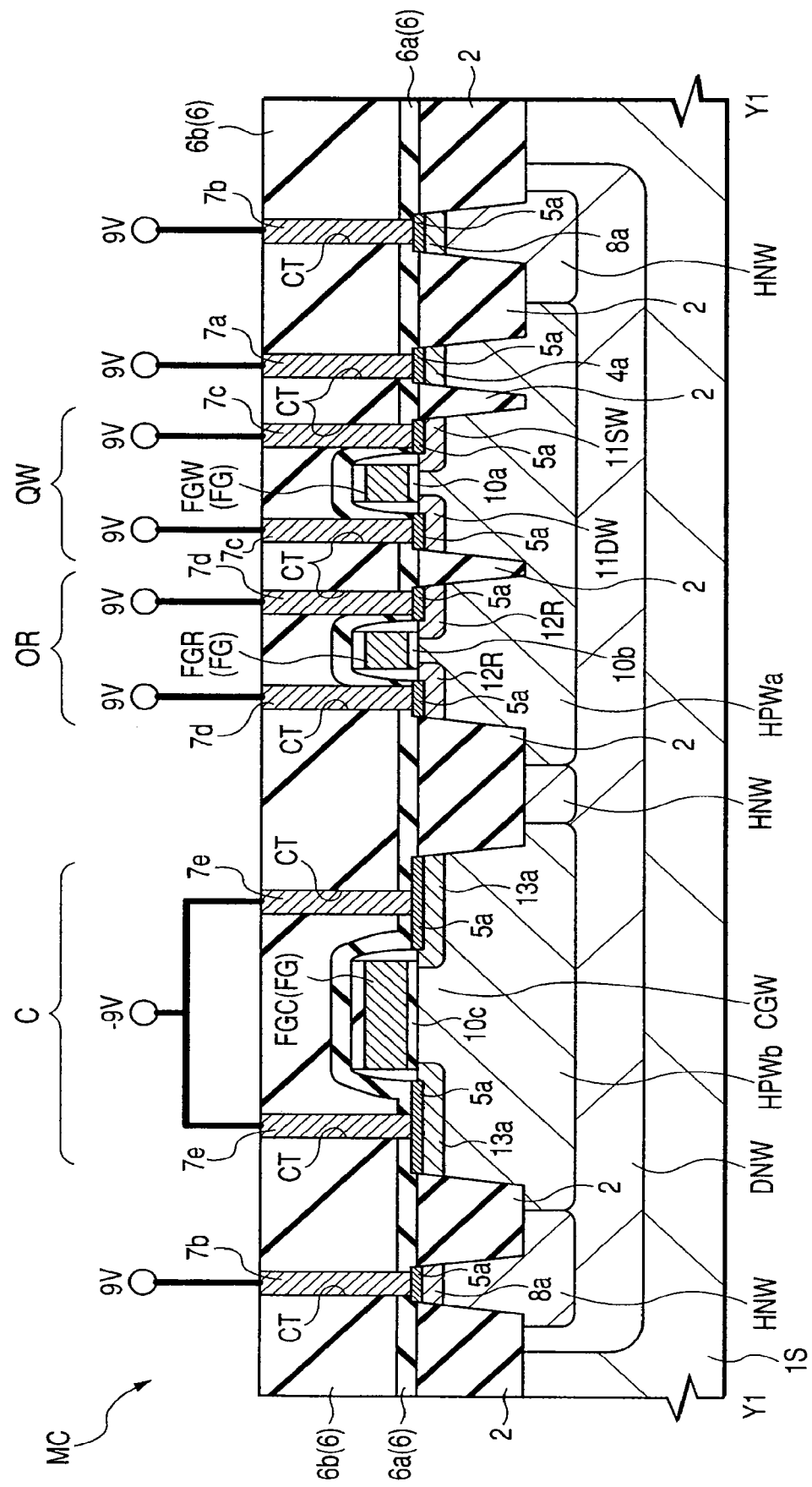
FIG. 3 is another cross-sectional view taken along a line Y1-Y1 of FIG. 1.

First, the constitution of a flash memory investigated by the present inventors and problems of the flash memory at the data programming time will be described. FIG. 1 is a plan view of a memory cell MC of the flash memory investigated by the present inventors; FIGS. 2 and 3 are cross-sectional views taken along a line Y1-Y1 of FIG. 1 and illustrating examples, which are different from each other, when data programming is performed using an FN tunneling current of an entire channel surface. In these drawings, symbol Y indicates a first direction, that is, an extending direction of a local data line, while symbol X indicates a second direction perpendicular to the first direction, that is, an extending direction of a word line.

A semiconductor substrate (which will hereinafter be called "substrate" simply) 1S constituting a semiconductor chip is made of, for example, p type (second conductivity type) silicon (Si) single crystals. This substrate 1S has, in the main surface thereof, an isolation portion TI. This isolation portion TI defines active regions Ls (L1, L2, L3, L4 and L5). In this embodiment, the isolation portion TI is an isolation portion in the trench form so-called SGI (Shallow Groove Isolation) or STI (Shallow Trench Isolation) formed by filling an insulating film made of, for example, silicon oxide in a shallow trench made in the main surface of the substrate 1S.

The substrate 1S has therein a buried n-well DNW (having a first conductivity type) over a desired depth from its main surface. In this buried n-well DNW, p wells HPWa and HPWb and n wells HNW are formed. The p wells HPWa and HPWb are enclosed by the buried n-well DNW while being electrically isolated from each other by the n well HNW.

These p wells HPWa and HPWb contain a p type impurity such as boron. The p well HPWa has, over a portion of the upper layer thereof, a $p^+$ type semiconductor region 4a. This $p^+$ type semiconductor region 4a contains an impurity similar to that contained in the p well HPWa, but the impurity concentration in the $p^+$ type semiconductor region 4a is adjusted to be higher than the impurity concentration in the p well HPWa. This $p^+$ type semiconductor region 4a has, over a portion of a surface layer thereof, a silicide layer 5a such as cobalt silicide ($CoSi_x$). The $p^+$ type semiconductor region 4a is electrically connected, via the silicide layer 5a, to a conductor portion 7a in a contact hole CT formed in an insulating layer 6 over the main surface of the substrate 1S. The insulating layer 6 has an insulating layer 6a and an insulating layer 6b deposited thereover. The insulating layer 6a, which is a lower layer, is made of, for example, silicon nitride ($Si_3N_4$), while the insulating layer 6b, which is an upper layer, is made of, for example, silicon oxide ($SiO_2$).

The n well HNW contains an n type impurity such as phosphorus (P) or arsenic (As) and the impurity concentration of the n well is adjusted to be higher than that of the buried n-well DNW. The n well HNW has, over a portion of the upper layer thereof, an $n^+$ type semiconductor region 8a. This $n^+$ type semiconductor region 8a contains an impurity similar to that contained in the n well HNW, but the impurity concentration in the n⁺ type semiconductor region 8a is adjusted to be higher than the impurity concentration in the n well HNW. This n⁺ type semiconductor region 8a is electrically connected, via the silicide layer 5a, to a conductor portion 7b in the contact hole CT formed in the insulating layer 6.

The memory cell MC of the flash memory is equipped with a floating gate electrode FG, an MIS•FET (Metal Insulator Semiconductor Field Effect Transistor) QW for programming/erasing data, an MIS•FET QR for reading the data, and a capacitor portion C.

The floating gate electrode FG is a charge accumulating portion which contributes to the storage of data. This floating gate electrode FG is made of, for example, a conductor film such as low-resistance polycrystalline silicon and is in the electrically floating state (insulated from another conductor). This floating gate electrode FG extends, as illustrated in FIG. 1, along the first direction Y so that it two-dimensionally overlaps with both the p wells HPWa and HPWb adjacent to each other.

At a position where the floating gate electrode FG two-dimensionally overlaps with the active region L1 of the p well HPWa, the MIS•FET QW for programming/erasing data is disposed. The MIS•FET QW for programming/erasing data is equipped with a gate electrode FGW, gate insulating film 10a, and a pair of an n type semiconductor region 11SW for source and an n type semiconductor region 11DW for drain. A channel of the MIS•FET QW for programming/erasing data is formed on an upper layer of the p well HPWa where the gate electrode FGW and active region L1 two-dimensionally overlap with each other.

The gate electrode FGW is made as a portion of the floating gate electrode FG. The gate insulating film 10a is made of, for example, silicon oxide and is formed between the gate electrode FGW and substrate 1S (p well HPWa). The gate insulating film 10a has a thickness of, for example, about 13.5 nm. The semiconductor region 11SW for source and the semiconductor region 11DW for drain are formed in self alignment with the gate electrode FGW at positions sandwiching it therebetween in the p well HPWa. These semiconductor regions 11SW and 11DW are each equipped with an n⁻ type semiconductor region on a channel side and an n⁺ type semiconductor region connected thereto. Impurities contained in the n⁻ type semiconductor region and the n⁺ type semiconductor region have the same conductivity type such as phosphorus or arsenic (As), but the impurity concentration in the n⁺ type semiconductor region is adjusted to be higher than that of the n⁻ type semiconductor region. Such semiconductor regions 11SW and 11DW are electrically connected, via the silicide layer 5a formed in a portion of the surface layer thereof, to a conductor portion 7c in the contact hole CT formed in the insulating layer 6.

At a position where the floating gate electrode FG two-dimensionally overlaps with the active region L2 of the p well HPWa, the MIS•FET QR for reading data is disposed. The MIS•FET QR for reading data is equipped with the gate electrode FGR, a gate insulating film 10b and a pair of n type semiconductor regions 12R and 12R. The channel of the MIS•FET QR for reading data is formed over the upper layer of the p well HPWa where the gate electrode FGR and active region L2 two-dimensionally overlaps with each other.

The gate electrode FGR is made as a portion of the floating gate electrode FG. The gate insulating film 10b is made of, for example, silicon oxide and is formed between the gate electrode FGR and substrate 1S (p well HPW). The gate insulating film 10b has a thickness of, for example, about 13.5 nm.

The pair of semiconductor region 12R and 12R are formed in self alignment with the gate electrode FGR at positions sandwiching the gate electrode FGR therebetween in the p well HPWa. The pair of n-type semiconductor regions 12R and 12R are each equipped with an n⁻ type semiconductor region on a channel side and an n⁺ type semiconductor region connected thereto. The impurities contained in the n⁻ type semiconductor region and the n⁺ type semiconductor region have the same conductivity type such as phosphorus (P) or arsenic (As), but the impurity concentration in the n⁺ type semiconductor region is adjusted to be higher than that of the n⁻ type semiconductor region. Such semiconductor regions 12R and 12R are electrically connected, via the silicide layer 5a formed over a portion of the surface layer thereof, to a conductor portion 7d in the contact hole CT formed in the insulating layer 6.

At a position where the floating gate electrode FG two-dimensionally overlaps with the p well HPWb, the capacitor portion C is disposed. The capacitor portion C is equipped with a control gate electrode CGW, a capacitor electrode FGC, a capacitor insulating film 10C and a p⁺ type semiconductor region 13a.

The control gate electrode CGW is made as a portion of the p well HPWb opposite to the floating gate electrode FG. The capacitor electrode FGC is made, on the other hand, as a portion of the floating gate electrode FG opposite to the control gate electrode CGW. Employment of a single-layer constitution for the gate constitution of the memory cell MC facilitates the alignment, upon manufacture of the flash memory, of the memory cell MC and elements of the main circuit, leading to a shortening of the time and reduction in the cost required for the manufacture of the semiconductor device.

The length of the capacitor electrode FGC in the second direction X is adjusted to be longer than the length of the gate electrode FGW or FGR of the MIS•FET QW for programming/erasing data or the MIS•FET QR for reading data, which makes it possible to maintain a large plane area for the capacitor electrode FGC so that a coupling ratio can be raised and a voltage supply efficiency from a control gate line CGW can be improved.

The capacitor insulating film 10c is made of, for example, silicon oxide and is formed between the control gate electrode CGW and capacitor electrode FGC. The capacitor insulating film 10C is formed simultaneously with the gate insulating films 10a and 10b by a thermal oxidation step. Its thickness is, for example, about 13.5 nm. The gate insulating films 10a and 10b and capacitor insulating film 10c are formed by the step of forming the gate insulating film of a high-breakdown-voltage MISFET, of the high-breakdown-voltage MISFET having a relatively thick gate insulating film and a low-breakdown-voltage MISFET having a relatively thin gate insulating film in the main circuit. This makes it possible to improve the reliability of the flash memory.

The p⁺ type semiconductor regions 13a are formed in self alignment with the capacitor electrode FGC at positions sandwiching the capacitor electrode FGC therebetween in the p well HPWb. These semiconductor regions 13a contain an impurity having a conductivity type equal to that of the p well HPWb such as boron (B), but the impurity concentration of the p⁺ type semiconductor region 13a is adjusted to be higher than that of the p well HPWb. These semiconductor regions 13a are electrically connected, via the silicide layer 5a formed in a portion of the surface layer of the semiconductor regions, to a conductor portion 7e in a contact hole CT formed in the insulating layer 6.

In the program/erase MIS•FET QW of the flash memory having such a constitution, the n type semiconductor regions 11SW and 11DW for the source and drain of the program/erase MIS•FET QW are set to, for example, OPEN or 9V as illustrated in FIGS. 2 and 3 when data are programmed by means of an FN tunneling current of an entire channel surface. It has however been found that in the case of OPEN (FIG. 2), a transistor for cutoff must be disposed on both sides of the n type semiconductor regions 11SW and 11DW for source and drain but this disturbs size reduction of the semiconductor device. When 9V is applied to the n type semiconductor regions 11SW and 11DW (FIG. 3), on the other hand, the junction breakdown voltage of the n type semiconductor regions 11SW and 11DW for source and drain less than 9V is insufficient and causes breakdown, resulting in a deterioration in the program/erase MIS•FET QW. It has also been found that in addition to such problems, since the data rewrite region and data readout region are formed in the same well, data cannot be written well because of instable data programming.

Figure 4:
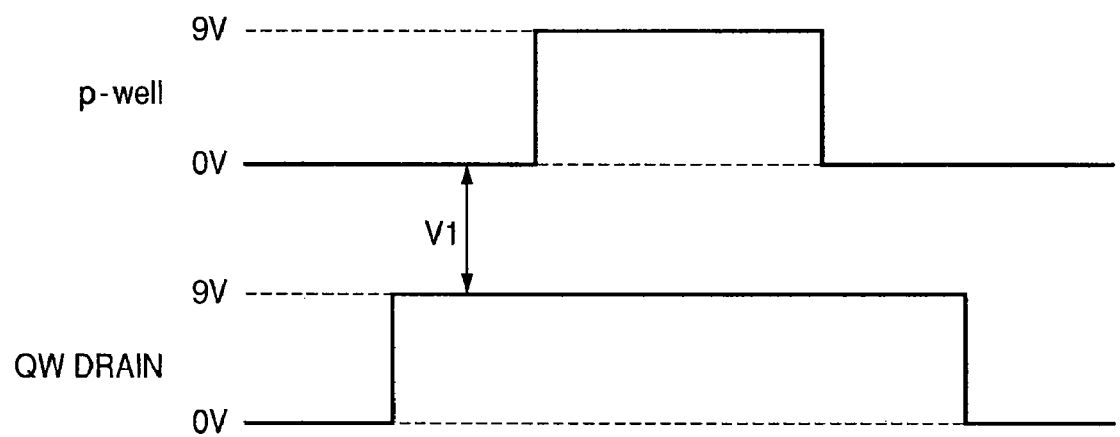
FIG. 4 is a schematic view illustrating the timing of voltage application at the time of data erase operation of the nonvolatile memory investigated by the present inventors.
Figure 5:
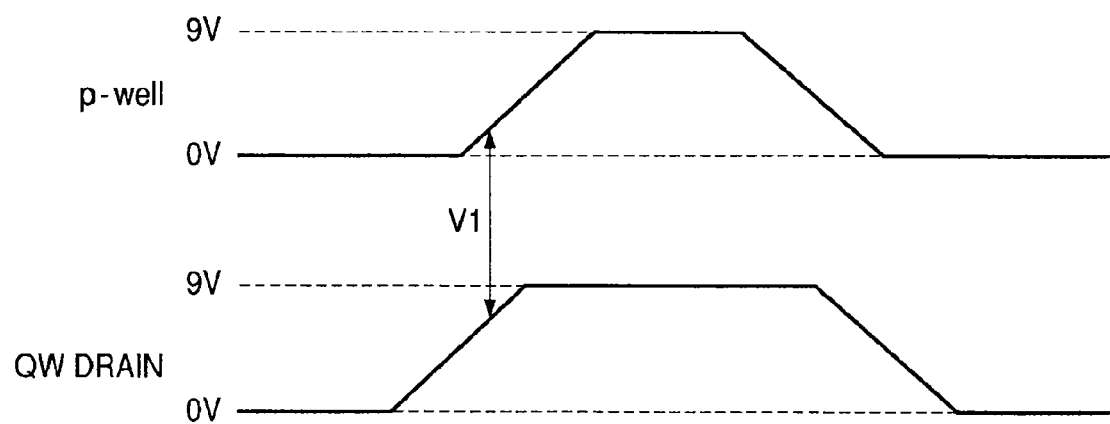
FIG. 5 is another schematic view illustrating the timing of voltage application at the time of data erase operation of the nonvolatile memory investigated by the present inventors.
Figure 6:
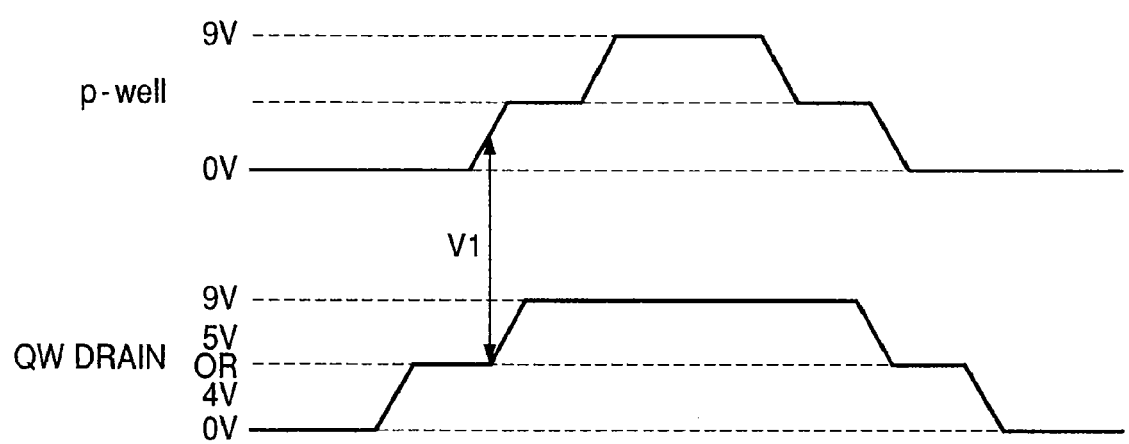
FIG. 6 is a further schematic view illustrating the timing of voltage application at the time of data erase operation of the nonvolatile memory investigated by the present inventors.

In the flash memory having the above-described constitution, therefore, a timing design must be necessary for preventing application of a voltage exceeding the breakdown voltage to the n type semiconductor regions 11SW and 11DW for source and drain. FIGS. 4 to 6 each is a schematic view illustrating the time of voltage application during data erase operation of the flash memory. As illustrated in FIG. 4, a voltage of 9V is applied to the drain of the MIS•FET QW for programming/erasing data prior to the application of a voltage of 9V to the p well HPWa. The voltage of the p well HPWa is returned to 0V prior to the returning of the drain voltage of the MIS•FET QW for programming/erasing data to 0V. Then, a potential difference V between them inevitably exceeds the junction breakdown voltage, leading to junction breakdown. In the data erase operation, voltage is therefore applied to the p well HPWa and drain (n type semiconductor region 11DW) of the MIS•FET QW for programming/erasing data with the timing as shown in FIGS. 5 and 6 in order to control the potential difference V1 between them to not greater than about 7V.

For example, as illustrated in FIG. 5, a voltage of the drain of the MIS•FET QW is raised prior to the raise of a voltage of the p well HPWa. The voltage of them is raised not abruptly but slowly and is controlled so that the potential difference V1 between them does not exceed the junction breakdown voltage. On the other hand, the voltage of the p well HPWa is returned to 0V prior to returning of the drain voltage of the MIS•FET QW to 0V and a voltage is changed not abruptly, whereby the potential difference V1 between them is adjusted not to exceed the junction breakdown voltage.

It is also possible that, as illustrated in FIG. 6, the voltage of the drain of the MIS•FET QW is raised prior to the raise of the voltage of the p well HPWa and it is raised to 4V or 5V before it reaches 9V, during which the voltage of the p well HPWa is raised. At this time, the voltage of the p well HPWa is changed in a similar manner to the voltage of the drain of the MIS•FET QW except that the timing is changed, which makes it possible to prevent the potential difference V1 between them from exceeding the junction breakdown voltage. When the drain voltage of the MIS•FET QW and the voltage of the p well HPWa are returned to 0V, it is recommended to decrease the voltage of the p well HPWa prior to the decrease of the drain voltage of the MIS•FET QW and to control a voltage change during this operation to inversely follow the procedure of a voltage raise.

When in the program/erase MIS•FET QW of the flash memory having the above-described constitution, 9V is applied to the n type semiconductor regions 11SW and 11DW for source and drain in order to rewrite data by means of an FN tunneling current of an entire channel surface, the timing design as described above becomes necessary. It has however been found that the realization of the timing design as described above may be a hindrance to size reduction of a semiconductor device because the scale of a peripheral circuit formed over the same substrate 1S becomes unduly large.

A semiconductor device according to Embodiment 1 will hereinafter be described.

The semiconductor device according to Embodiment 1 has, over one semiconductor chip, a main circuit and a flash memory (nonvolatile memory) for storing a relatively small amount of desired data related to the main circuit. The main circuit is, for example, a memory circuit such as DRAM (Dynamic Random Access Memory) or SRAM (Static RAM), a logic circuit such as CPU (Central Processing Unit) or MPU (Micro Processing Unit), a mixed circuit of the memory circuit and logic circuit, an LCD (Liquid Crystal Device) driver circuit, or the like. The desired data are, for example, location address information of an effective (usable) device to be used for trimming in a semiconductor chip., location address information of an effective memory cell (defect-free memory cell) or effective LCD device to be used for rescue of a memory or LCD, trimming tap information of control voltage to be used for adjustment of an LCD image, a product number of a semiconductor device, or the like. This semiconductor device (semiconductor chip, semiconductor substrate) uses, as an outside power supply, a single power supply. The supply voltage of the single power supply is, for example, about 3.3V.

Figure 7:
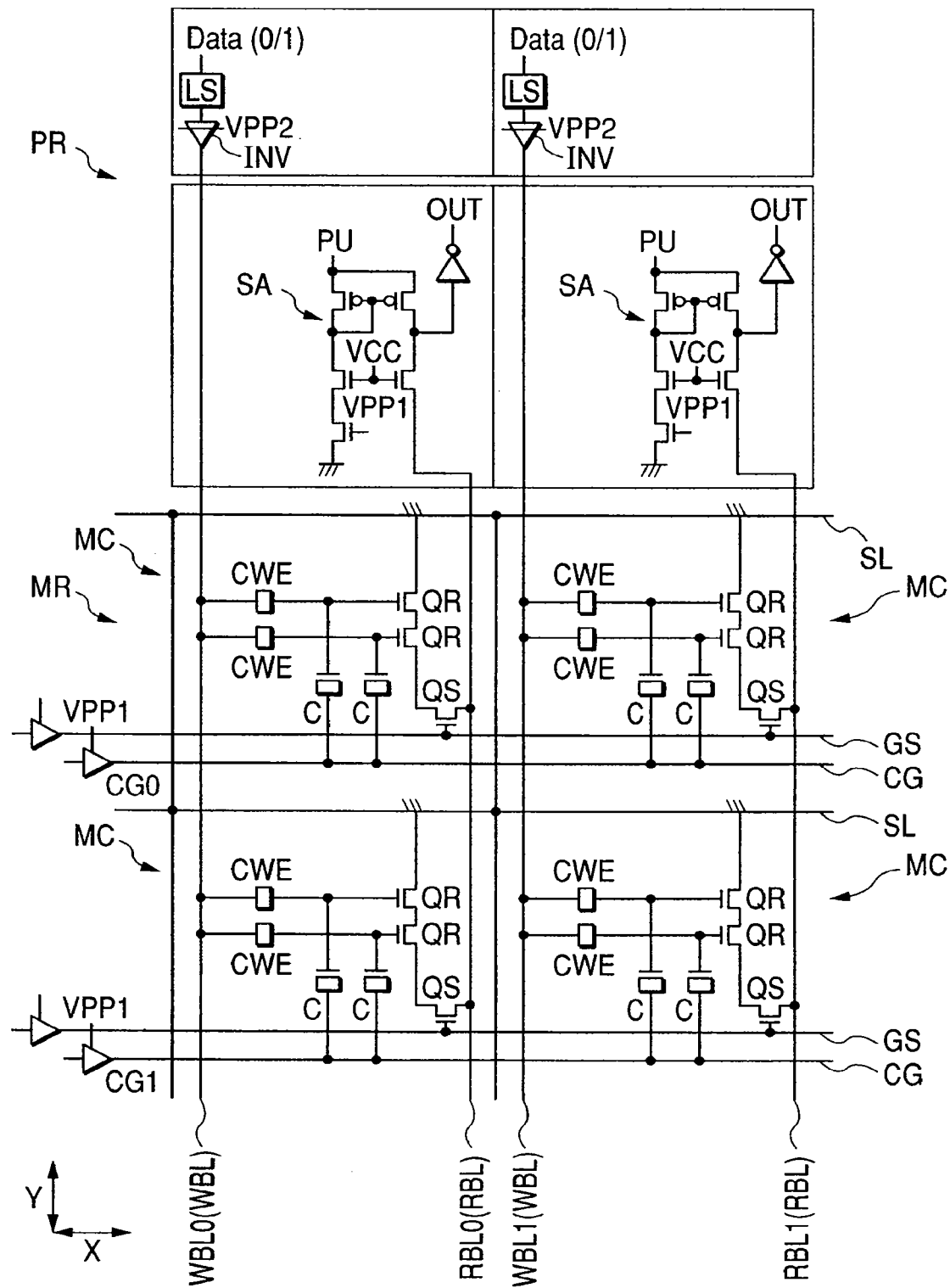
FIG. 7 is a fragmentary circuit diagram of a nonvolatile memory in a semiconductor device according to one embodiment of the present invention.

FIG. 7 is a fragmentary circuit diagram of the flash memory in the semiconductor device according to Embodiment 1. This flash memory has a memory cell array MR and a peripheral circuit region PR. In the memory cell array MR, a plurality of bit lines WBL (WBL0, WBL1 . . . ) for programming/erasing data and a plurality of bit lines RBL (RBL0, RBL2 . . . ) for reading data, each extending in the first direction Y are arranged along the second direction X. Moreover, in the memory cell array MR, a plurality of control gate lines (word lines) CG (CG0, CG1 . . . ), a plurality of source lines SL and a plurality of select lines GS, each extending along the second direction X which is perpendicular to the bit lines WBL and RBL, are arranged along the first direction Y.

The bit lines WEL for programming/erasing data are each electrically connected to an inverter circuit INV for inputting data (0/1) which is placed in the peripheral circuit region PR. The bit lines RBL for reading data are each electrically connected to a sense amplifier circuit SA placed in the peripheral circuit region PR. The sense amplifier circuit SA is, for example, a current mirror type circuit. To the vicinity of the intersections on the matrix formed by the bit lines WBL and RBL and the control gate line CG, source line SL and select line GS, memory cells equivalent to one bit are connected. In this diagram, one bit is formed by two memory cells MC.

The memory cells MC each has a capacitor portion (charge injection/emission portion) CWE for programming/erasing data, MIS•FET QR for reading data, a capacitor portion C and a select MIS•FET QS. The data program/erase capacitor portions CWE and CWE of each of the two memory cells MC constituting one bit are electrically connected so that they are in parallel with each other. One of the electrodes of each of the data program/erase capacitor portions CWE is electrically connected to the data program/erase bit line WBL, while the other electrodes (floating gate electrodes FG) of the data program/erase capacitor portions CWE are electrically connected to the gate electrodes (floating gate electrodes FG) of the data read MIS•FET QR and QR, respectively and at the same time, electrically connected to the respective electrodes (floating gate electrodes FG) of the capacitor portions C and C. The other electrodes (floating gate electrodes CGW) of the capacitor portions C and C are electrically connected to the control gate line CG. The data read MIS•FET QR and QR of the two memory cells MC constituting one bit are electrically connected with each other in series. Their drain is electrically connected to a data read bit line RBL via the select MIS•FET QS and the source is electrically connected to the source line SL. The gate electrode of the select MIS•FET QS is electrically connected to the select line GS.

Figure 8:
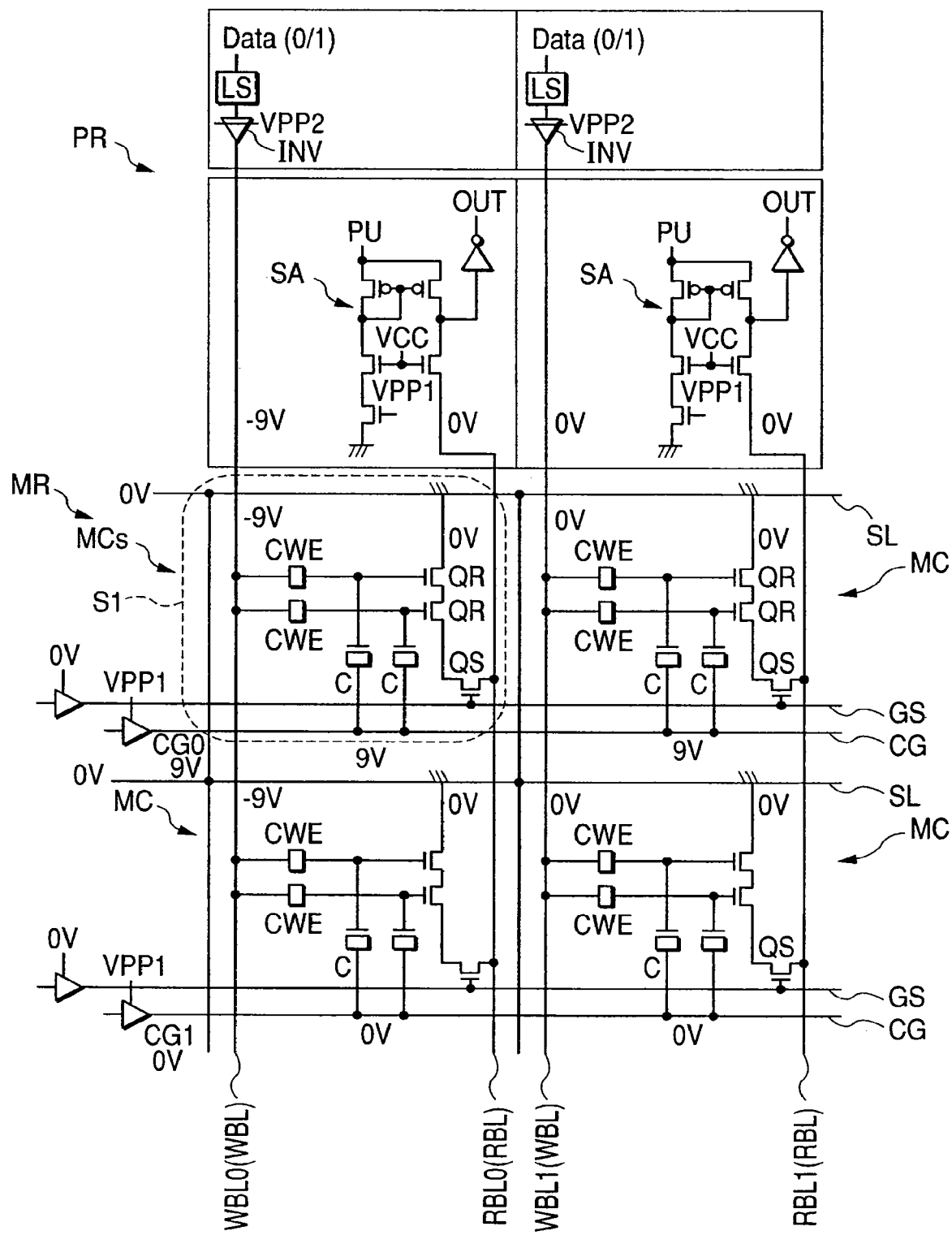
FIG. 8 is a circuit diagram showing a voltage applied to each portion at the time of data program operation of the nonvolatile memory of FIG. 7.

An example of data program operation in such a flash memory will next be described based on FIGS. 8 to 11. FIG. 8 shows a voltage applied to each portion at the time of data program operation of the flash memory illustrated in FIG. 7 A dashed line S1 indicates a memory cell (which will hereinafter be called "selected memory cell MCs") in which data are programmed. Here, injection of electrons into a floating gate electrode is defined as "programming of data". On the contrary, it is also possible to define the ejection of electrons from the floating gate electrode as "programming of data".

At the time of data programming, a positive control voltage, for example, about 9V is applied to the control gate line CG0 (CG) to which the other electrode of the capacitor portion C of the selected memory cell MCs is connected. A voltage of about 0V is applied to the other control gate line CG1 (CG). In addition, a negative voltage, for example, about −9V is applied to the bit line WBL0 (WBL) for programming/erasing data to which one of the electrodes of the data programming/erasing capacitor portion CWE of the selected memory cell MCs is connected. A voltage of, for example, about 0V is applied to the other bit line WBL1 (WBL) for programming/erasing data. To the select line GS, source line SL and bit line RBL for programming data is applied, for example, 0V. By these operations, electrons are injected into the floating gate electrodes of the data programming/erasing capacitor portions CWE and CWE of the selected memory cell MCs by means of an FN tunneling current of an entire channel surface, whereby data programming is performed.

Figure 9:
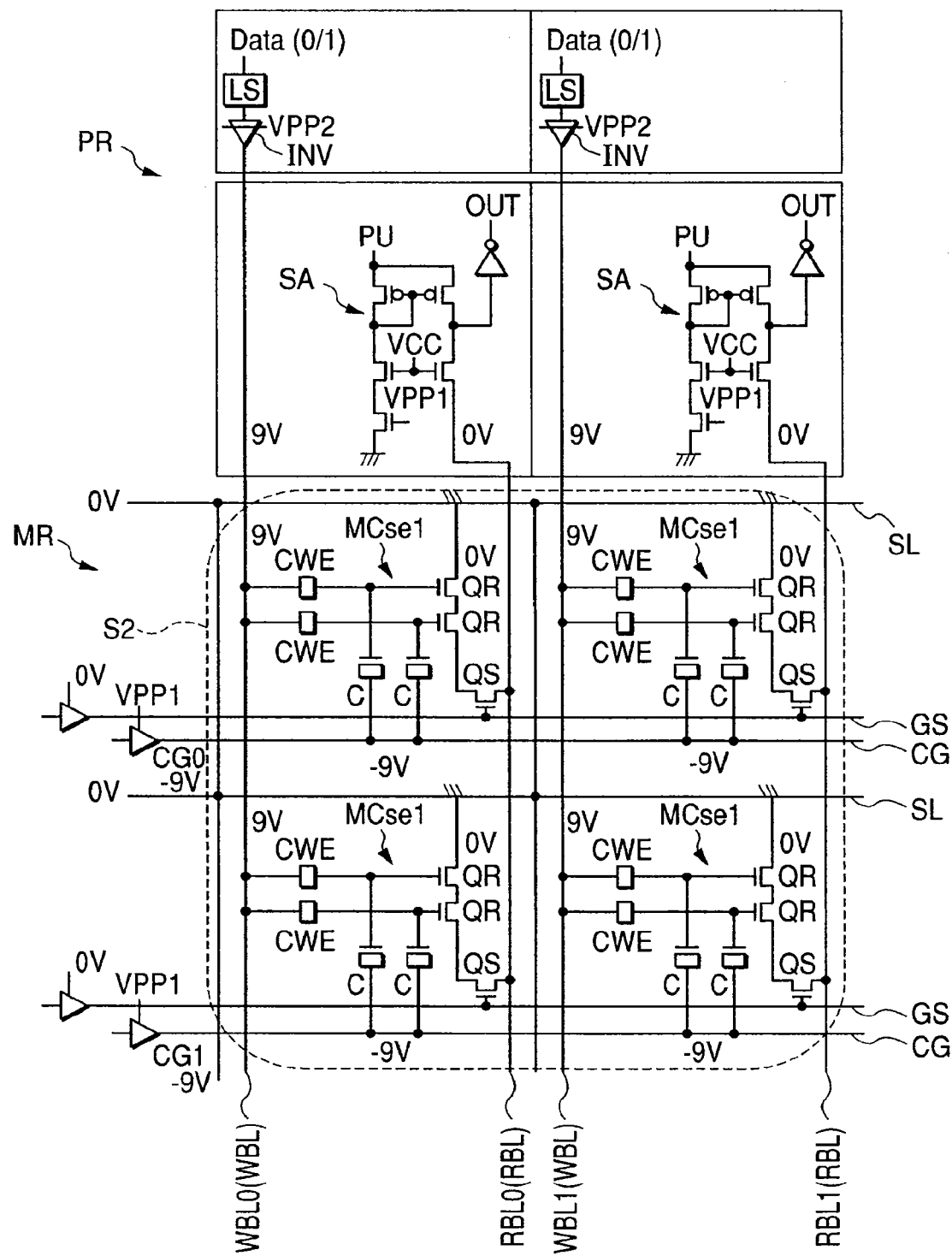
FIG. 9 is a circuit diagram showing a voltage applied to each portion at the time of data batch erase operation of the nonvolatile memory of FIG. 7.

FIG. 9 shows a voltage applied to each portion at the time of data batch erase operation of the flash memory illustrated in FIG. 7. A dashed line S2 indicates a plurality of memory cells (MC) (which will hereinafter be called "selected memory cell MCse1") to be subjected to data batch erasing. Here, ejection of electrons from the floating gate electrode is defined as "data erasing". On the contrary, injection of electrons to the floating gate electrode can also be defined as "data erasing".

When the batch erase of data is carried out, a negative control voltage of, for example, −9V is applied to the control gate lines CG0 and CG1 (CG) to which the other electrode of the capacitor portion C of the plurality of selected memory cells MCse1 is connected. A negative voltage of, for example, about −9V is applied to the bit lines WBL0 and WBL1 (WBL) for programming/erasing data to which one of the electrodes of the capacitor portion CWE for programming/erasing data is connected. To the select line GS, source line SL and bit line RBL for programming data is applied, for example, 0V. By these operations, electrons accumulated in the floating gate electrodes of the data program/erase capacitor portions CWE and CWE of the plurality of selected memory cells MCse1 to be subjected to data batch erasing are emitted by means of an FN tunneling current of an entire channel surface, whereby batch erasing of data from the plurality of selected memory cells MCse1 is completed.

Figure 10:
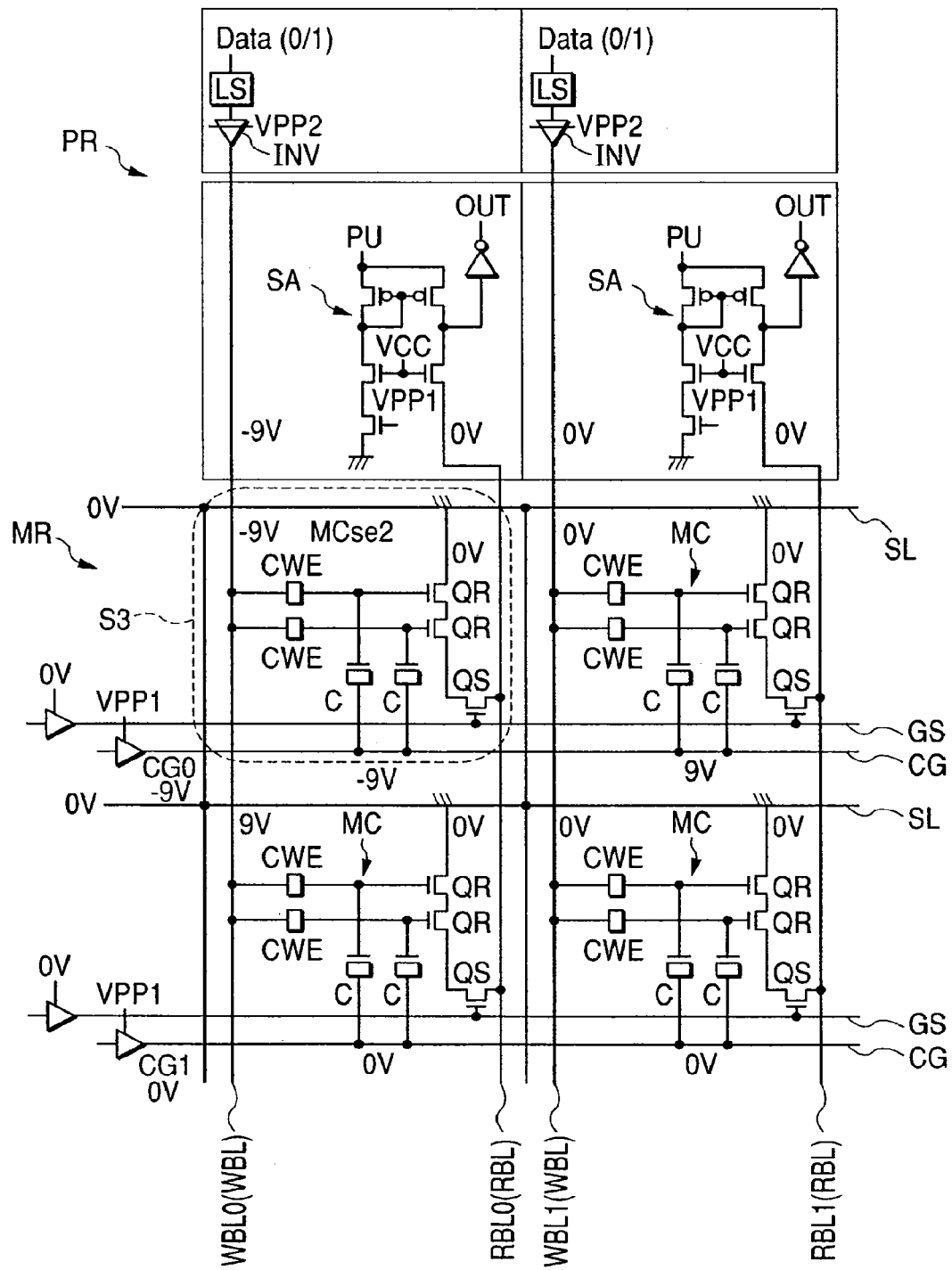
FIG. 10 is a circuit diagram showing a voltage applied to each portion at the time of data bit-wise erase operation of the nonvolatile memory of FIG. 7.

FIG. 10 shows a voltage applied to each portion at the time of data bit-wise erase operation of the flash memory illustrated in FIG. 7. The dashed line indicates a memory cell MC (which will hereinafter be called "memory cell MCse2") from which data are erased bit by bit.

At the time of bit-wise erasing of data, a negative voltage of, for example, about −9V is applied to the control gate line CG0 (CG) to which the other electrode of the capacitor portion C of the selected memory cell MCse2 is connected. To the other control gate line CG1 (CG) is applied a voltage of, for example, 0V. To the bit line WBL0 (WBL) for programming/erasing data to which the one electrode of the data programming/erasing capacitor portion CWE of the selected memory cell MCse2 is connected is applied a positive voltage of, for example, about 9V. To the other bit line WBL1 (WBL) for programming/erasing data is applied a voltage of, for example, 0V. To the select line GS, source line SL and bit line RBL for programming data is applied, for example, 0V. By these operations, electrons accumulated in the floating gate electrodes of the data programming/erasing capacitor portions CWE and CWE of the selected memory cell MCse2 to be subjected to data erasing are emitted by means of an FN tunneling current of an entire channel surface, whereby data of the selected memory cell MCse2 to be subjected to data erasing are erased.

Figure 11:
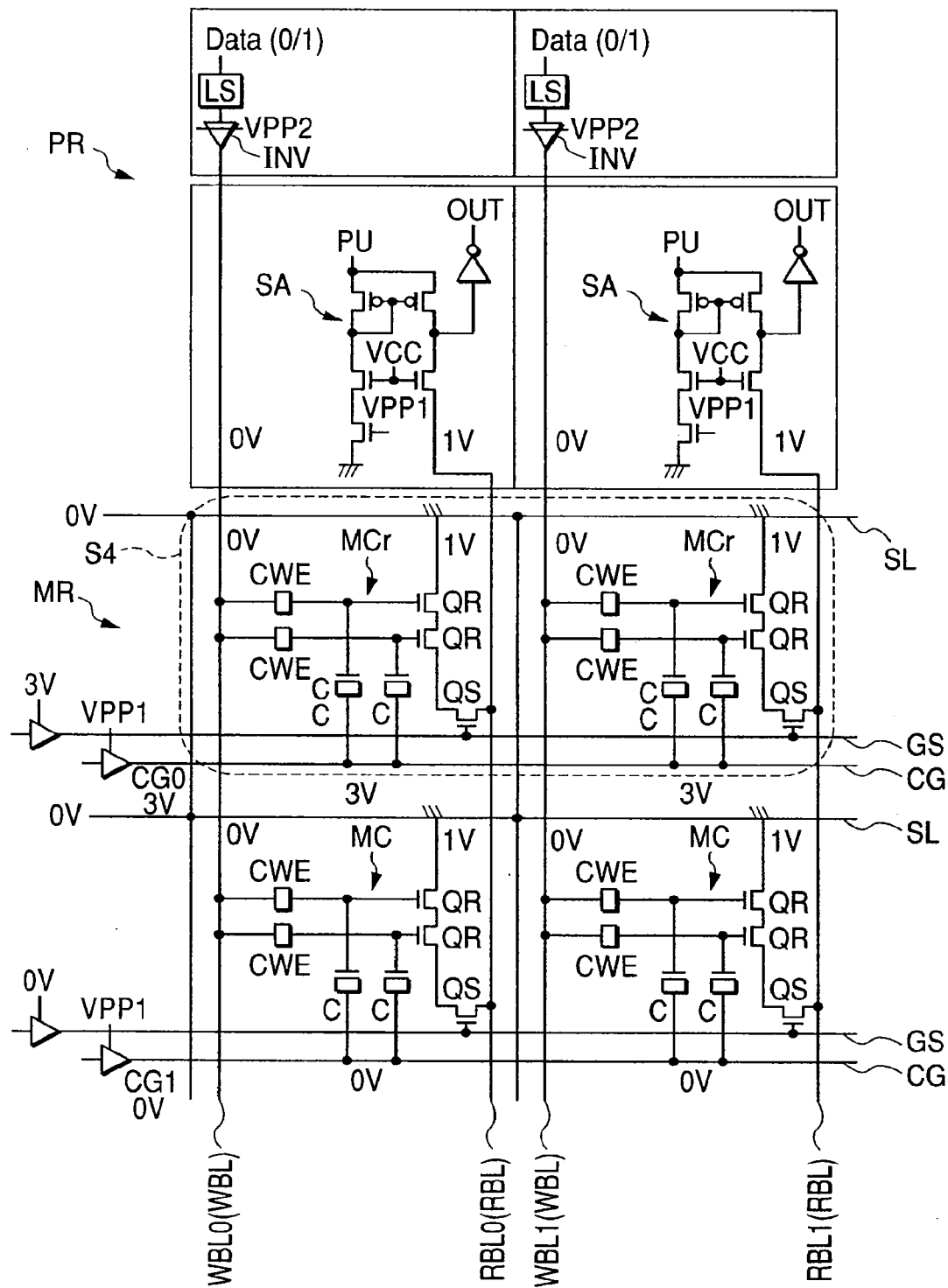
FIG. 11 is a circuit diagram showing a voltage applied to each portion at the time of data read operation in the nonvolatile memory of FIG. 7.

FIG. 11 is a voltage applied to each portion at the time of data read operation of the flash memory illustrated in FIG. 7. A dashed line S4 indicates a memory cell MC (which will hereinafter be called "selected memory cell MCr") to be subjected to data reading.

At the time of data reading, a control voltage of, for example, about 3V is applied to the control gate line CG0 (CG) to which the other electrode of the capacitor portion C of the selected memory cell MCr is connected. To the other control gate line CG1 (CG) is applied a voltage of, for example, 0V. To the bit lines WBL0 and WBL0 (WBL) for programming/erasing data to which the one electrode of the data programming/erasing capacitor portion CWE of the selected memory cell MCr is connected is applied a voltage of, for example, about 0V. To the select line GS to which the gate electrode of the selected MIS•FET QS of the selected memory cell MCr is connected is applied a voltage of, for example, about 3V. To the bit line RBL for programming data is applied a voltage of, for example, about 1V. To the source line SL is applied, for example, about 0V. By these operations, under the conditions that the data read MIS•FET QR of the selected memory cell MCr to be subjected to data reading is turned ON, whether the data stored in the selected memory cell MCr is either 0 or 1 is read, depending on whether the drain current flows into the channel of the data read MIS•FET QR or not.

Figure 12:
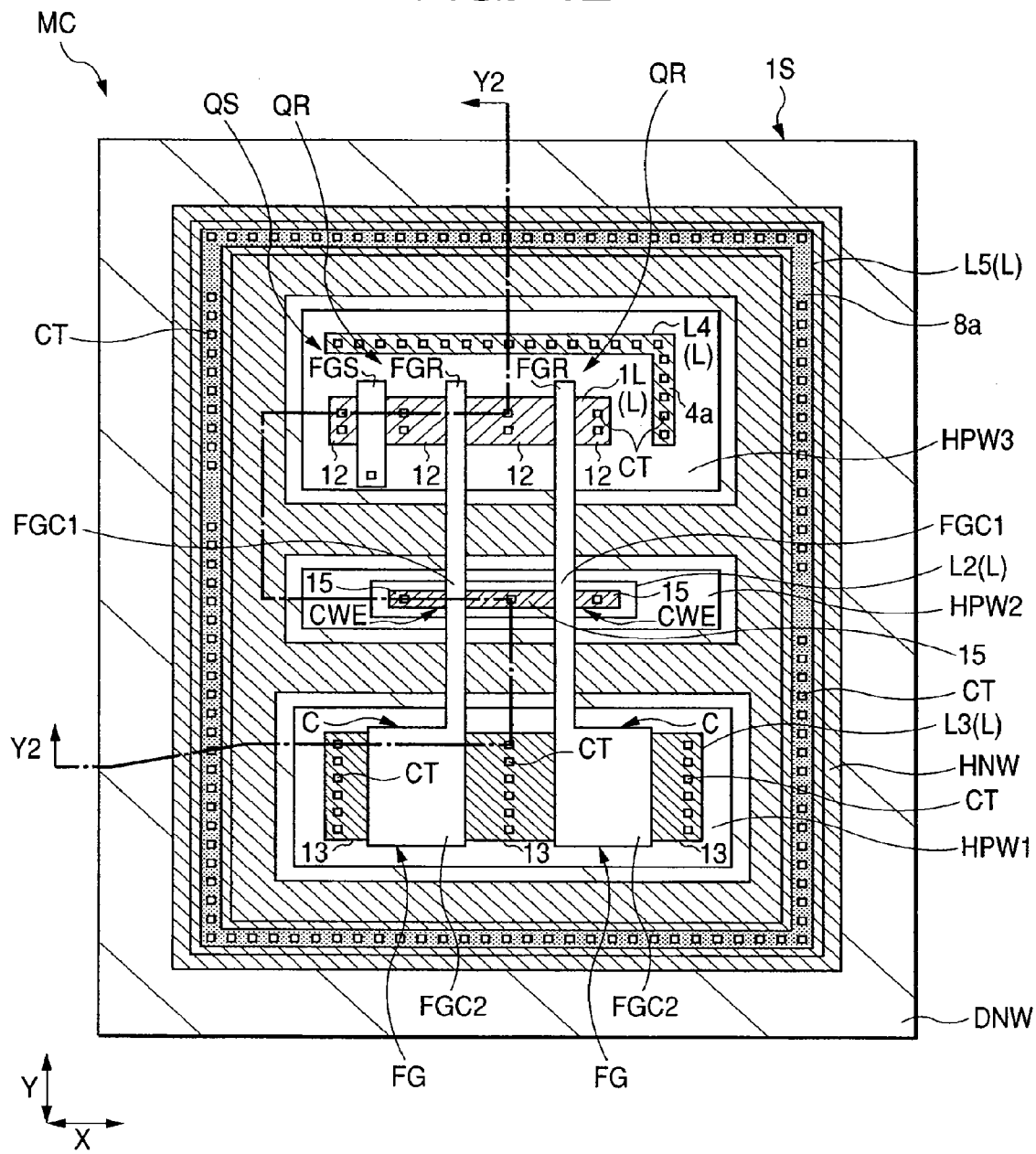
FIG. 12 is a plan view of a memory cell, corresponding to one bit, of the nonvolatile memory in the semiconductor device according to the one embodiment of the present invention.
Figure 13:
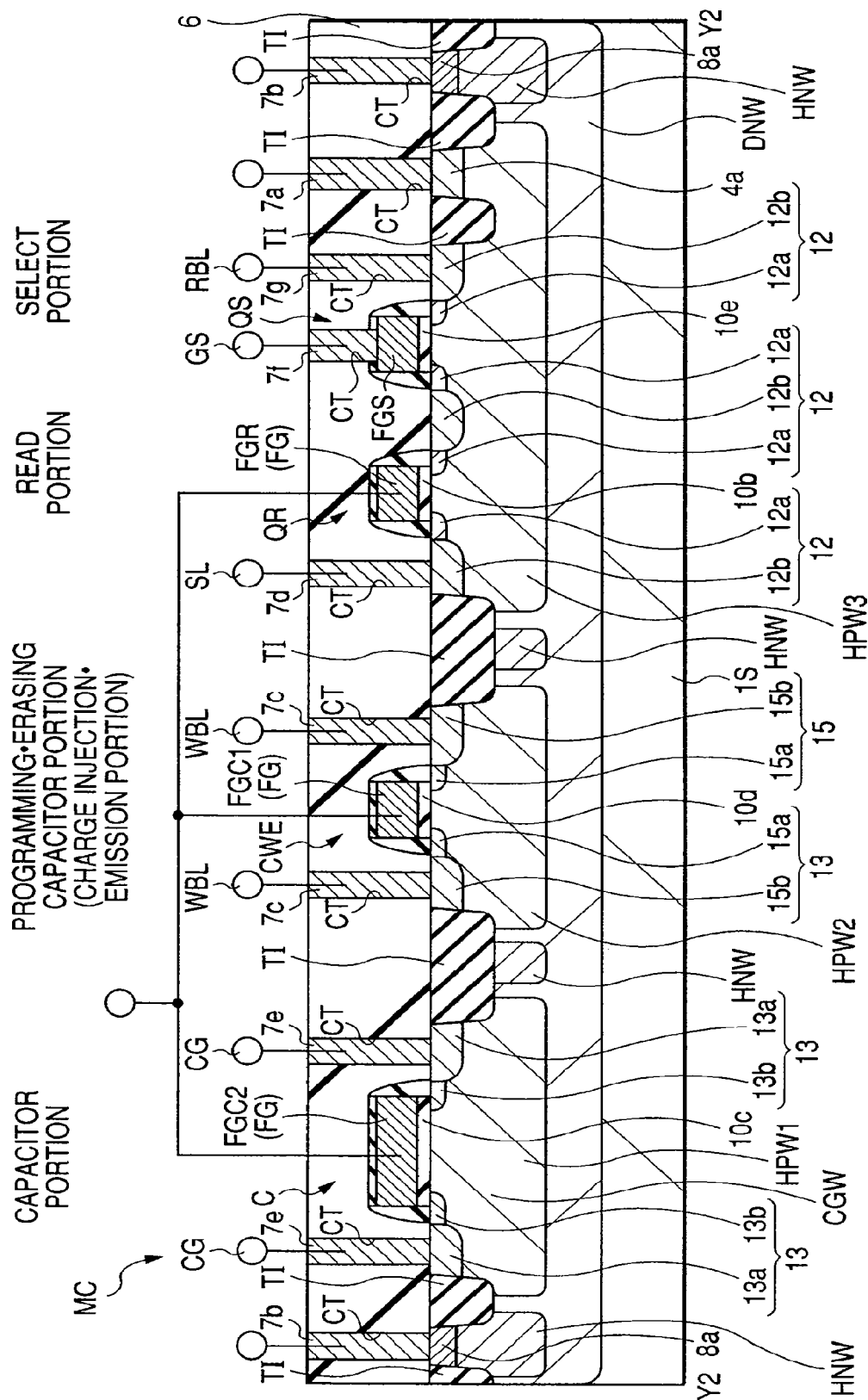
FIG. 13 is a cross-sectional view taken along a line Y2-Y2 of FIG. 12.

FIG. 12 is a plan view of a memory cell MC of the flash memory corresponding to one bit in the semiconductor device according to Embodiment 1; and FIG. 13 is a cross-sectional view taken along a line Y2-Y2 of FIG. 12. A portion of FIG. 12 is hatched to facilitate understanding of it.

The p-type substrate 1S has, on the main surface thereof, the above-described isolation portions TI in the trench form for defining active regions L (L1, L2, L3, L4 and L5). In the buried n-well (first well) DNW (having a first conductivity type) formed on this substrate 1S, p wells (second conductivity type wells) HPW1, HPW2 and HPW3 and n wells HNW are formed. The p wells HPW1, HPW2 and HPW3 are enclosed in the buried well DNW while electrically isolated from each other by the buried well DNW and n well HNW.

These p wells HPW1 to HPW3 contain a p type impurity such as boron (B). The p well HPW3 has, on a portion of the upper layer thereof, a p+ type semiconductor region 4. The p+ semiconductor region 4a contains an impurity similar to that contained in the p well HP3, but the impurity concentration in the p+ type semiconductor region 4a is adjusted to be higher than that that of the p well HPW3. This p+ type semiconductor region 4a is electrically connected to a conductor portion 78a in a contact hole CT formed in an insulating layer 6 over the main surface of the substrate 1S. A silicide layer 5a may be formed over a portion of the surface layer of the p+ type semiconductor region 4a to which this conductor portion 7a is contiguous.

The n well HNW contains an n type impurity such as phosphorus (P) or arsenic (As). This n well HNW has, over a portion of the upper layer thereof, an n+ type semiconductor region 8a. The n+ semiconductor region 8a contains an impurity similar to that contained in the n well HNW, but the impurity concentration in the n+ type semiconductor region 8a is adjusted to be higher than that that of the n well HNW. This n+ type semiconductor region 8a is separated from the p wells HPW1 to HPW3 so that it is not brought into contact with the p wells HPW1 to HPW3. In other words, a portion of a buried n-well DNW exists between the n+ type semiconductor region 8a and the p wells HPW1 to HPW3. Such an n+ type semiconductor region 8a is electrically connected to a conductor portion 7b in a contact hole CT formed in the insulating layer 6. The silicide layer 5a may be formed over a portion of the surface layer of the n+ type semiconductor region 8a to which this conductor portion 7b is contiguous.

The memory cell MC of the flash memory according to Embodiment 1 is equipped with a floating gate electrode FG, a capacitor portion CWE for programming/erasing data, an MIS•FET QR for reading data and a capacitor portion C.

The floating gate electrode FG is a portion for storing charges which contribute to the memory of data. This floating gate electrode FG is made of a conductor film such as low resistance polycrystalline silicon and is in the electrically floating form (isolated from another conductor). This floating gate electrode FG, as illustrated in FIG. 12, extends along the first direction Y so as to two-dimensionally overlap with the p wells HPW1, HPW2 and HPW3 which are adjacent to each other.

At the first position where this floating gate electrode FG two-dimensionally overlaps with the active region L2 of the p well (second well) HPW2, the capacitor portion CWE for programming/erasing data is placed. The capacitor portion CWE for programming/erasing data has a capacitor electrode (first electrode) FGC1, a capacitor insulating film (first insulating film) 10d, p type semiconductor regions 15 and 15, and a p well HPW2.

The capacitor electrode FGC1 is formed as a part of the floating gate electrode FG and is a portion for forming the other electrode of the capacitor portion CWE. The capacitor insulating film 10d is made of, for example, silicon oxide and is formed between the capacitor electrode FGC1 and substrate 1S (p well HPW2). The capacitor insulating film 10 has a thickness adjusted to, for example, 10 nm or greater but not greater than 20 nm. In the capacitor portion CWE according to Embodiment 1, electrons are injected from the p well HPW2 to the capacitor electrode FGC1 via the capacitor insulating film 10d or emitted from the capacitor electrode FGC1 to the p well HPW2 via the capacitor insulating film 10d during data programming so that the thickness of the capacitor insulating film 10d is adjusted to be small, more specifically, about 13.5 nm. The thickness of the capacitor insulating film 10d is adjusted to 10 nm or greater because when it is thinner, the reliability of the capacitor insulating film 10d cannot be ensured. The thickness of the capacitor insulating film 10d is adjusted to 20 nm or less because a film exceeding this thickness cannot easily pass electrons therethrough and prevents smooth data programming.

The p type semiconductor regions 15 of the capacitor portion CWE are formed in self alignment with the capacitor electrode FGC1 at positions where the semiconductor regions sandwich the capacitor electrode FGC1 therebetween in the p well HPW2. These semiconductor regions 15 each has a p− type semiconductor region 15a on a channel side and a p+ type semiconductor region 15b connected to the region 15a. The p− type semiconductor region 15a and p+ type semiconductor region 15b contain an impurity of the same conductivity type such as boron (B), but the impurity concentration of the p+ type semiconductor region 15b is adjusted to be higher than the impurity concentration of the p− type semiconductor region 15a. These p type semiconductor regions 15 are electrically connected to the p well HPW2. The p type semiconductor regions 15 and p well HPW2 constitute the one electrode of the capacitor portions CWE. The p type semiconductor regions 15 are electrically connected to a conductor portion 7c in a contact hole CT formed in the insulating layer 6. This conductor portion 7c is electrically connected to the bit line WBL for programming/erasing data. The silicide layer 5a may be formed over a portion of the surface layer of the p+ type semiconductor region 15b to which the conductor portion 7c is contiguous.

At the second position where the floating gate electrode FG two-dimensionally overlaps with the active region L1 of the p well (third well) HPW3, the MIS•FET QR for reading data is placed. The MIS•FET QR for reading data has a constitution similar to that described referring to FIGS. 1 to 3. Described specifically, the MIS•FET QR for reading data is equipped with a gate electrode (second electrode) FGR, a gate insulating film (second insulating film) 10b and a pair of n type semiconductor regions 12 and 12. The channel of the MIS•FET QR for reading data is formed over the p well HPW3 where the gate electrode FGR and active region L1 two-dimensionally overlap with each other.

The gate electrode FGR is formed as a portion of the floating gate electrode FG. The gate insulating film 10b is made of, for example, silicon oxide and is formed between the gate electrode FGR and substrate 1S (p well HPW3). The gate insulating film 10b has a thickness of, for example, about 13.5 nm. A pair of n type semiconductor regions 12 and 12 of the MIS•FET QR for reading data are formed in self alignment with the gate electrode FGR at positions where the semiconductor regions sandwich therebetween the gate electrode FGR in the p well HPW3. The pair of n type semiconductor regions 12 and 12 of the MIS•FET QR for reading data each has an n− type semiconductor region 12a on a channel side and an n+ type semiconductor region 12b connected thereto. The n− type semiconductor region 12a and n+ type semiconductor region 12b contain impurities of the same conductivity type such as phosphorus (P) or arsenic (As). The impurity concentration of the n+ type semiconductor region 12b is adjusted to be higher than that of the n− type semiconductor region 12a. One of the semiconductor regions 12 and 12 of the MIS•FET QR for reading data is electrically connected to a conductor portion 7d in a contact hole CT formed in the insulating layer 6. The conductor portion 7d is electrically connected to the source line SL. The silicide layer 5a may be formed over a portion of the surface layer of the n+ type semiconductor region 12b to which this conductor portion 7d is contiguous. The other one of the semiconductor regions 12 and 12 of the MIS•FET QR for reading data is shared by one of the n type semiconductor regions 12 for source and drain of the select MIS•FET QS.

The select MIS•FET QS is equipped with a gate electrode FGS, a gate insulating film 10e and a pair of n type semiconductor regions 12 and 12 for source and drain. The channel of the select MIS•FET QS is formed over the upper layer of the p well HPW3 where the gate electrode FGS and active region L1 two-dimensionally overlap with each other.

The gate electrode FGS is made of, for example, low-resistance polycrystalline silicon. This gate electrode FGS is electrically connected to a conductor portion 7f in a contact hole CT formed in the insulating layer 6. The conductor portion 7f is electrically connected to the select line GS. The gate insulating film 10e is made of, for example, silicon oxide and is formed between the gate electrode FGS and substrate 1S (p well HPW3). This gate insulating film 10e has a thickness of, for example, about 13.5 nm. The constitution of the pair of n type semiconductor regions 12 and 12 of the select MIS•FET QS is similar to that of n type semiconductor regions 12 of the MIS•FET QR for reading data. The other n type semiconductor region 12 of the select MIS•FET QS is electrically connected to a conductor portion 7g in a contact hole CT formed in the insulating layer 6. To the conductor portion 7g is electrically connected the bit line RBL for reading data. The silicide layer 5a may be formed over a portion of the surface layer of the $n^+$ type semiconductor region 12b to which the conductor portion 7g is contiguous.

At the position where the floating gate electrode FG two-dimensionally overlaps with the p well (fourth well) HPW1, the capacitor portion C is formed. The constitution of the capacitor portion C is similar to that described referring to FIGS. 1 to 3. Described specifically, the capacitor portion C is equipped with the control gate electrode CGW, capacitor electrode (third electrode) FGC2, capacitor insulating film (third insulating film) 10c, p type semiconductor regions 13 and p well HPW1.

The capacitor electrode FGC2 is formed as a portion of the floating gate electrode FG opposite to the control gate electrode CGW and it constitute one of the electrodes of the capacitor portion C. The single-layer constitution of the gate structure of the memory cell MC facilitates the alignment, upon manufacture of the flash memory, of the memory cell MC and elements of the main circuit, whereby the manufacturing time and cost of a semiconductor device can be reduced.

The length of the capacitor electrode FGC2 in the second direction X is adjusted to be longer than the length of the capacitor electrode FGC1 of the capacitor portion CWE for programming/erasing data or the length of the gate electrode FGR of the MIS•FET QR for reading data in the second direction X. This makes it possible to heighten a coupling ratio and thereby improve a voltage supply efficiency from the control gate line CGW because a large plane area of the capacitor electrode FGC2 can be maintained.

The capacitor insulating film 10c is made of, for example, silicon oxide and is formed between the capacitor electrode FGC2 and substrate 1S (p well HPW1). The capacitor insulating film 10c is formed simultaneously with the gate insulating films 10b and 10e and capacitor insulating film 10d by the thermal oxidation step. Its thickness is, for example, about 13.5 nm.

The p type semiconductor regions 13 of the capacitor portion C are formed in self alignment with the capacitor electrode FGC2 at positions where the semiconductor regions sandwich the capacitor electrode FGC therebetween in the p well HPW1. These semiconductor regions 13 are each equipped with a $p^-$ type semiconductor region 13b on a channel side and a $p^+$ type semiconductor region 13a connected thereto. The $p^-$ type semiconductor region 13b and the $p^+$ type semiconductor region 13a contain impurities of the same conductivity type such as boron (B), but the impurity concentration in the $p^+$ type semiconductor region 13a is adjusted to be higher than that of the $p^-$ type semiconductor region 13b. The p type semiconductor regions 13 are electrically connected to the p well HPW1. The p type semiconductor regions 13 and p well HPW1 are portions constituting the control gate electrode CGW (the other electrode) of the capacitor portion C. These p type semiconductor regions 13 are electrically connected to a conductor portion 7e in a contact hole CT formed in the insulating layer 6. The conductor portion 7e is electrically connected to the control gate line CG. A silicide layer 5a may be formed over a portion of the surface layer of the $p^+$ type semiconductor region 15b to which this conductor portion 7c is contiguous.

Figure 14:
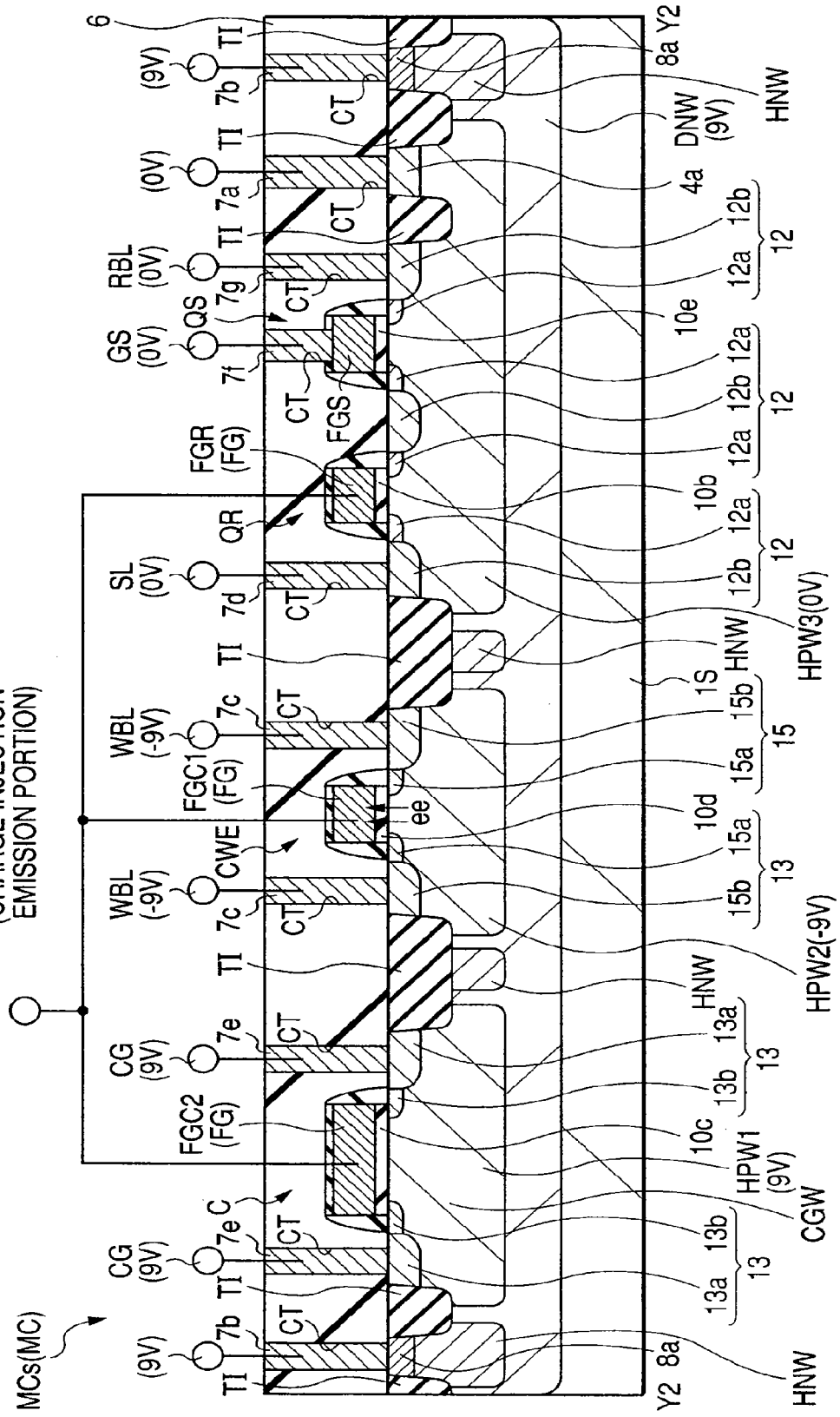
FIG. 14 is a cross-sectional view taken along a line Y2-Y2 of FIG. 12 and illustrating one example of a voltage applied to each portion of a memory cell at the time of data program operation of the nonvolatile memory in the semiconductor device according to the one embodiment of the present invention.

FIG. 14 is a cross-sectional view taken along a line Y2-Y2 of FIG. 12 and illustrates one example of a voltage applied to each portion of the select memory cell MCs at the time of data program operation of the flash memory according to Embodiment 1.

A voltage of, for example, about 9V is applied to an n well HNW and a buried n-well DNW via the conductor portion 7b to electrically isolate the substrate 1S from the p wells HPW1 to HPW3. In addition, a positive control voltage of, for example, about 9V is applied to the control gate electrode CGW of the capacitor portion C from the control gate line CG via the conductor portion 7e. A negative voltage of, for example, about −9V is applied to one (p type semiconductor regions 5 and p well HPW2) of the electrodes of the capacitor portion CWE from the bit line WBL for programming/erasing data via the conductor portion 7c. Via the conductor portion 7a, a voltage of, for example, 0V is applied to the p well HPW3. A voltage of, for example, 0V is applied to the gate electrode FGS of the select MIS•FET QS from the select line GS via the conductor portion 7f. A voltage of, for example, 0V is applied to one of the n type semiconductor regions 12 of the MIS•FET QR for reading data from the source line SL via the conductor portion 7d. A voltage of, for example, 0V is applied to the other n type semiconductor regions 12 from the bit line RBL for programming data via the conductor portion 7g. By these operations, electrons e of the p well HPW2 of the data programming/erasing capacitor portion CWE of the selected memory cell MCs are injected into the capacitor electrode FGC1 (floating gate electrode FG) via the capacitor insulating film 10d by means of an FN tunneling current of an entire channel surface to perform data programming.

Figure 15:
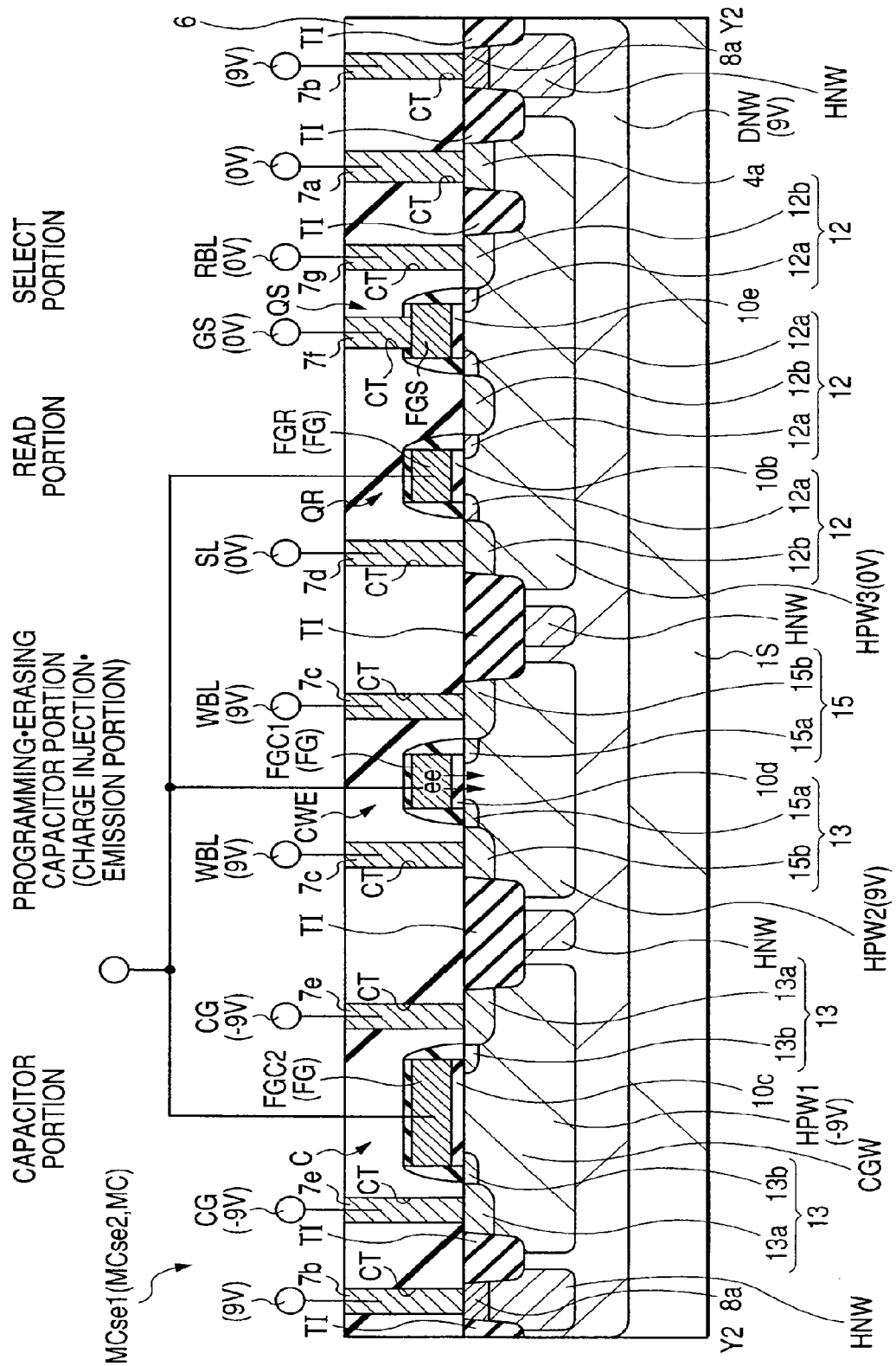
FIG. 15 is a cross-sectional view taken along a line Y2-Y2 of FIG. 12 and illustrating a voltage applied to each portion at the time of data erase operation of the nonvolatile memory in the semiconductor device according to the one embodiment of the present invention.

FIG. 15 is a cross-sectional view taken along a line Y2-Y2 of FIG. 12 and illustrates a voltage applied to each portion at the time of data erase operation of the flash memory according to Embodiment 1.

A voltage of, for example, about 9V is applied to the n well HNW and buried n-well DNW via the conductor portion 7b to electrically isolate the substrate 1S from the p wells HPW1 to HPW3. In addition, a negative control voltage of, for example, about −9V is applied to the control gate electrode CGW of the capacitor portion C from the control gate line CG via the conductor portion 7e. A positive voltage of, for example, about 9V is applied to one (p type semiconductor regions 5 and p well HPW2) of the electrodes of the capacitor portion CWE from the bit line WBL for programming/erasing data via the conductor portion 7c. Via the conductor portion 7a, a voltage of, for example, 0V is applied to the p well HPW3. A voltage of, for example, 0V is applied to the gate electrode FGS of the select MIS•FET QS from the select line GS via the conductor portion 7f. A voltage of, for example, 0V is applied to one of the n type semiconductor regions 12 of the MIS•FET QR for reading data from the source line SL via the conductor portion 7d. A voltage of, for example, 0V is applied to the other n type semiconductor region 12 from the bit line RBL for programming data via the conductor portion 7g. By these operations, electrons e accumulated in the capacitor electrode FGC1 (floating gate electrode FG) of the data programming/erasing capacitor portion CWE of the selected memory cell MCse1 (MCsec2) are emitted to the p well HPW2 via the capacitor insulating film 10d by means of an FN tunneling current of an entire channel surface to erase the data.

Figure 16:
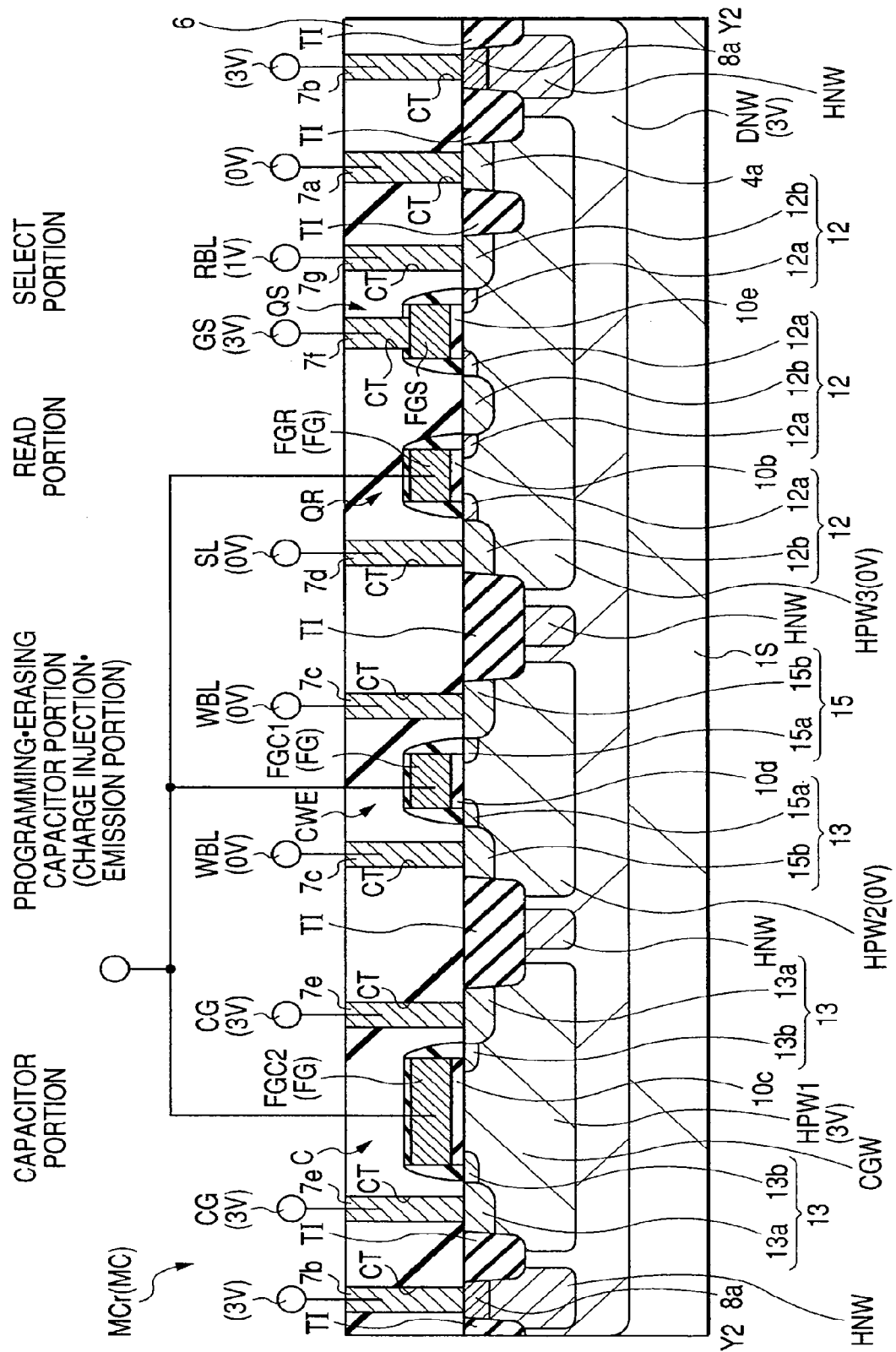
FIG. 16 is a cross-sectional view taken along a line Y2-Y2 of FIG. 12 and illustrating a voltage applied to each portion at the time of data read operation of the nonvolatile memory in the semiconductor device according to the one embodiment of the present invention.

FIG. 16 is a cross-sectional view taken along a line Y2-Y2 of FIG. 12 and illustrates a voltage applied to each portion at the time of data read operation of the flash memory according to Embodiment 1.

A voltage of, for example, about 3V is applied to the n well HNW and buried n-well DNW via the conductor portion 7b to electrically isolate the substrate 1S from the p wells HPW1 to HPW3. A positive control voltage of, for example, about 3V is applied to the control gate electrode CGW of the capacitor portion C from the control gate line CG via the conductor portion 7e, whereby a positive voltage is applied to the gate electrode FGR of the MIS•FET QR for reading data. A voltage of, for example, 0V is applied to the p well HPW3 via the conductor portion 7a. A voltage of, for example, about 3V is applied to the gate electrode FGS of the select MIS•FET QS from the select line GS via the conductor portion 7f. A voltage of, for example, 0V is applied to one of the n type semiconductor regions 12 of the MIS•FET QR for reading data from the source line SL via the conductor portion 7d. A voltage of, for example, about 1V is applied to one of the n type semiconductor regions 12 of the select MIS•FET QS from the bit line RBL for programming data via the conductor portion 7g. A voltage of, for example, 0V is applied to one (p type semiconductor regions 15 and p well HPW2) of the electrodes of the capacitor portion CWE from the bit line WBL for programming/erasing data via the conductor portion 7c. By these operations, under the conditions that the data reading MIS•FET QR of the selected memory cell MCr is turned ON, whether the data stored in the selected memory cell MCr is either 0 or 1 is read, depending on whether the drain current flows into the channel of the data reading MIS•FET QR or not.

According to Embodiment 1 as described above, a data rewrite region (capacitor portion CWE), data read-out region (MIS•FET QR for reading data) and capacitance coupled region (capacitor portion C) are formed in the p wells HPW1 to HPW3, respectively and they are isolated by the n well HNW and buried n-well DNW. Data rewriting is carried out in the capacitor element.

This makes it possible to promote size reduction of a semiconductor device because a data rewriting region of a flash memory does not need the transistor for cutoff.

Since a data rewriting element is formed of a capacitor element and the p type semiconductor regions 15 and the p well HPW2 have the same potential in the data rewriting by means of an FN tunneling current of an entire channel surface, the above-described problem of junction breakdown voltage does not occur. This makes it possible to suppress or prevent a deterioration of the memory cell of a flash memory and as a result, the flash memory has improved operation reliability. In addition, since the timing design as described is not necessary, the scale of the peripheral circuit of the flash memory can be reduced, enabling promotion of a size reduction of a semiconductor device. Moreover, data rewriting can be performed by means of an FN tunneling current of an entire channel surface which needs the least current consumption and is suited for single-power supply rewriting at a low voltage, which facilitates employment of single power supply by an internal charge pump circuit. In programming and erasing data, use of an FN tunneling current of a channel which does not generate holes contributes to an improvement in the rewriting frequency of data.

In addition, data rewriting can be stabilized by forming the data rewriting region (capacitor portion CWE) and data read-out region (MIS•FET QR for reading data) in the respective p wells HPW2 and HPW3. This leads to an improvement in the operation stability of the flash memory.

Embodiment 2

In Embodiment 2, one example of a manufacturing method of a semiconductor device which has, on a semiconductor chip having, for example, an LCD driver circuit (main circuit) formed thereon, a flash memory for storing a relatively small amount of desired information related to the main circuit will next be described referring to FIGS. 17 to 28.

FIGS. 17 to 28 are fragmentary cross-sectional views of the same substrate 1S (a thin semiconductor disc called "semiconductor wafer") during the manufacturing steps of the semiconductor device according to Embodiment 2. A high-breakdown-voltage portion and a low-breakdown-voltage portion are MIS•FET formation regions constituting the LCD driver circuit. The operating voltage of MIS•FET of the high-breakdown-voltage portion is, for example, about 25V, while that of MIS•FET of the low-breakdown-voltage portion is, for example, about 6.0V. In addition to the MIS•FET having an operating voltage of 6.0V, that having an operating voltage of 1.5V can be employed as the MIS•FET of the low-breakdown-voltage portion. The MIS•FET having an operating voltage of 1.5V is disposed because of operation at higher speed than that of the MIS•FET having an operating voltage of 6.0V. It constitutes, together with another MIS•FET, the LCD driver circuit. The gate insulating film of the MIS•FET having an operating voltage of 1.5V is thinner than that of the MIS•FET having an operating voltage of 6.0V and it has a thickness of from about 1 to 3 nm. In order to simplify the description, only the MIS•FET of the high-breakdown-voltage portion having an operating voltage of 25V and the MIS•FET of the low-breakdown-voltage portion having an operating voltage of 6.0V are illustrated in the diagrams and the MIS•FET having an operating voltage of 1.5V is not illustrated in the drawings shown below and description herein. In the semiconductor device (semiconductor chip, substrate 1S) according to Embodiment 2, a supply source fed from the outside is a single supply source.

As illustrated in FIGS. 17 and 18, a p type substrate 1S (semiconductor wafer) is prepared and a buried p-well DPW is formed in the high-breakdown-voltage portion by a photolithography (which will hereinafter be called "lithography" simply) step, ion implantation step and the like. The lithography step is a series of sub-steps composed of application of a photoresist (which will hereinafter be called "resist" simply) film, exposure and development, by which a desired resist pattern is formed. In the ion implantation step, with a resist pattern formed over the main surface of the substrate 1S by the lithography step, a desired impurity is selectively introduced into a desired portion of the substrate 1S. The term "resist pattern" as used herein means a pattern from which an impurity introduced region is exposed but by which the other region is covered.

In the high-breakdown-voltage portion, low-breakdown-voltage portion and the memory cell formation region of a flash memory, buried n-wells DNW are formed simultaneously by the lithography step, ion implantation step and the like. After formation of isolation trenches in the isolation region on the main surface of the substrate 1S, an insulating film is filled in the isolation trenches, whereby isolation portions TI in the trench form are formed. Active regions are defined by these isolation portions.

Figure 19:
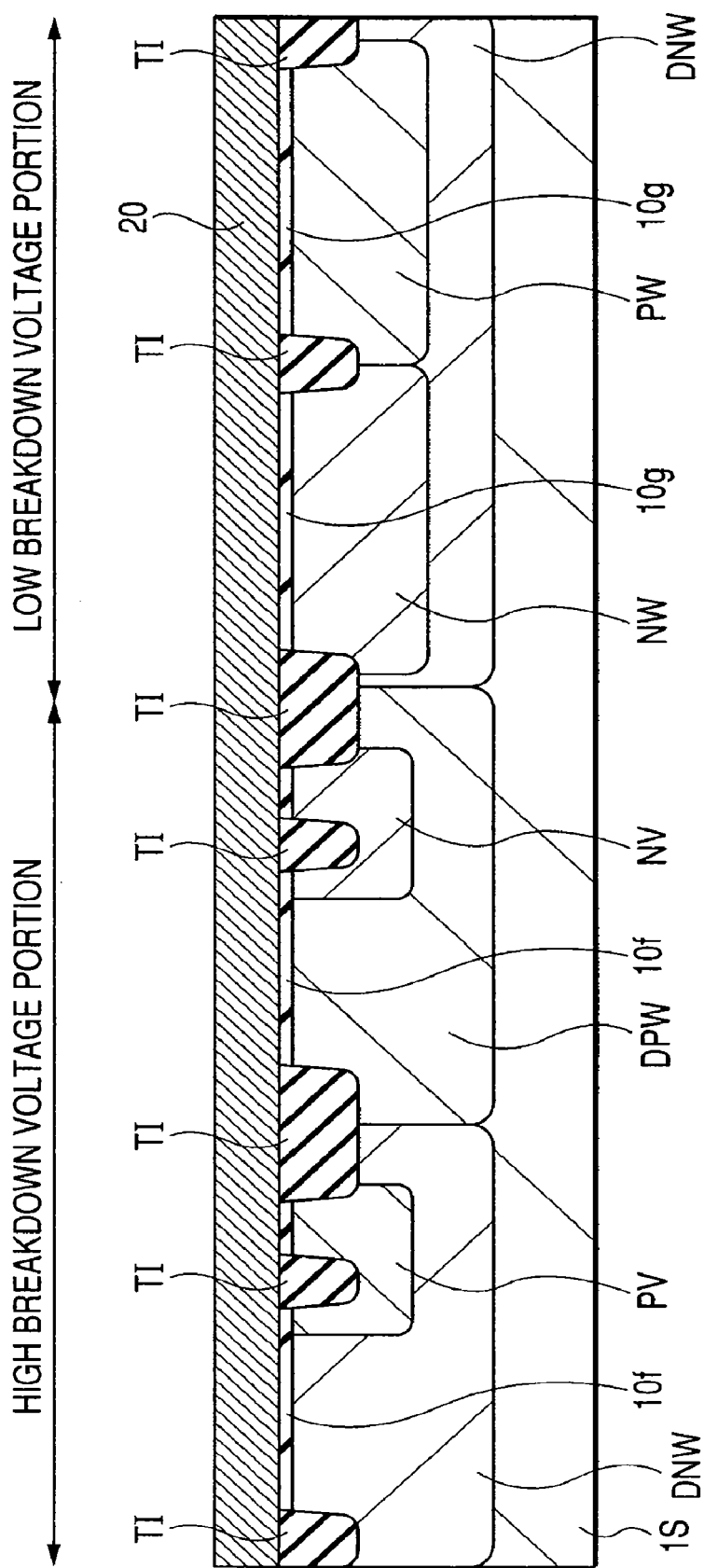
FIG. 19 is a fragmentary cross-sectional view of a semiconductor substrate in the main circuit formation region during a manufacturing step of the semiconductor device following the step of FIG. 17 and FIG. 18.
Figure 20:
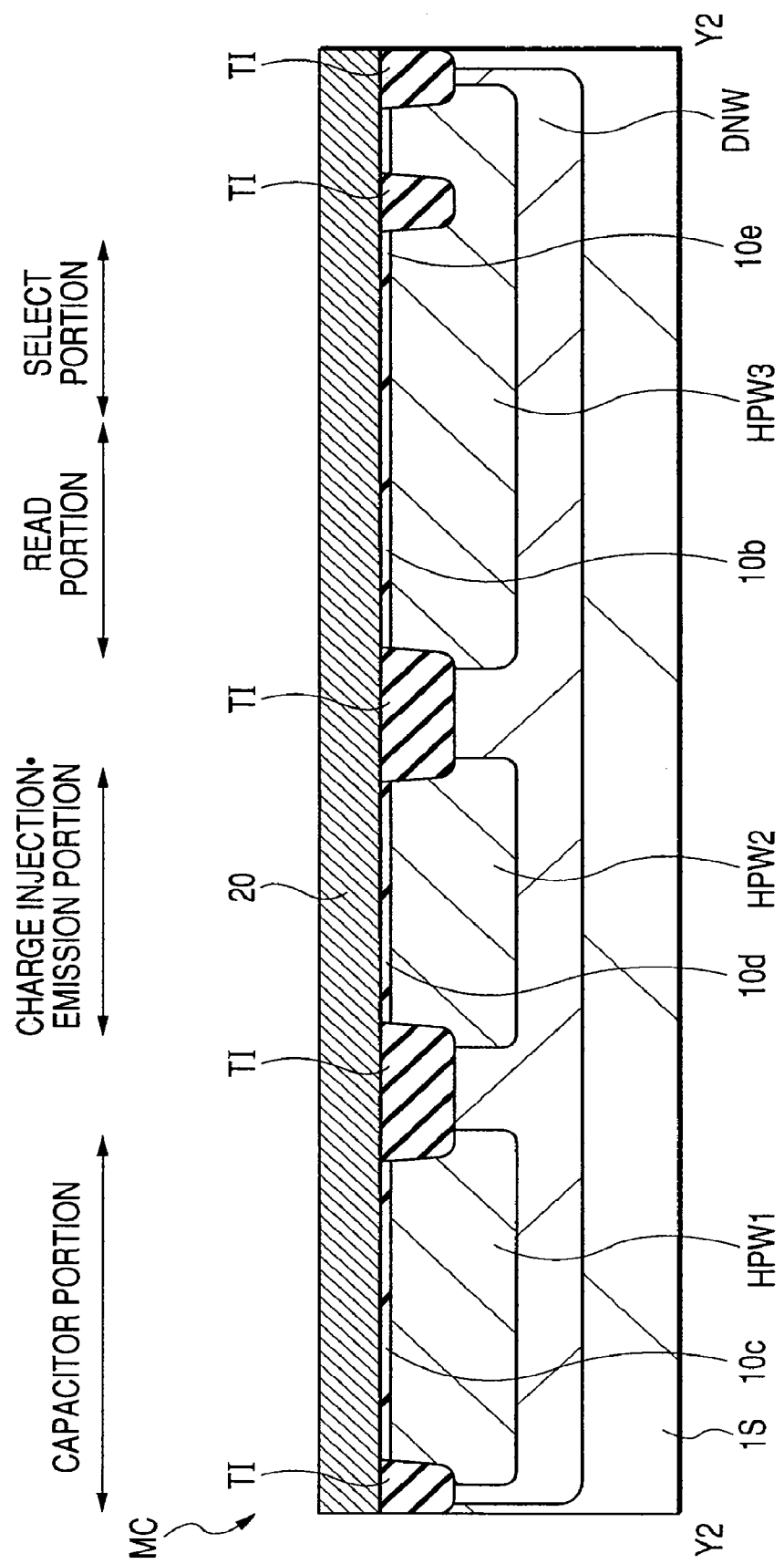
FIG. 20 is a fragmentary cross-sectional view of a semiconductor substrate in the nonvolatile memory region in the same step as that of FIG. 19.

As illustrated in FIGS. 19 and 20, an n type semiconductor region NV is formed in the formation region of an n channel type MIS•FET in the high-breakdown-voltage portion by the lithography step, ion implantation step and the like. This n type semiconductor region NV has a higher impurity concentration than that of the buried n-well DNW. A p type semiconductor region PV is then formed in the formation region of a p channel type MIS•FET in the high-breakdown-voltage portion by the lithography step, ion implantation step and the like. This p type semiconductor region PV has a higher impurity concentration than that of the buried p-well DPW.

A p well PW is then formed by the lithography step, ion implantation step and the like in the formation region of an n channel type MIS•FET in the low-breakdown-voltage portion. This p well PW is a region having a higher impurity concentration than that of the p type buried well DPW and a region having a higher impurity concentration than that of the p type semiconductor region PV. An n well NW is then formed in the formation region of a p channel type MIS•FET in the low-breakdown-voltage portion by the lithography step, ion implantation step and the like. This n well NW is a region having a higher impurity concentration than that of the buried n-well DNW and is a region having a higher impurity concentration than that of the p type semiconductor region PV.

In the memory cell formation region of the flash memory, p wells HPW1 to HPW3 are formed simultaneously by the lithography step, ion implantation step and the like. The p wells HPW1 to HPW3 are regions having a higher impurity concentration than that of the buried p-well DPW and regions having an impurity concentration at the same level as that of the p type semiconductor region PV.

The above-described relationship in impurity concentration among these buried n-well DNW, buried p-well DPW, n type semiconductor region NV, p type semiconductor region PV, n well NW, p well PW and p wells HPW1 to HPW3 will be also applied to the below-described embodiments.

After formation of gate insulating films 10b, 10e, 10f and 10g and capacitor insulating films 10c and 10d by a thermal oxidation process, a conductor film 20 made of, for example, low resistance polycrystalline silicon is formed over the main surface of the substrate 1S (semiconductor wafer) by CVD (chemical vapor deposition) or the like process. When the gate insulating film 10f of the MIS•FET in the high-breakdown-voltage portion is formed, its thickness is made greater than that of the gate insulating film 10g of the MIS•FET in the low-breakdown-voltage portion so that it can withstand the breakdown voltage of 25V. The gate insulating film 10f of the MIS•FET in the high-breakdown-voltage portion is, for example, 50 to 100 nm. Instead of an oxide film formed by a thermal oxidation process, an insulating film deposited by CVD can be stacked.

In this Embodiment, the gate insulating films 10b and 10e and capacitor insulating films 10c and 10d of the nonvolatile memory are formed by the formation step of the gate insulating film 10g of the MIS•FET (MIS•FET having an operating voltage of, for example, 6V) in the low-breakdown-voltage portion and the gate insulating film 10b and 10e and capacitor insulating films 10c and 10d of the nonvolatile memory each has a thickness equal to that of the gate insulating film 10g of the MIS•FET in the low-breakdown-voltage portion. For similar reasons to those referred to the insulating film 10a and the like in Embodiment 1, the gate insulating films 10b, 10e and 10g and capacitor insulating films 10c and 10d each preferably has a thickness of 10 nm or greater but not greater than 20 nm. It has, for example, a thickness of 13.5 nm.

Figure 21:
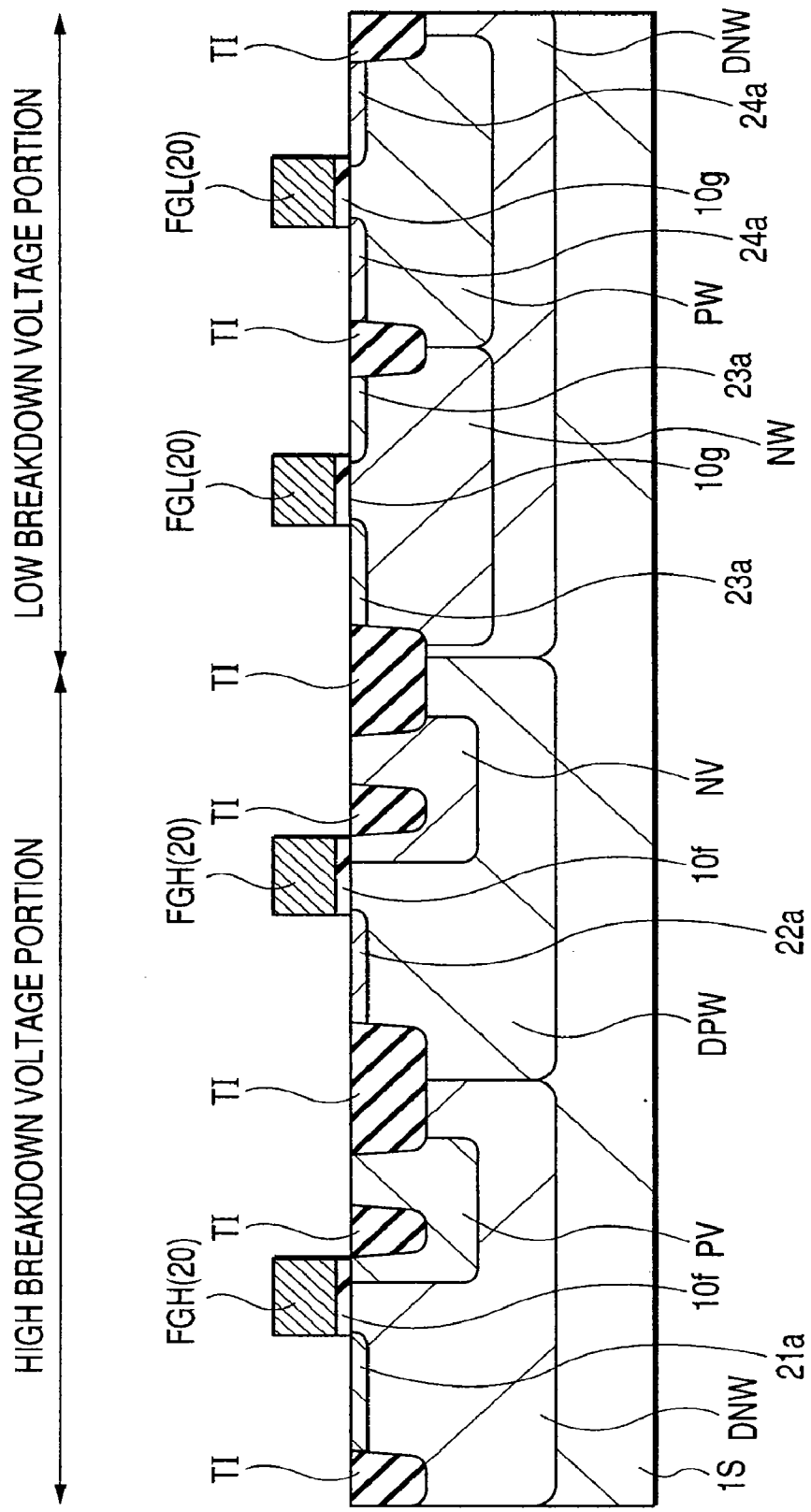
FIG. 21 is a fragmentary cross-sectional view of a semiconductor substrate in the main-circuit formation region during a manufacturing step of the semiconductor device following the step of FIG. 19 and FIG. 20.
Figure 22:
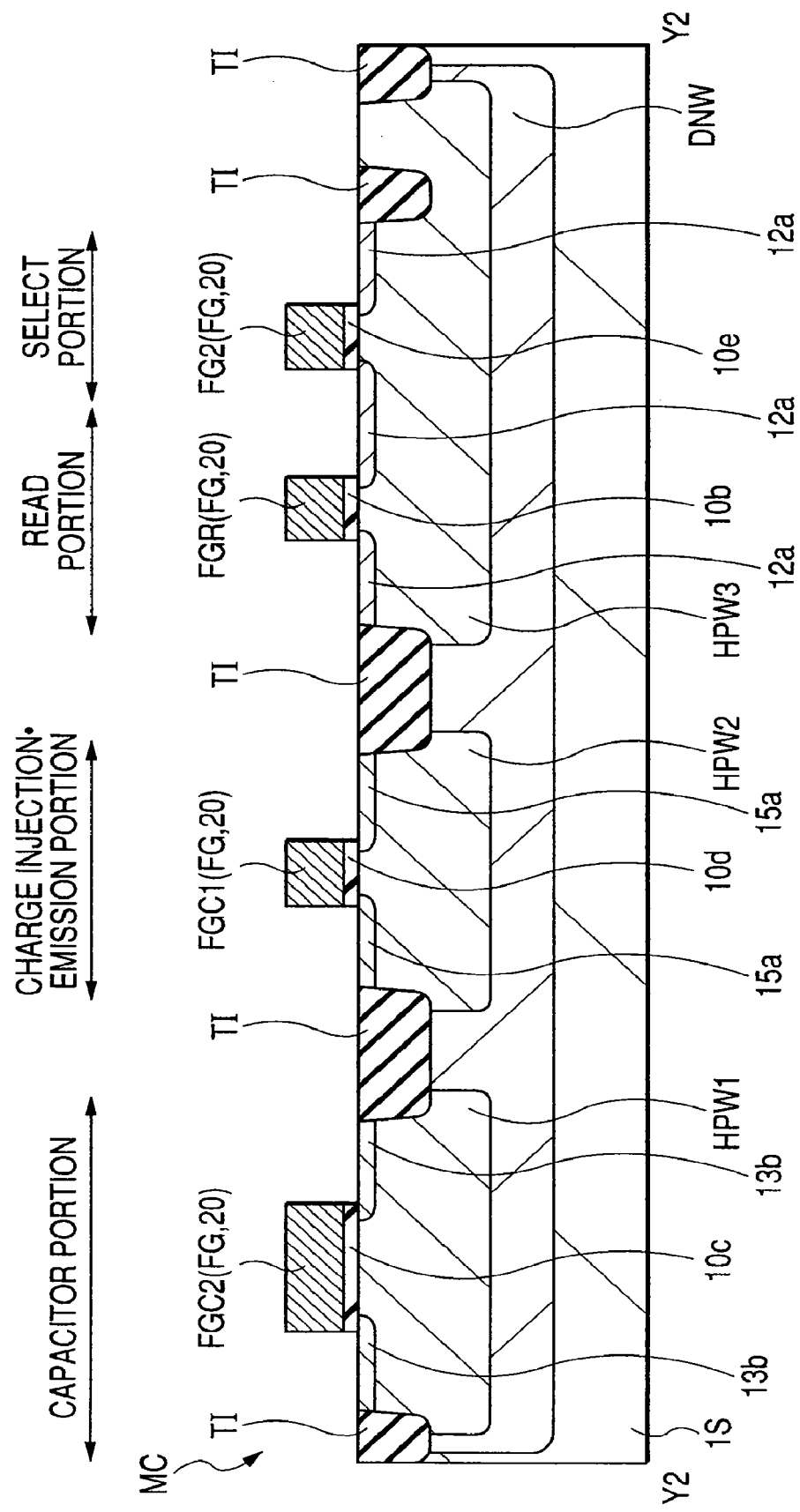
FIG. 22 is a fragmentary cross-sectional view of a semiconductor substrate in the nonvolatile memory region in the same step as that of FIG. 21.

As illustrated in FIGS. 21 and 22, the conductor film 20 is patterned by the lithography step and etching step, whereby gate electrodes FGH, FGL and FGS and floating gates FG (gate electrode FGR and capacitor electrodes FGC1 and FGC2) are formed simultaneously. In the formation region of a p-channel type MIS•FET of the high-breakdown-voltage portion, the formation region of the capacitor portion C and the formation region of the capacitor portion CWE for programming/erasing data, p⁻ type semiconductor regions 21a, 13b and 15a are formed simultaneously by the lithography step and ion implantation process. In the formation region of the channel type MIS•FET of the high-breakdown-voltage portion, the formation region of the MIS•FET QR for reading data and the formation region of the select MIS•FET QS, n⁻ type semiconductor regions 22a and 12a are then formed simultaneously by the lithography step, ion implantation process and the like. In the formation region of the p channel type MIS•FET of the low-breakdown-voltage portion and a p⁻ type semiconductor region 23a is then formed by the lithography step, ion implantation process and the like. In the formation region of the n-channel type MIS•FET region of the low-breakdown-voltage portion, an n⁻ type semiconductor region 24a is formed by the lithography step, ion implantation process and the like.

Figure 23:
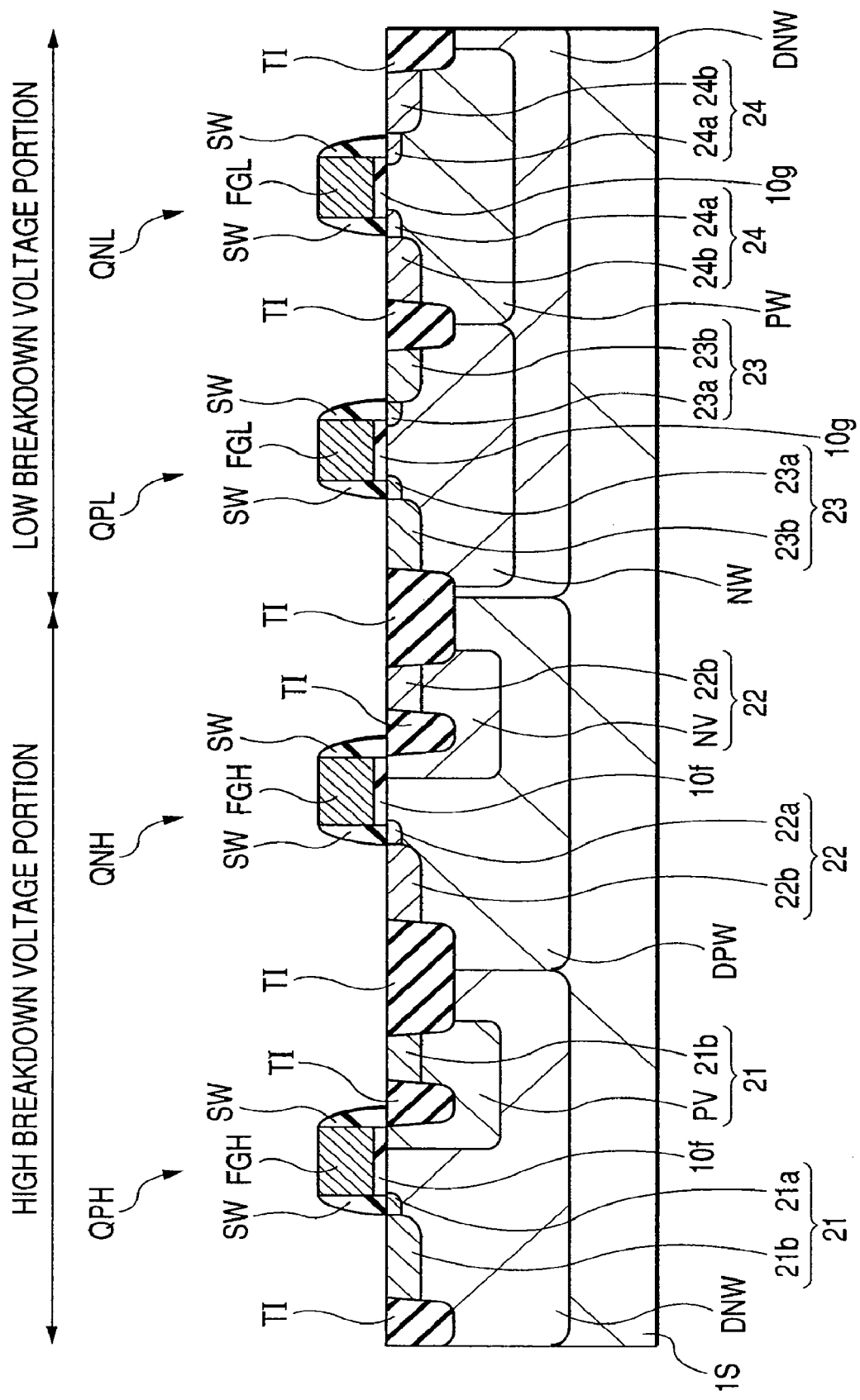
FIG. 23 is a fragmentary cross-sectional view of a semiconductor substrate in the main circuit formation region during a manufacturing step of the semiconductor device following the step of FIG. 21 and FIG. 22.
Figure 24:
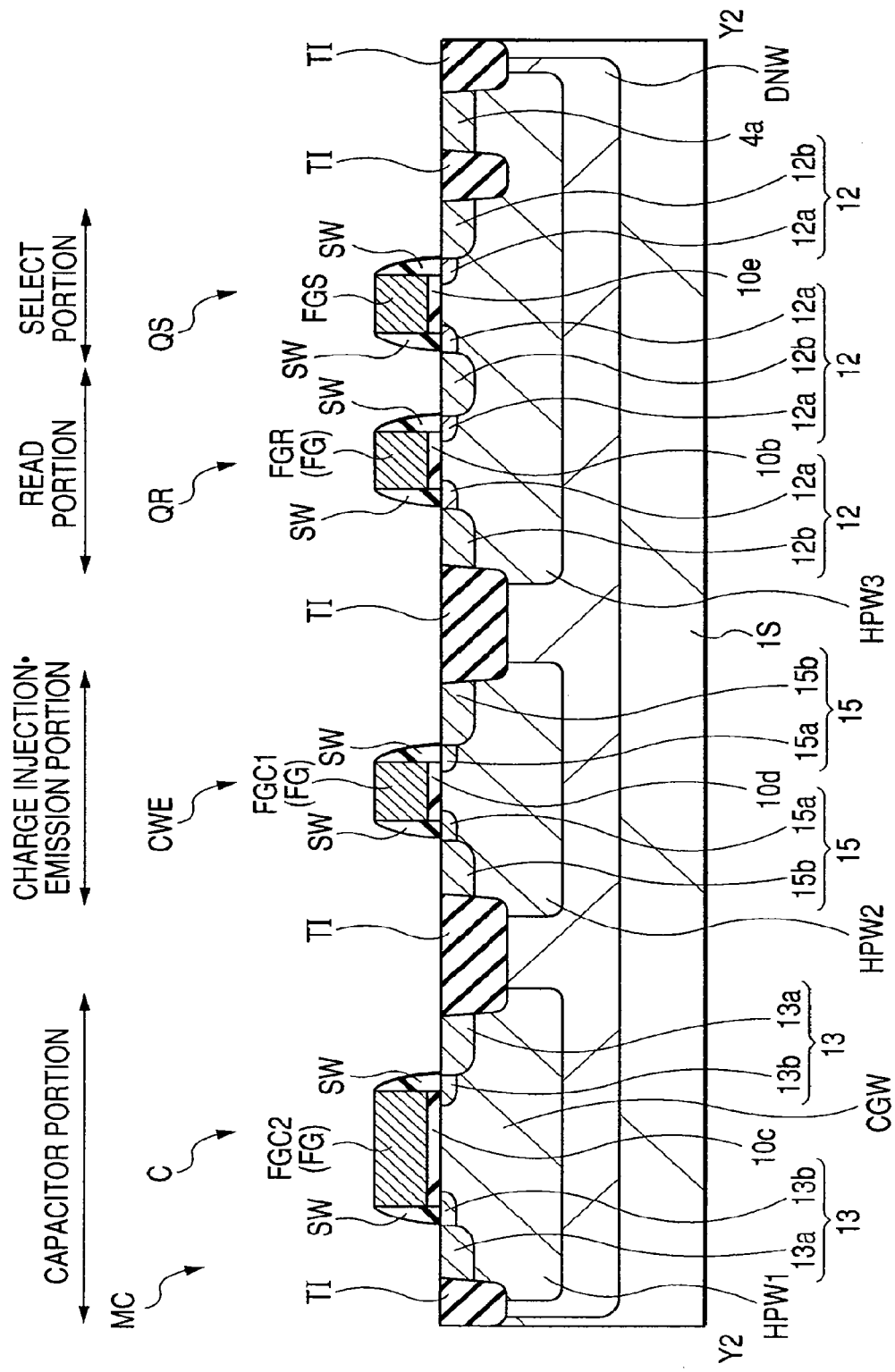
FIG. 24 is a fragmentary cross-sectional view of a semiconductor substrate in the nonvolatile memory region in the same step with as of FIG. 23.

As illustrated in FIGS. 23 and 24, an insulating film made of, for example, silicon oxide is deposited over the main surface of the substrate 1S (semiconductor wafer) by CVD or the like, followed by anisotropic dry etching to etch it back, whereby sidewalls SW are formed over the side surfaces of the gate electrodes FGH, FGL, FGR, and FGS and the capacitor electrodes FGC1 and FGC2.

In the formation regions of the p channel type MIS•FET of the high-breakdown-voltage portion and the low-breakdown-voltage portion, the formation region of the capacitor portion and the capacitor portion for programming/erasing data, and the extraction region of the p well HPW3, p⁺ type semiconductor regions 21b, 23b, 13a, 15b and 4a are formed simultaneously by the lithography step, ion implantation process and the like. In such a manner, in the high-breakdown-voltage portion, p type semiconductor regions 21 for source and drain are formed, whereby a p channel type MIS•FET QPH is formed; in the low-breakdown-voltage portion, p type semiconductor regions 23 for source and drain are formed, whereby a p channel type MIS•FET QRL is formed; in the capacitor portion formation region, p type semiconductor regions 13 are formed, whereby the capacitor portion C is formed; and in the formation region of the capacitor portion for programming/erasing, p type semiconductor regions 15 are formed, whereby the capacitor portion CWE for programming/erasing data is formed.

In the n-channel type MIS•FET formation region of the high-breakdown-voltage portion, low-breakdown-voltage portion, read-out portion and select portion, n⁺ type semiconductor regions 22b, 24b and 12b are formed simultaneously by the lithography step, ion implantation process and the like. In such a manner, in the high-breakdown-voltage portion, n type semiconductor regions 22 for source and drain are formed, whereby an n channel type MIS•FET QNH is formed; in the low-breakdown-voltage portion, n type semiconductor regions 24 for source and drain are formed, whereby an n channel type MIS•FET QNL is formed; and in the read-out portion and select portion, n type semiconductor regions 12 are formed, whereby a MIS•FET QR for reading data and select MIS•FET QS are formed.

Figure 25:
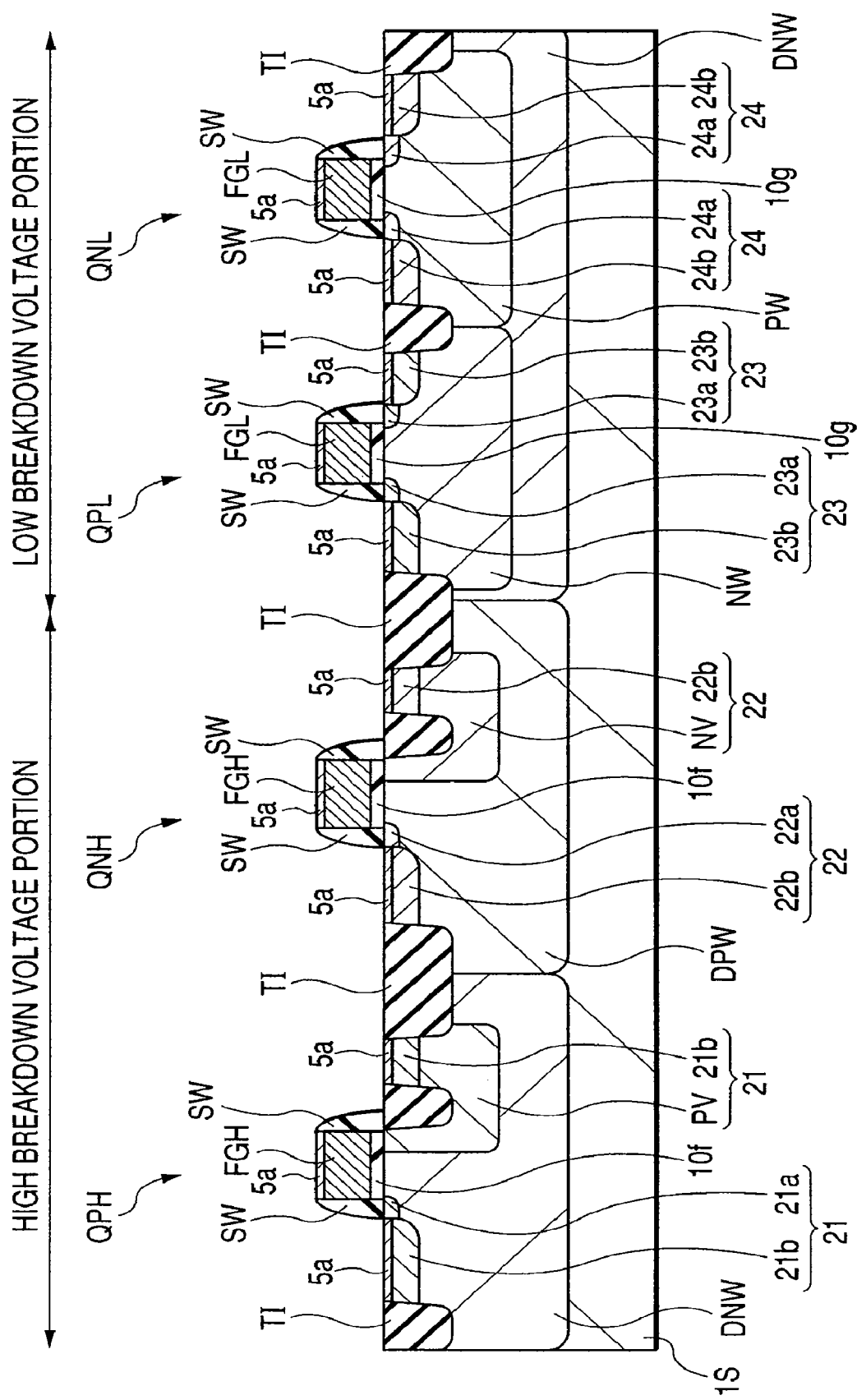
FIG. 25 is a fragmentary cross-sectional view of a semiconductor substrate in the main circuit formation region during a manufacturing step of the semiconductor device following the step of FIG. 23 and FIG. 24.
Figure 26:
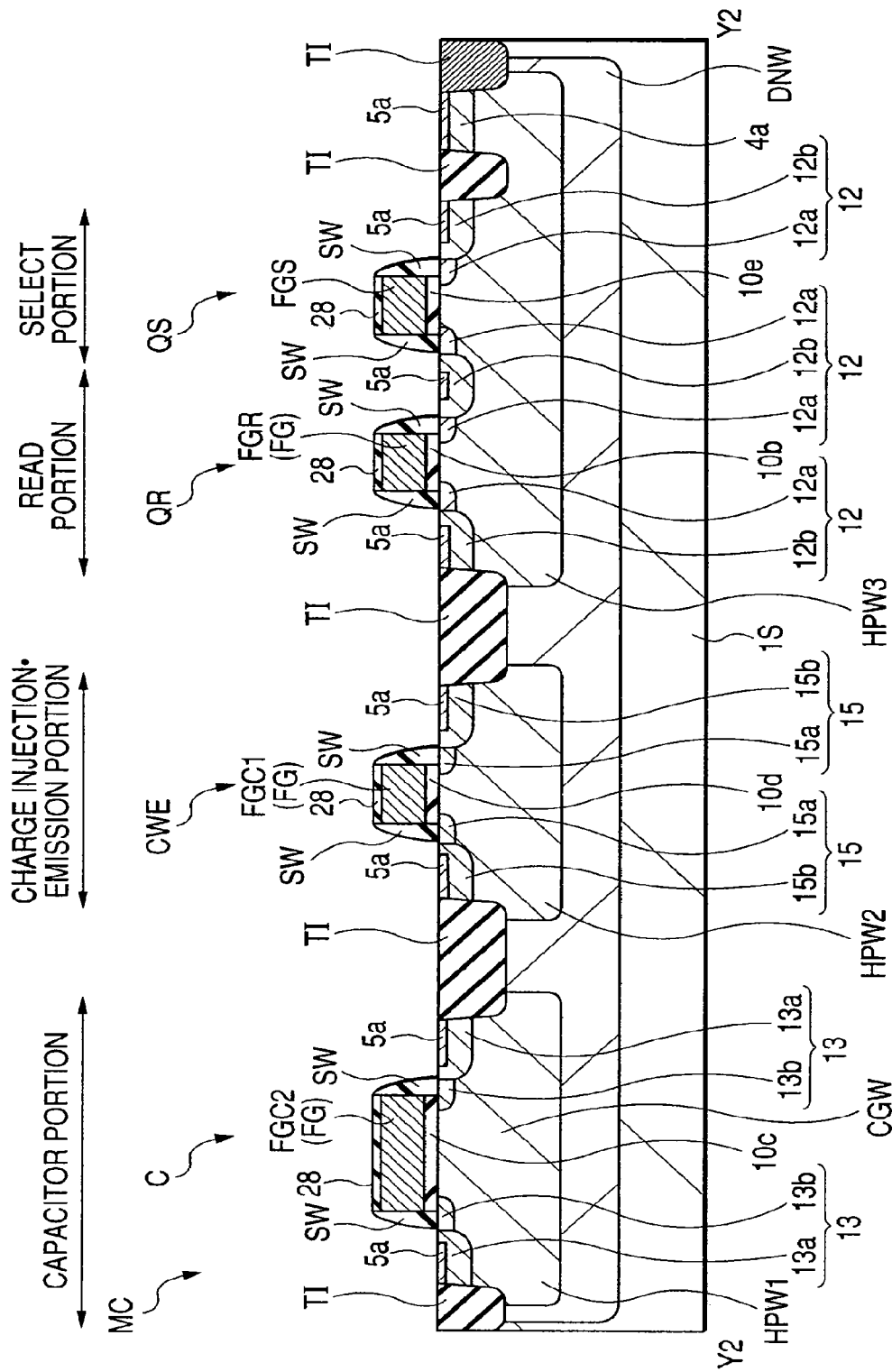
FIG. 26 is a fragmentary cross-sectional view of a semiconductor substrate in the nonvolatile memory region in the same step as that of FIG. 25.
Figure 27:
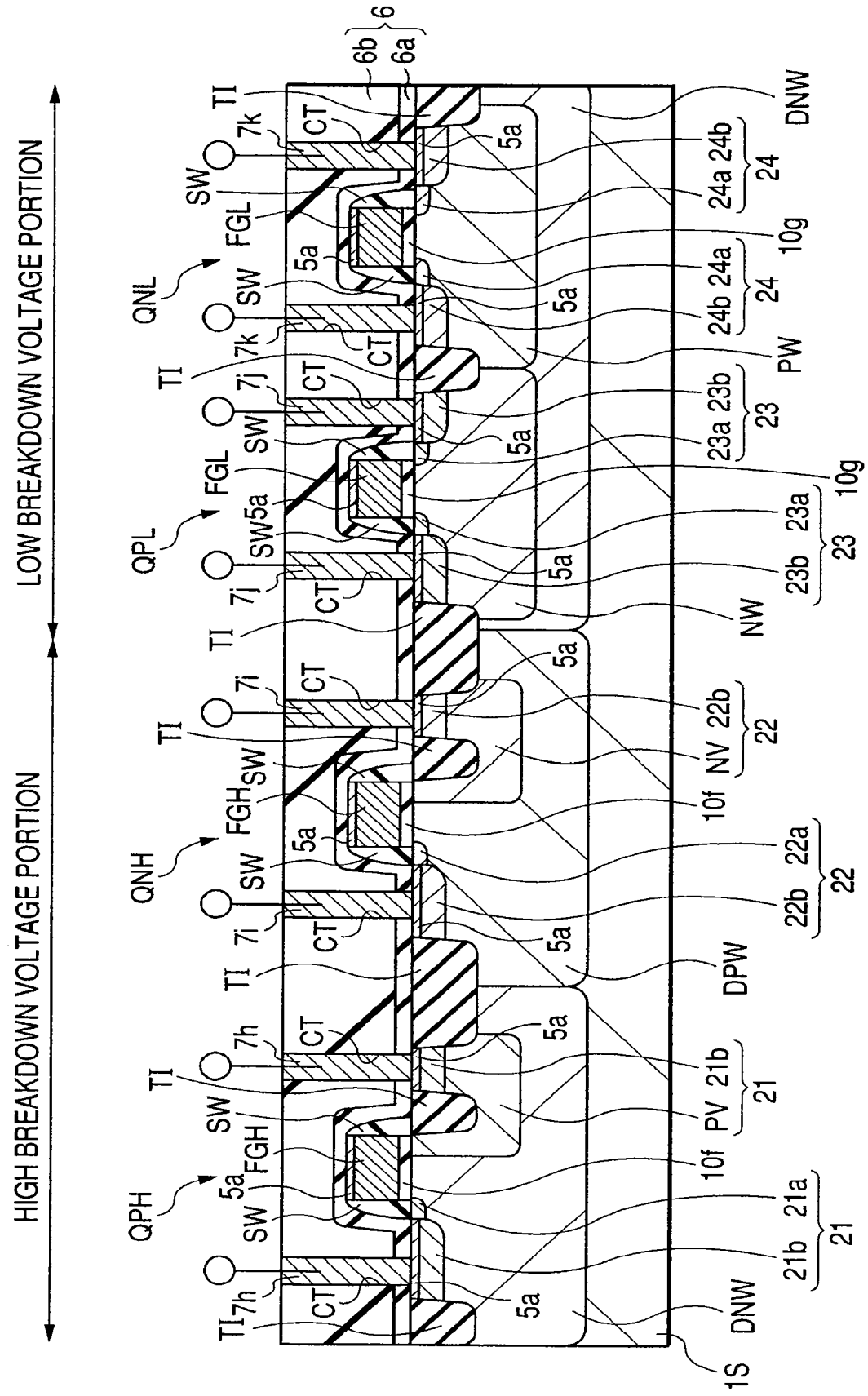
FIG. 27 is a fragmentary cross-sectional view of a semiconductor substrate in the main circuit formation region during a manufacturing step of the semiconductor device following the step of FIG. 25 and FIG. 26.
Figure 28:
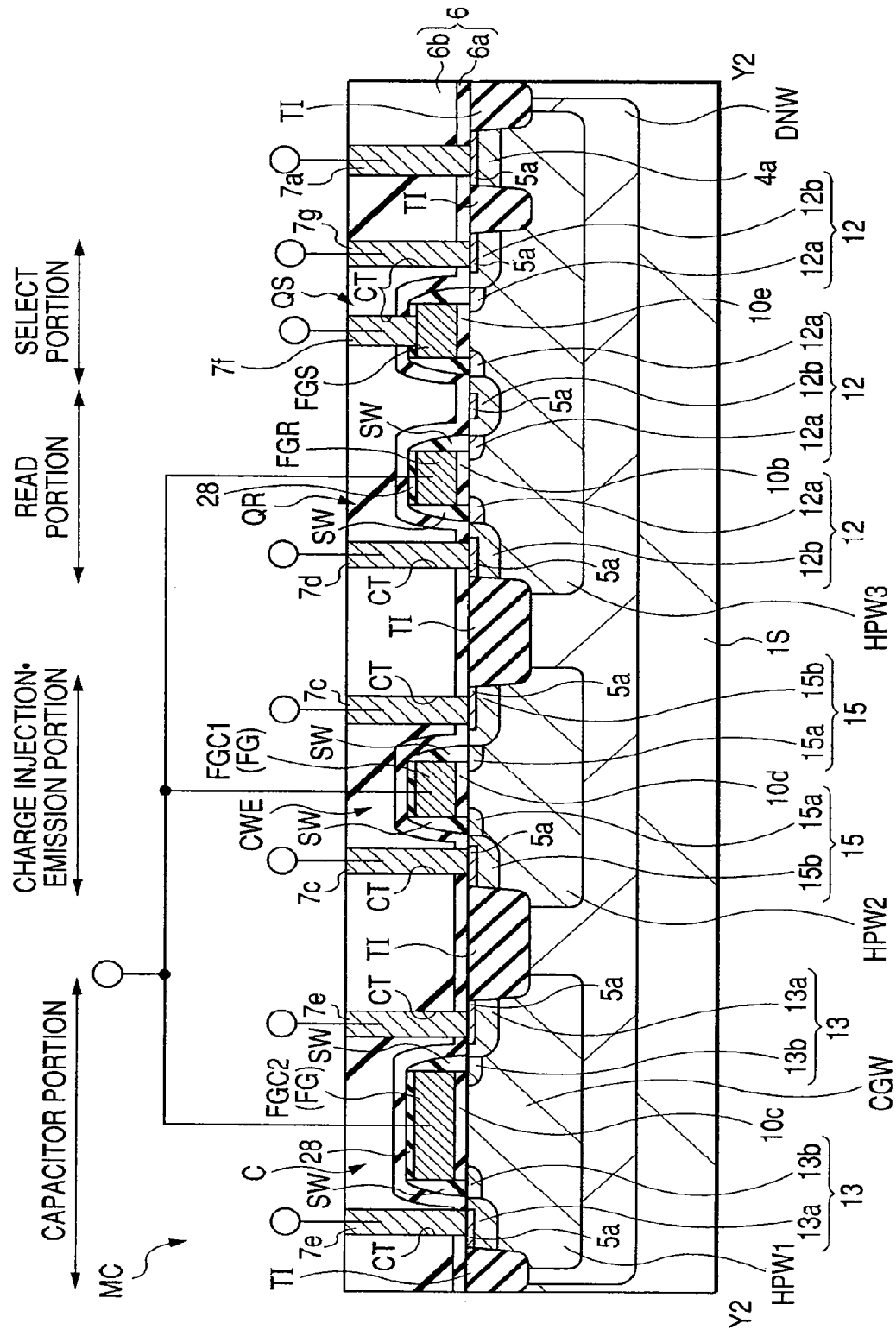
FIG. 28 is a fragmentary cross-sectional view of a semiconductor substrate in the nonvolatile memory region in the same step as that of FIG. 27.

As illustrated in FIGS. 25 and 26, a silicide layer 5a is then selectively formed. Prior to the formation step of this silicide layer 5a, in the memory cell MC region, a cap insulating film 28 is formed on the upper surface of the floating gate electrodes FG (capacitor electrodes FGC1 and FGC2, and gate electrode FGR) and gate electrode FGS and at the same time, an insulating film is formed over a portion of the substrate 1S to prevent the silicide layer 5a from being formed over these portions. As illustrated in FIGS. 27 and 28, an insulating layer 6a made of, for example, silicon nitride is deposited over the main surface of the substrate 1S (semiconductor wafer) by CVD or the like, followed by deposition thereover an insulating layer 6b, which is made of, for example, silicon oxide and thicker than the insulating layer 6a, by CVD or the like. The insulating layer 6b is then subjected to chemical mechanical polishing (CMP) to planarize the upper surface of the insulating layer 6b. Contact holes CT are then formed in the insulating layer 6 by the lithography step and etching step. Over the main surface of the substrate 1S (semiconductor wafer), a conductor film made of, for example, tungsten (W) is deposited by CVD or the like, followed by polishing by CMP or the like to form conductor portions 7a, and 7c to 7k in the contact holes. After the ordinary metallization step, inspection step and fabrication step, the manufacture of the semiconductor device can be completed.

According to Embodiment 2, constituting portions of MIS•FET QPH, QNH, QPL and QNL for the LCD driver circuit, and capacitor portions C and CWE and constituting portions of MIS•FET QR and QS in the memory Cell can be formed simultaneously so that a manufacturing process of a semiconductor device can be simplified. This leads to a reduction in the manufacturing time of the semiconductor device and also a reduction in the manufacturing cost of it.

An external single supply voltage (for example, 3.3V) of the semiconductor device can be converted into a voltage (for example, −9V) to be used at the time of data programming of the memory cell MC by a negative-voltage charge pump circuit (internal charge pump circuit) for LCD driver circuit. In addition, an external single supply voltage (for example, 3.3V) can be converted into a voltage (for example, 9V) to be used at the time of data erasing of the memory cell MC by a positive-voltage charge pump circuit (internal charge pump circuit) for LCD driver circuit. This suggests that the semiconductor device of this embodiment does not need additional internal charge pump circuit for flash memory. It is therefore possible to suppress the circuit scale inside of the semiconductor device to a small level, thereby promoting a size reduction of the semiconductor device.

Embodiment 3

Figure 29:
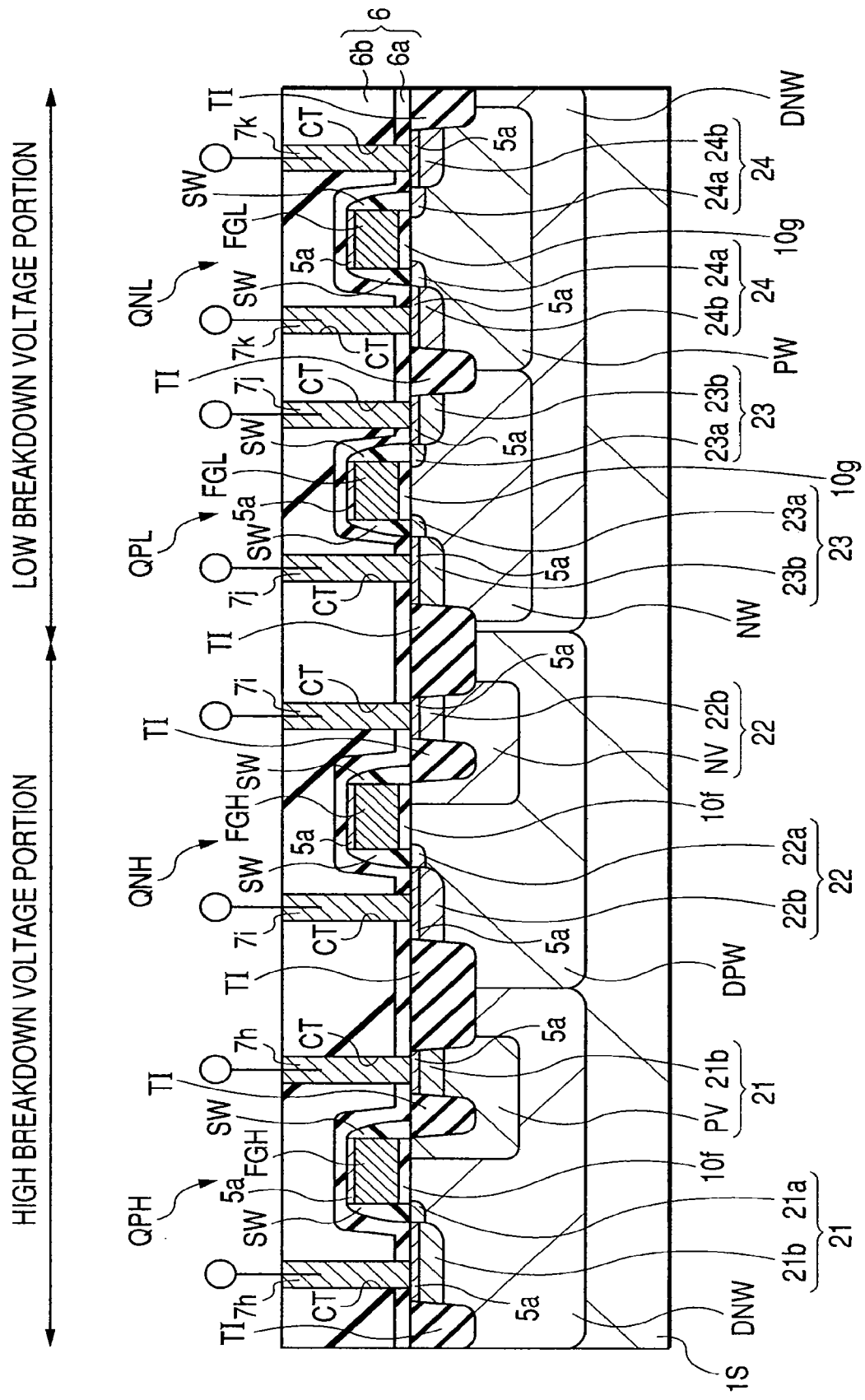
FIG. 29 is a cross-sectional view of a semiconductor substrate in the main circuit formation region of a semiconductor device according to a further embodiment of the present invention.
Figure 30:
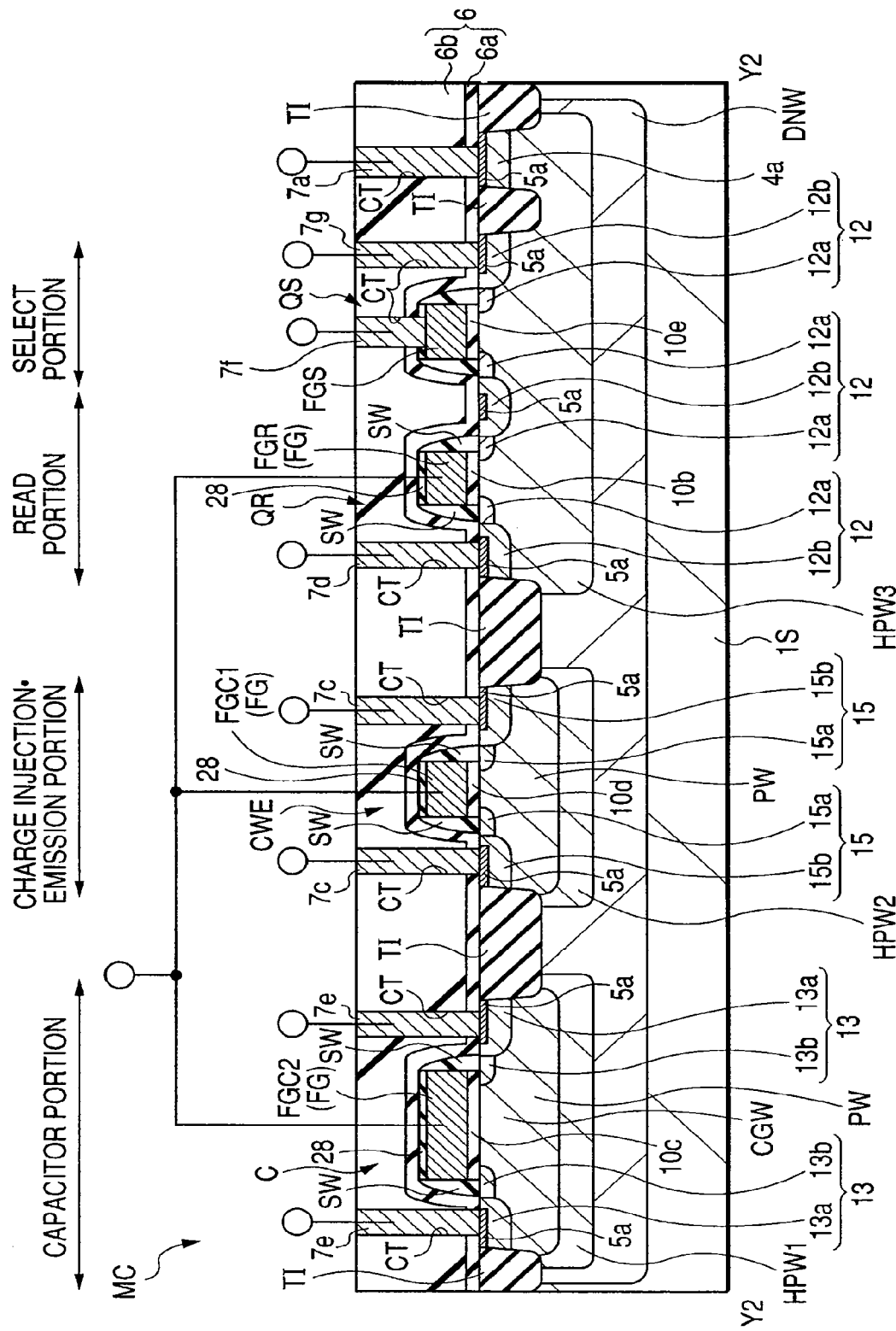
FIG. 30 is a cross-sectional view of a semiconductor substrate in a nonvolatile memory region in the semiconductor device of FIG. 29.

FIG. 29 is a fragmentary cross-sectional view of an LCD driver circuit (main circuit) of a semiconductor device according to Embodiment 3; and FIG. 30 is a fragmentary cross-sectional view of a flash memory region formed on the same substrate 1S illustrated in FIG. 29.

Figure 31:
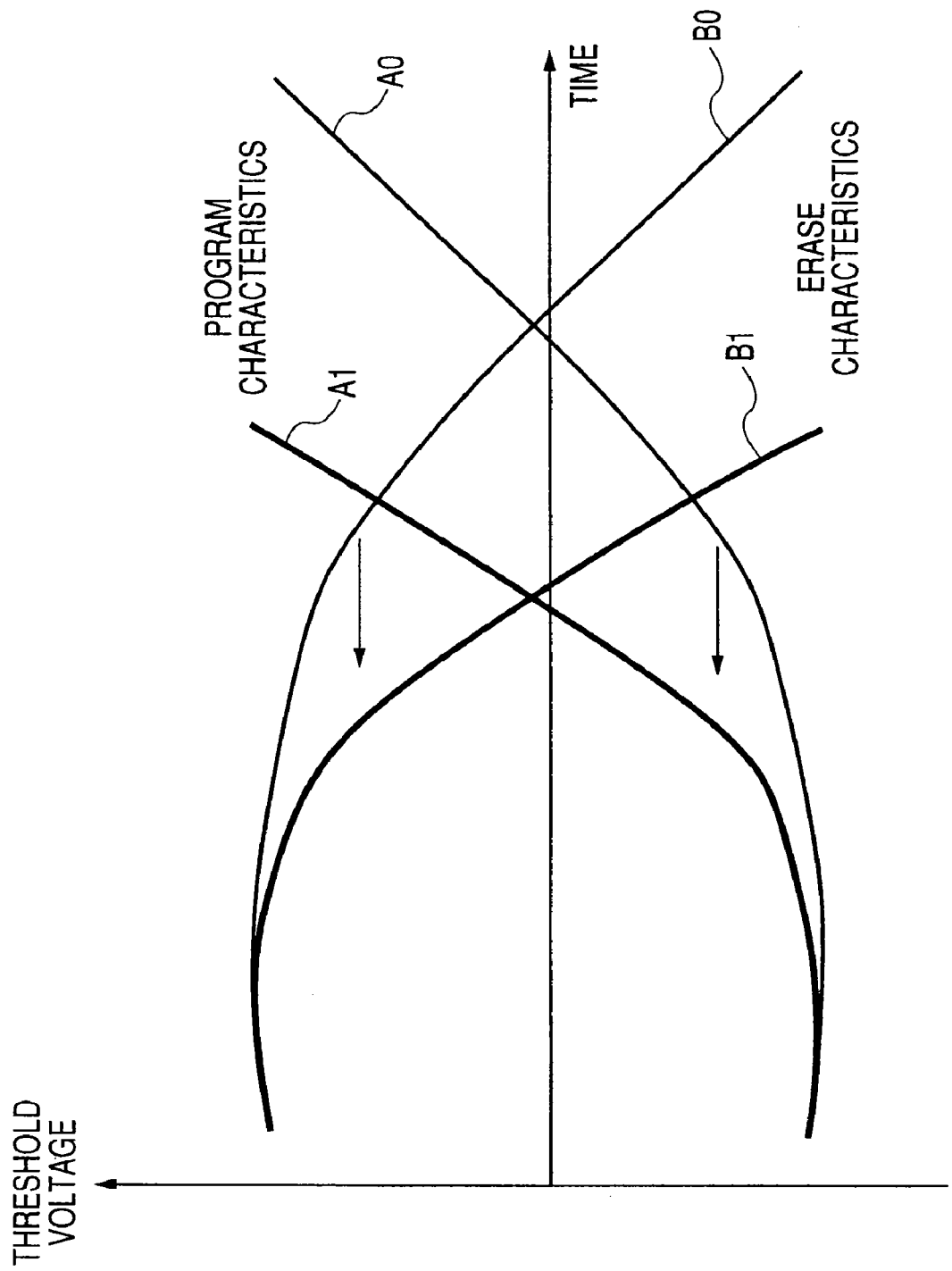
FIG. 31 is a schematic view illustrating data program and erase characteristics of the semiconductor device of FIGS. 29 to 30.

In Embodiment 3, as illustrated in FIGS. 29 and 30, a p well PW is formed in the p wells HPW1 and HPW2 of the capacitor portions C and CWE. Such a structure raises the concentration of a p type impurity in a portion of the substrate 1S just below the capacitor electrodes FGC1 and FGC2 so that depletion in the portion of the substrate 1S just below the capacitor electrodes FGC1 and FGC2 can be suppressed or prevented at the time of rewriting (programming/erasing). This makes it possible to heighten a voltage to be applied to the capacitor insulating films 10c and 10d, leading to an increase in the data rewriting speed. FIG. 31 is a graph illustrating the program/ erase characteristics of data. Solid lines A1 and B1 indicate the program and erase characteristics of Embodiment 3, respectively, while solid lines A0 and B0 indicate the program and erase characteristics, respectively, when the p well PW is not formed in the p wells HPW1 and HPW2. From the graph, it has been understood that the data programming/erasing time can be reduced in Embodiment 3.

Such a p well PW in the p wells HPW1 and HPW2 in the flash memory region is formed simultaneously with the p well PW in the formation region of the n channel type MIS•FET QNL of the low-breakdown-voltage portion of the LCD driver circuit region. Described specifically, after formation of a resist pattern from which the formation regions of the p well PW in the flash memory region and low-breakdown-voltage portion are exposed and by which the other regions are covered, a p type impurity is introduced into the substrate 1S with the resist pattern as a mask. The formation of the p well PW in the p wells HPW1 and HPW2 therefore does not require an additional manufacturing step. Manufacturing steps other than this step are similar to those of Embodiment 2. Advantages other than the above-described one are similar to those available by Embodiment 1 or 2 so that description on them is omitted.

Embodiment 4

Figure 32:
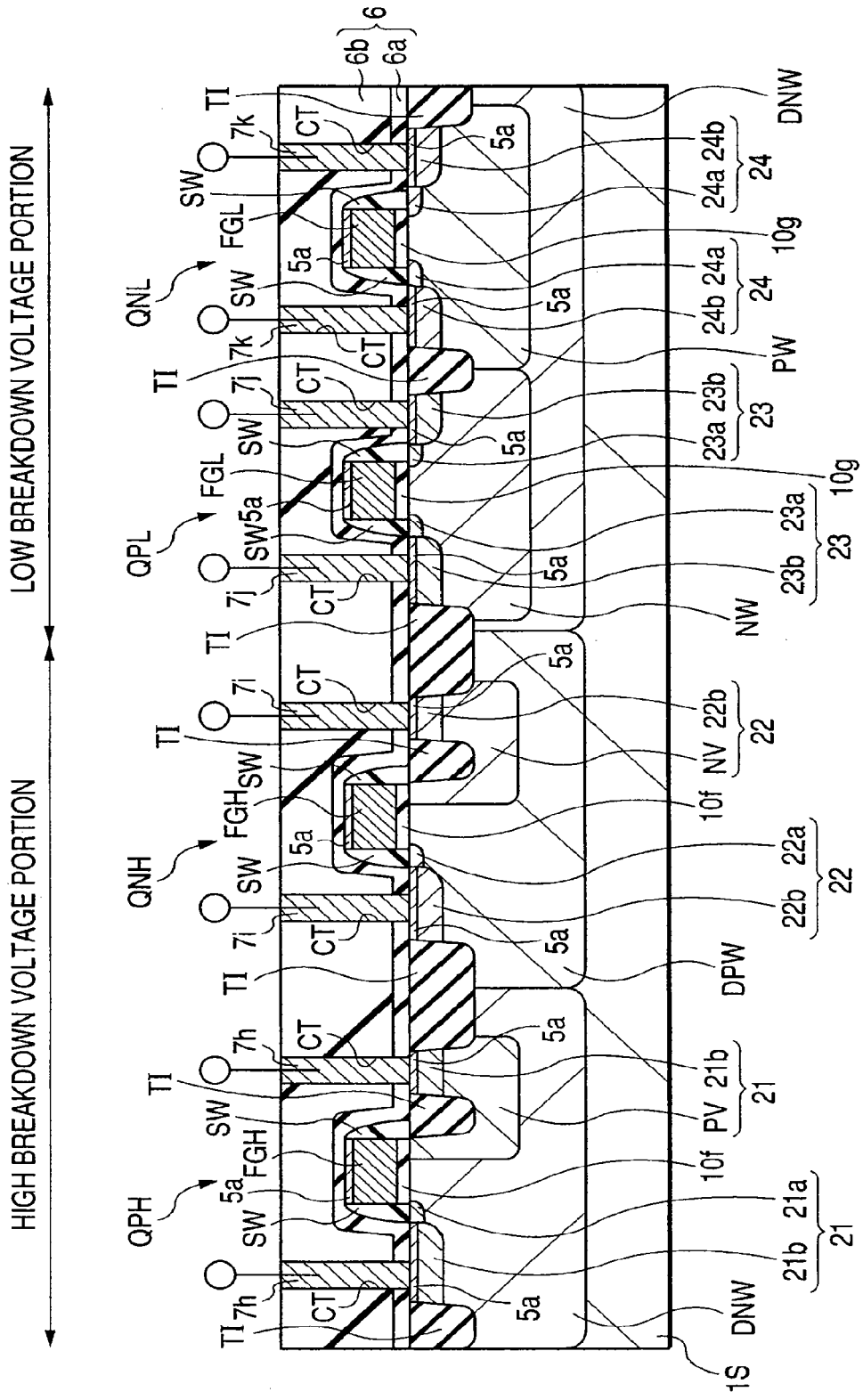
FIG. 32 is a cross-sectional view of a semiconductor substrate in the main circuit formation region of a semiconductor device according to a still further embodiment of the present invention.
Figure 33:
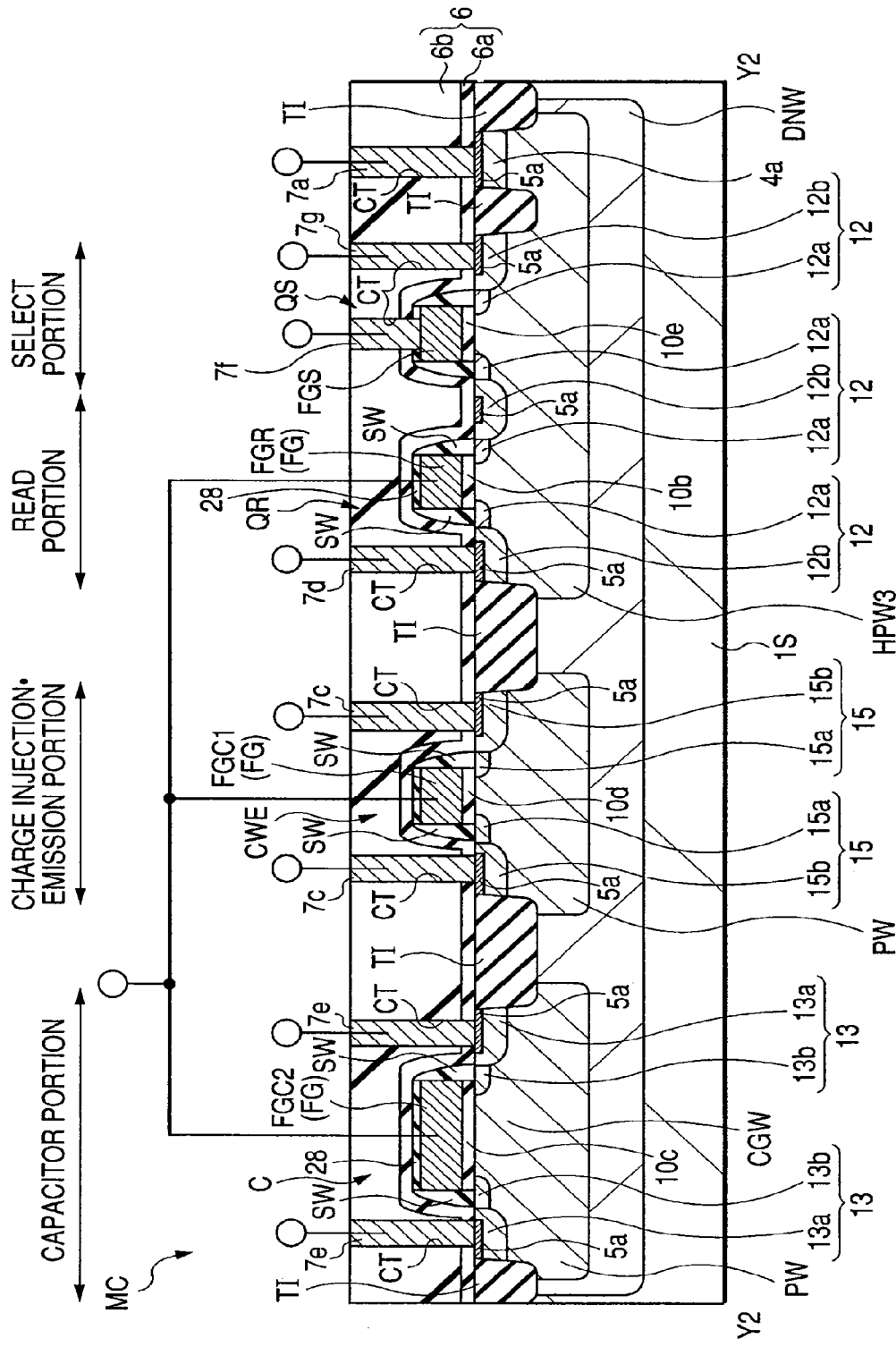
FIG. 33 is a cross-sectional view of a semiconductor substrate in a nonvolatile memory region of the semiconductor of FIG. 32.

FIG. 32 is a fragmentary cross-sectional view of an LCD driver circuit (main circuit) region of a semiconductor device according to Embodiment 4; and FIG. 33 is a fragmentary cross-sectional view of a flash memory region formed on the same substrate 1S illustrated in FIG. 32.

In Embodiment 4, as illustrated in FIGS. 32 and 33, wells of the capacitor portions C and CWE are made of a p well PW which is a well of the formation region of the n channel type MIS•FET QNL in the low-breakdown-voltage portion of the LCD driver circuit region. The p type impurity concentration of this p well PW is adjusted to be higher than that of the p well HPW3. This makes it possible to suppress or prevent the depletion in a portion of the substrate 1S just below the capacitor electrodes FGC1 and FGC2 at the time of data rewriting (programming/erasing) because of an increase in the concentration of the p-type impurity in the portion of the substrate 1S just below the capacitor electrodes FGC1 and FGC2 of the capacitor portions C and CWE. A voltage applied to the capacitor insulating films 10c and 10d can therefore be heightened, whereby the rewriting speed of data can be increased.

Similar to Embodiment 3, such a p well PW in the flash memory region is formed simultaneously with the p well in the formation region of the n channel MIS•FET QNL in the low-breakdown-voltage portion of the LCD driver circuit region. The formation of the p well PW in the memory cell MC therefore does not need an additional manufacturing step. Manufacturing steps other than that are similar to those employed in Embodiment 1. The other advantages are similar to those described in Embodiments 1 and 2 so that description on them is omitted.

Embodiment 5

Figure 34:
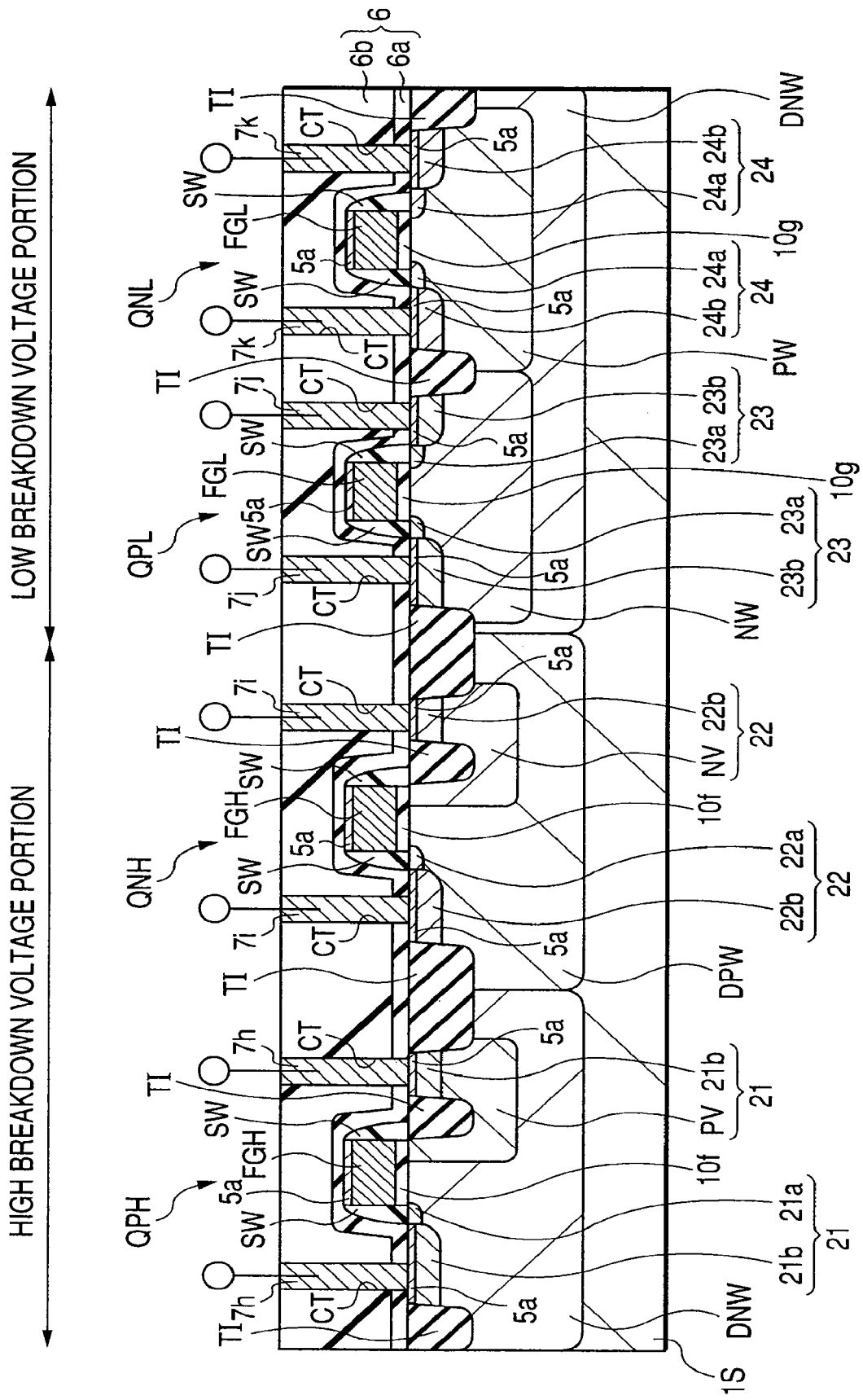
FIG. 34 is a cross-sectional view of a semiconductor substrate in the main circuit formation region of a semiconductor device according to a still further embodiment of the present invention.
Figure 35:
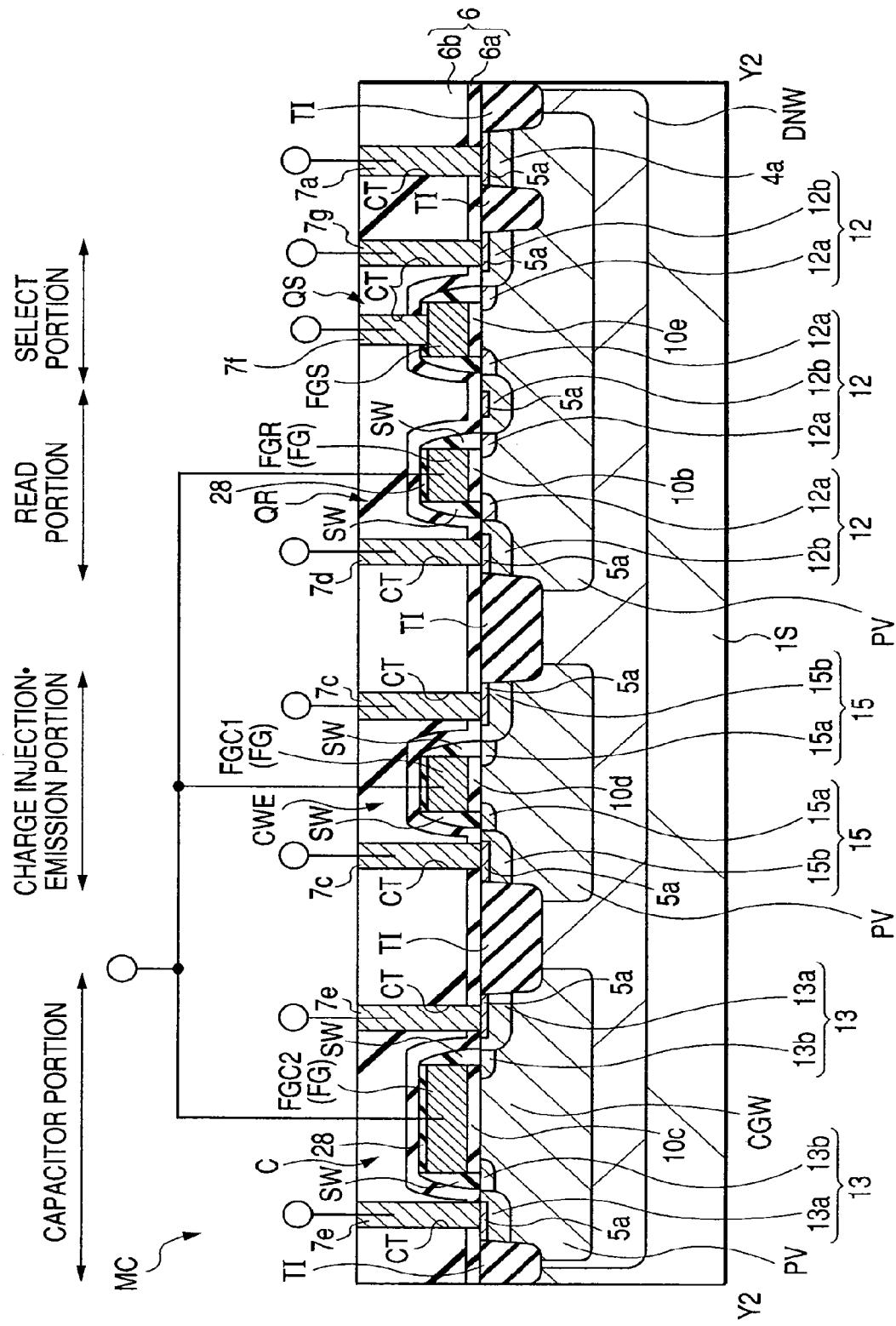
FIG. 35 is a cross-sectional view of a semiconductor substrate in a nonvolatile memory region of the semiconductor device of FIG. 34.

FIG. 34 is a fragmentary cross-sectional view of an LCD driver circuit (main circuit) region of a semiconductor device according to Embodiment 5; and FIG. 35 is a fragmentary cross-sectional view of a flash memory region formed on the same substrate 1S illustrated in FIG. 34.

In Embodiment 5, as illustrated in FIGS. 34 and 35, wells of capacitor portions C and CWE, MIS•FET QR for reading data and select MIS•FET QS are made of a p type semiconductor region PV of the p channel type MIS•FET QPH in the high-breakdown-voltage portion of the LCD driver circuit region. The p type semiconductor region PV constituting the wells of capacitor portions C and CWE, MIS•FET QR for reading data and select MIS•FET QS is formed simultaneously with the p type semiconductor region PV of the p channel type MIS•FET QPH in the high-breakdown-voltage portion of the LCD driver circuit region. Described specifically, after formation of a resist pattern from which the formation regions of the p type semiconductor region PV in the flash memory region and high-breakdown-voltage portion are exposed but by which the other regions are covered, a p type impurity is introduced into the substrate 1S with this resist pattern as a mask. This makes it possible to eliminate the lithography step (a series of treatments including application of resist, exposure and development and a manufacturing step of a photomask to be used upon exposure) for the formation of the p wells HPW1 to HPW3 of the flash memory, leading to a reduction in the manufacturing time of the semiconductor device. In addition, it also contributes to a reduction in the manufacturing cost of the semiconductor device.

Manufacturing steps other than the above-described one are similar to those employed in Embodiment 2. Advantages other than the above-described one are similar to those described in Embodiments 1 and 2 so that description on them is omitted.

Embodiment 6

Figure 36:
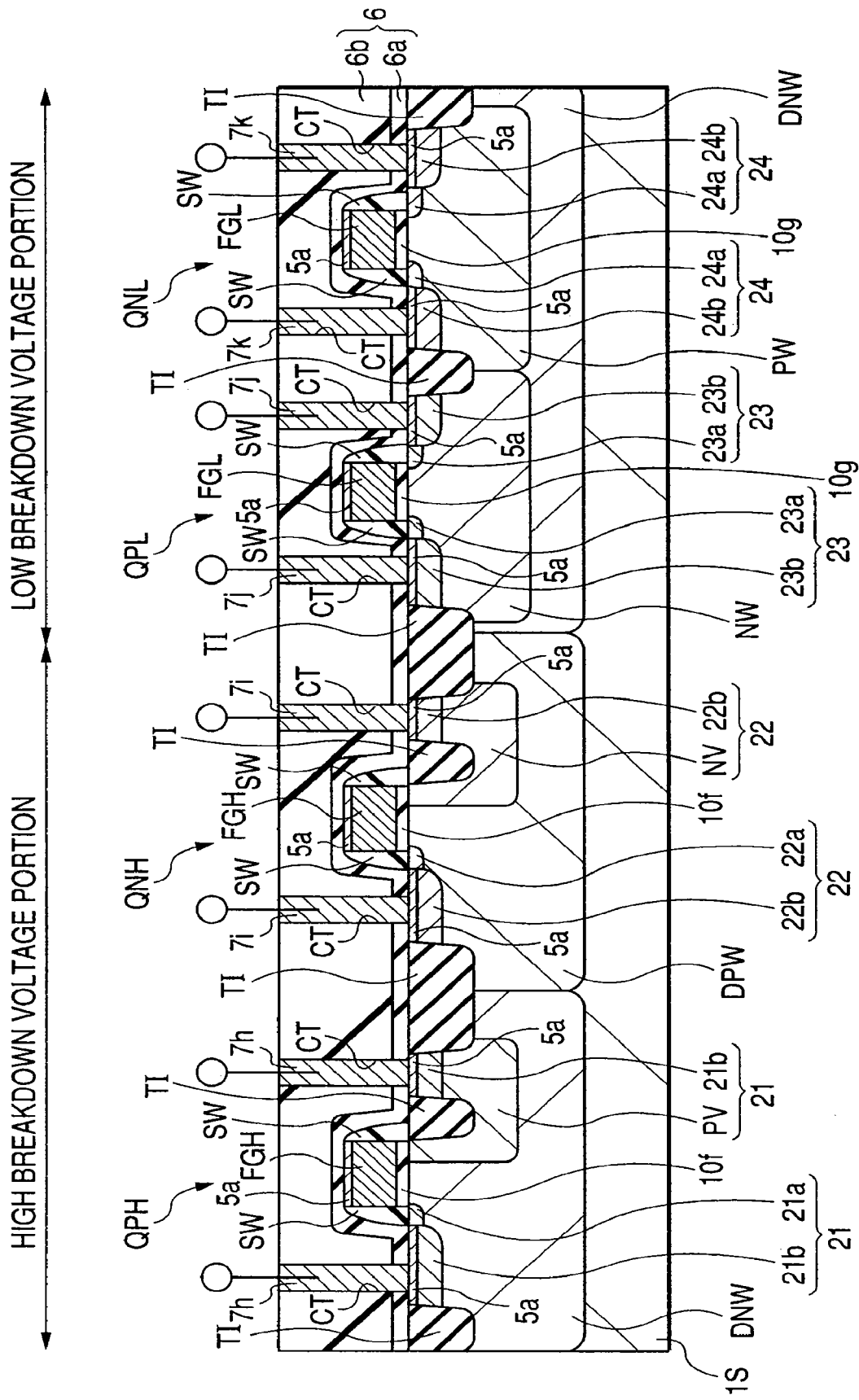
FIG. 36 is a cross-sectional view of a semiconductor substrate in the main circuit formation region of a semiconductor device according to a still further embodiment of the present invention.
Figure 37:
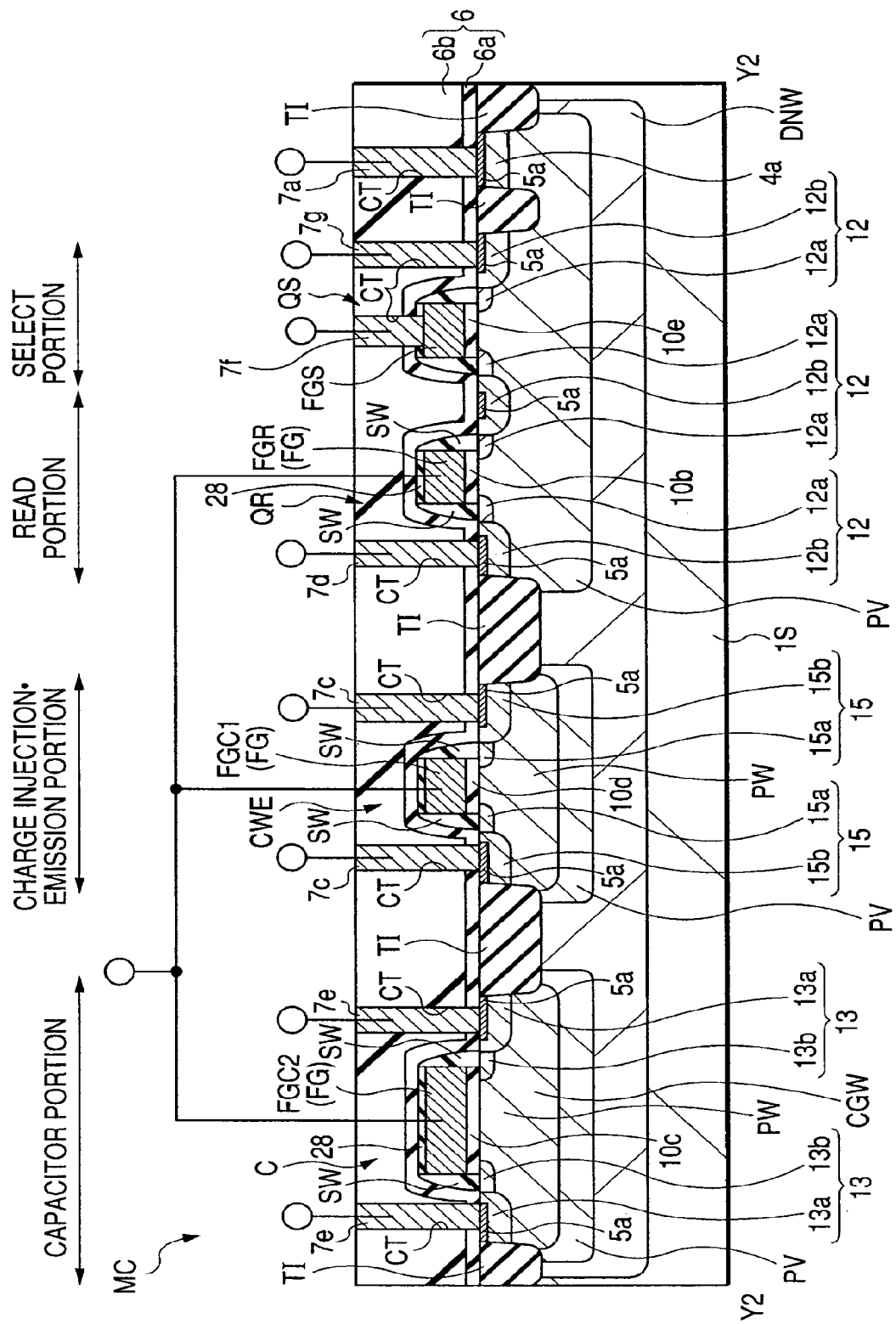
FIG. 37 is a cross-sectional view of a semiconductor substrate in a nonvolatile memory region of the semiconductor device of FIG. 36.

FIG. 36 is a fragmentary cross-sectional view of an LCD driver circuit (main circuit) region of a semiconductor device according to Embodiment 6; and FIG. 37 is a fragmentary cross-sectional view of a flash memory region formed on the same substrate 1S illustrated in FIG. 36.

In Embodiment 6, as illustrated in FIGS. 36 and 37, wells of the capacitor portions C and CWE, MIS•FET QR for reading data and select MIS•FET QS are made of a p type semiconductor region PV of the p channel type MIS•FET QPH in the high-breakdown-voltage portion of the LCD driver circuit region. The p type semiconductor region PV constituting the wells of capacitor portions C and CWE, MIS•FET QR for reading data and select MIS•FET QS is, as described in Embodiment 5, formed simultaneously with a p type semiconductor region PV of the p channel type MIS•FET QPH in the high-breakdown-voltage portion of the LCD driver circuit region. This makes it possible to eliminate the lithography step employed for the formation of the p wells HPW1 to HPW3 of the flash memory as in Embodiment 5, leading to a reduction in the manufacturing time of the semiconductor device. It also contributes to a reduction in the manufacturing cost of the semiconductor device.

In the p type semiconductor region PV constituting the wells of the capacitor portions C and CWE, a p well PW is formed. This increases the concentration of a p type impurity in a portion of the substrate 1S just below the capacitor electrodes FGC1 and FGC2 of the capacitor portions C and CWE, making it possible to suppress or prevent the depletion in the portion of the substrate 1S just below the capacitor electrodes FGC1 and FGC2 at the time of data rewriting (programming/erasing). A voltage to be applied to the capacitor insulating films 10c and 10d can therefore be heightened, whereby the rewriting speed of data can be increased.

The p well PW in the p type semiconductor region PV of the capacitor portions C and CWE in the memory region is formed simultaneously with the p well PW in the formation region of the n channel type MIS•FET QNL in the low-breakdown-voltage portion of the LCD driver circuit region. The formation of the p well PW in the p type semiconductor regions PV in which the wells of the capacitor portions C and CWE are formed however does not need no additional manufacturing step. Manufacturing steps other than the above-described one are similar to those employed in Embodiment 2. Advantages other than the above-described one are similar to those described in Embodiment 1 or 2 so that description on them is omitted.

Embodiment 7

Figure 38:
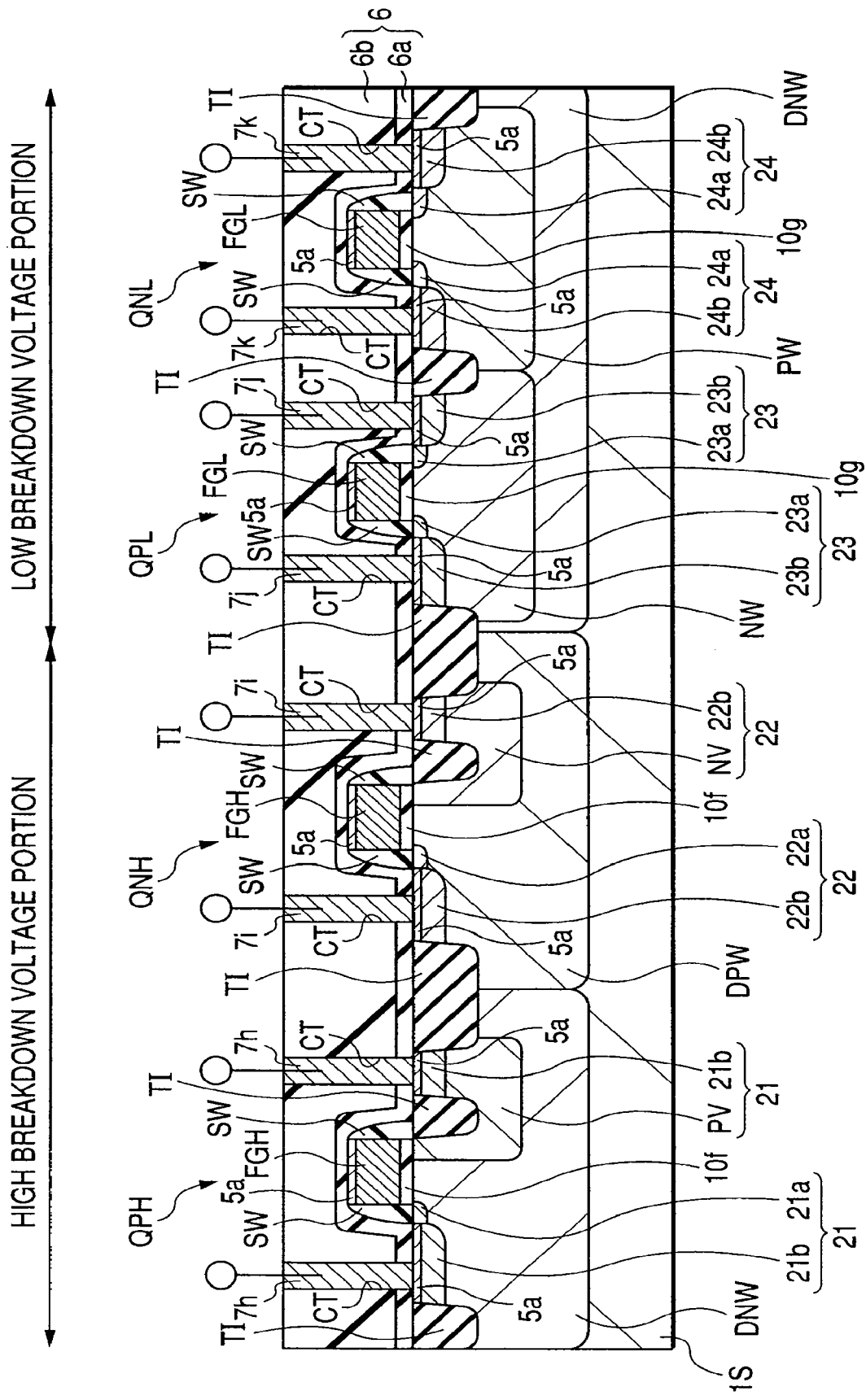
FIG. 38 is a cross-sectional view of a semiconductor substrate in the main circuit formation region of a semiconductor device according to a still further embodiment of the present invention.
Figure 39:
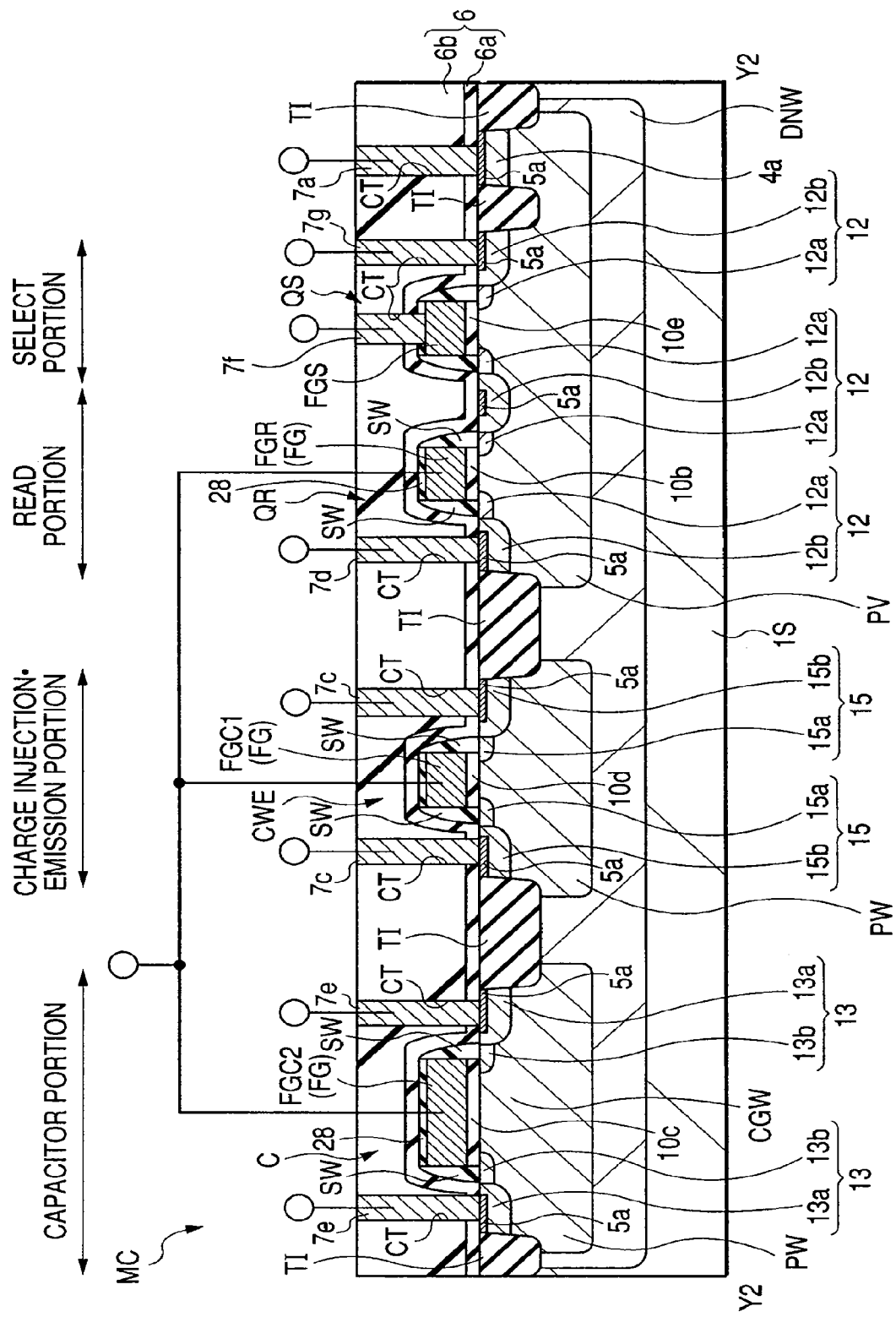
FIG. 39 is a cross-sectional view of a semiconductor substrate in a nonvolatile memory region of the semiconductor device of FIG. 38.

FIG. 38 is a fragmentary cross-sectional view of an LCD driver circuit (main circuit) region of a semiconductor device according to Embodiment 7; and FIG. 39 is a fragmentary cross-sectional view of a flash memory region formed on the same substrate 1S illustrated in FIG. 36.

In Embodiment 7, as illustrated in FIGS. 38 and 39, wells of the capacitor portions C and CWE are made of a p well PW which is a well in the formation region of the n channel type MIS•FET QNL in the low-breakdown-voltage portion of the LCD driver circuit region. The concentration of a p type impurity of this p well PW is adjusted to be higher than that of the p wells HPW1 to HPW3. This increases the concentration of a p type impurity in a portion of the substrate 1S just below the capacitor electrodes FGC1 and FGC2 of the capacitor portions C and CWE, making it possible to suppress or prevent the depletion in the portion of the substrate 1S just below the capacitor electrodes FGC1 and FGC2 at the time of data rewriting (programming/erasing). A voltage to be applied to the capacitor insulating films 10c and 10d can therefore be heightened, whereby the rewriting speed of data can be increased.

Such a p well PW in the flash memory region is formed simultaneously with the p well PW in the formation region of the n channel type MIS•FET QNL in the low-breakdown-voltage portion of the LCD driver circuit region. The formation of the p well PW in the memory cell MC however doe not needs additional manufacturing step.

In Embodiment 7, the wells of the MIS•FET QR for reading data and select MIS•FET QS are made of the p type semiconductor region PV of the p channel MIS•FET QPH in the high-breakdown-voltage portion of the LCD driver circuit region. As in Embodiment 5, the p type semiconductor region PV constituting the well of the MIS•FET QR for reading data and select MIS•FET QS is formed simultaneously with the p type semiconductor region PV of the p channel type MIS•FET QPH in the high-breakdown-voltage portion of the LCD driver circuit region. In Embodiment 7, as in Embodiment 5, the lithography step for the formation of the p wells HPW1 to HPW3 of the flash memory can be omitted so that a manufacturing time of the semiconductor device can be reduced. A manufacturing cost of the semiconductor device can also be reduced.

Manufacturing steps other than the above-described one are similar to those employed in Embodiment 2. Advantages other than the above-described one are similar to those described in Embodiment 1 or 2 so that description on them is omitted.

Embodiment 8

Figure 40:
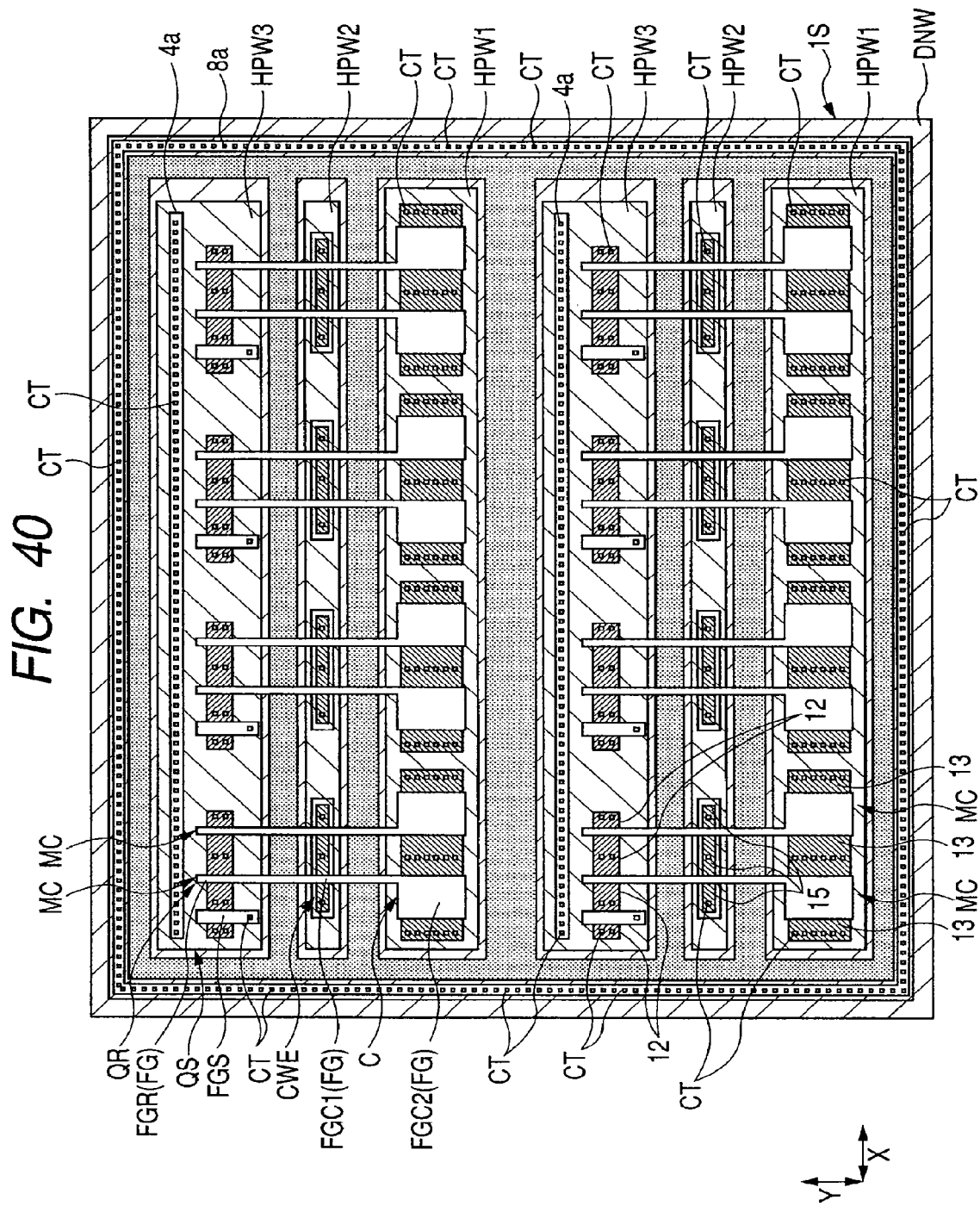
FIG. 40 is a plan view of a nonvolatile memory region of a semiconductor device according to a still further embodiment of the present invention.

FIG. 40 is a fragmentary plane view of a flash memory formation region of a semiconductor device according to Embodiment 8. The cross-sectional constitution of the semiconductor device of Embodiment 8 is similar to that shown in Embodiments 1 to 7 so that its illustration and description are omitted.

In Embodiment 8, in the flash memory region on the main surface (first main surface) of a substrate 1S constituting a semiconductor chip, a plurality of the above-described memory cells having, for example, a 8×2 bit structure are regularly arranged in the array (matrix) form.

P wells HPW1 and HPW2 extend in the second direction X. A capacitor portion C corresponding to a plurality of bits is placed in the p well HPW1. In the p well HPW2, a capacitor portions CWE for programming/erasing data corresponding to a plurality of bits is placed. In a p well HPW3, MIS•FET QR for reading data and select MIS•FET Qs corresponding to a plurality of bits are arranged.

By employing such an array constitution, a region occupied by the flash memory can be reduced so that a value added of the semiconductor device can be improve without increasing the size of a semiconductor chip having a main circuit formed thereon.

Embodiment 9

In Embodiment 9, a case where the above-described select MIS•FET of the memory cell of the flash memory is made of, for example, a relatively low breakdown voltage MIS•FET (which will hereinafter called "a 1.2V-type MIS•FET") whose LCD driver circuit (main circuit) has an operating voltage of 1.2V (or 1.5V) will be described.

In the above-described embodiments, the select MIS•FET QS of the memory cell MC of the flash memory is, similar to the MIS•FET QR for reading data, made of an MIS•FET (which will hereinafter be called a "6V-type MIS•FET") having an operating voltage of 6V primarily because of manufacturing ease.

In the constitution of the flash memory according to this embodiment, on the other hand, a drain voltage applied to the data reading MIS•FET QR of the memory cell MC is, for example, about not greater than 1.0V. In other words, only about 1.0V is applied to the drain of the select MIS•FET QS of the MIS•FET QR for reading data. The gate electrode of the select MIS•FET QS is not connected to the floating gate electrode FG of the memory cell MC so that it has no influence on the charge retention capacity.

Figure 41:
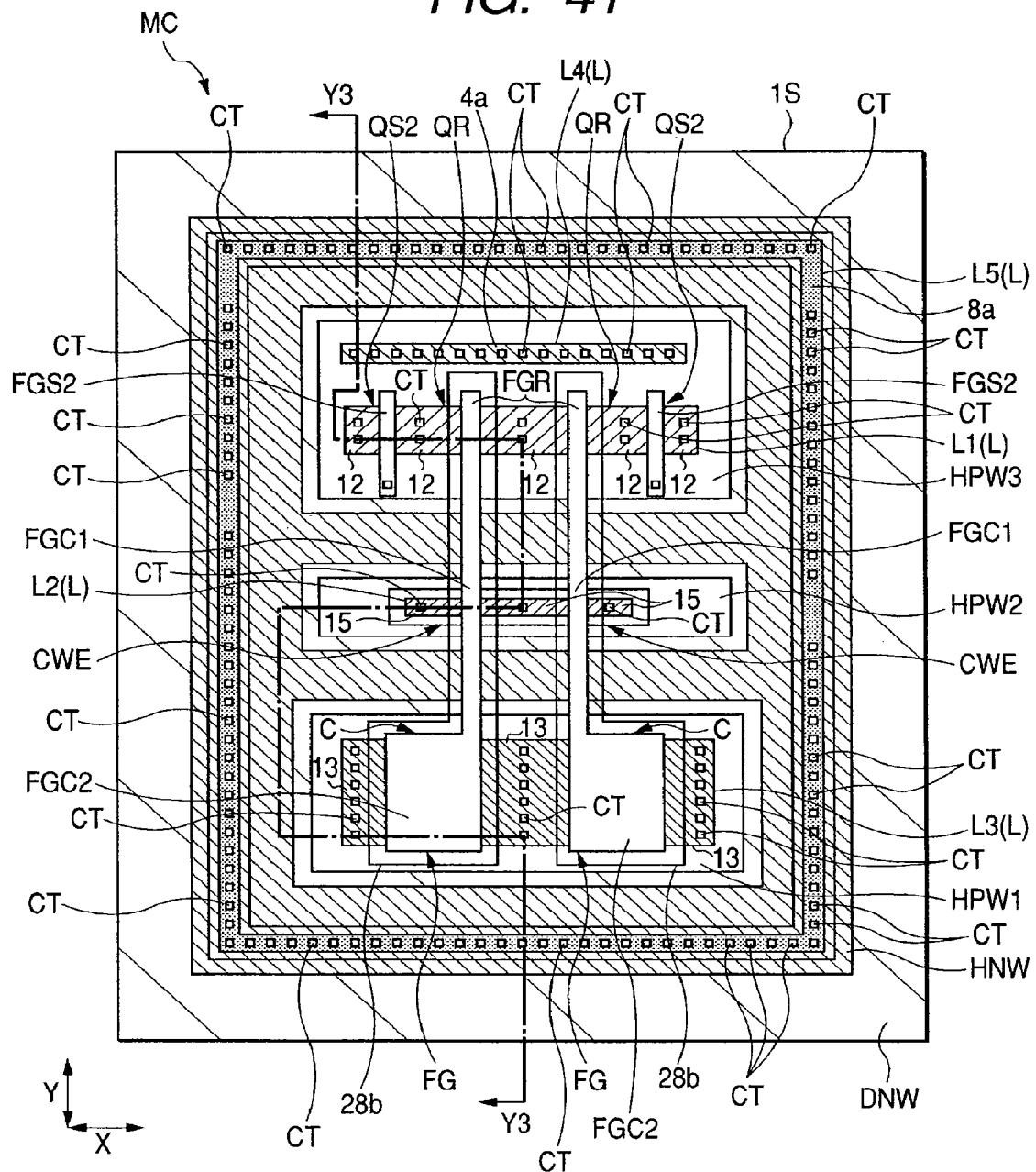
FIG. 41 is a plan view illustrating one example of a memory cell of a flash memory in a semiconductor device according a still further embodiment of the present invention.
Figure 42:
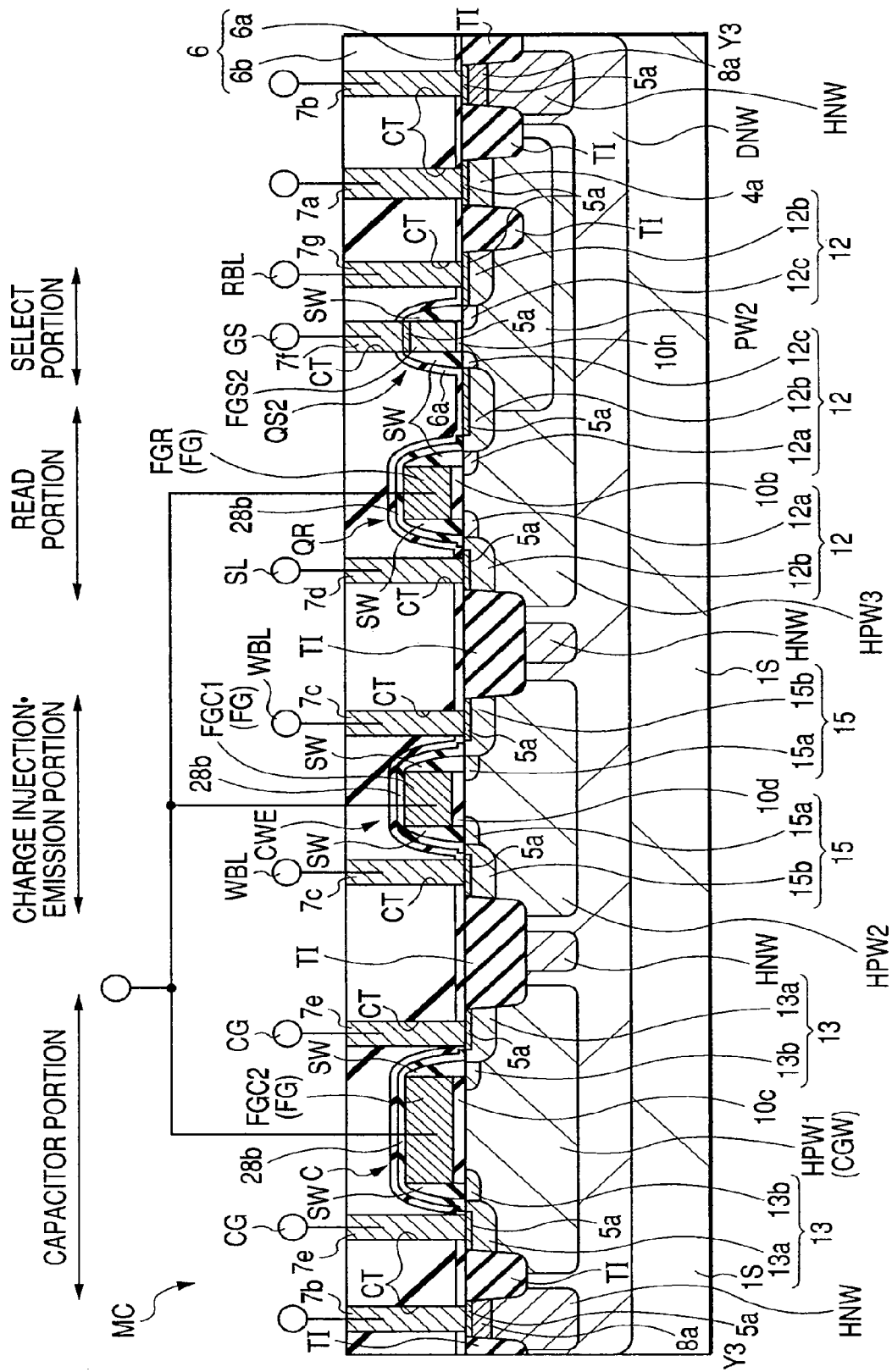
FIG. 42 is a cross-sectional view taken along a line Y3-Y3 of FIG. 41.

In Embodiment 9, as illustrated in FIGS. 41 and 42, the select MIS•FET QS2 of the MIS•FET QR for reading data is made of, for example, the above-described 1.2V-type MIS•FET of the LCD driver circuit.

FIG. 41 is a plan view illustrating one example of the memory cell MC of the flash memory in the semiconductor device according to Embodiment 9; and FIG. 42 is a cross-sectional view taken along Y3-Y3 of FIG. 41. FIG. 41 is partially hatched to facilitate understanding of it.

A p well PW2 is formed in the select portion of the substrate 1S. The p well PW2 of this select portion is encompassed by the p well HPW3 of the memory cell MC. In other words, the p well PW2 is enclosed by the p well HPW3.

The p well PW2 of this select portion is similar to a p well in the 1.2V type MIS•FET arrangement region of the LCD driver circuit. Described specifically, introduction of boron which is a p type impurity into the p well PW2 of the select portion and formation of the p well for 1.2V type MIS•FET of the LCD driver circuit are performed in the same step. The impurity concentration of the p well PW2 is equal to that of the p well for the 1.2V type MIS•FET of the LCD driver circuit.

In this p well PW2, n⁻ type semiconductor regions 12c constituting a pair of n type semiconductor regions 12 and 12 for source and drain of the select MIS•FET QS2 are formed. These n⁻ type semiconductor regions 12c are arranged on both sides of a channel formation region of the select MIS•FET QS2 while sandwiching therebetween the channel formation region. They are electrically connected to n⁺ type semiconductor regions 12b. These n⁻ type semiconductor regions 12c and n⁺ type semiconductor regions 12b contain impurities of the same conductivity type such as phosphorus (P) or arsenic (As), but the impurity concentration of the n⁺ type semiconductor regions is adjusted to be higher than that of the n⁻ type semiconductor regions 12c.

In Embodiment 9, the constitution of the n⁻ type semiconductor regions 12c of the select MIS•FET QS2 is similar to that of the n⁻ type semiconductor regions constituting a pair of semiconductor regions for the source and drain of the 1.2V type MIS•FET of the LCD driver circuit. Described specifically, formation of the n⁻ type semiconductor regions 12c of the select MIS•FET QS2 and formation of the n⁻ type semiconductor regions of the 1.2V type MIS•FET of the LCD driver circuit are carried out by the same step by introducing an n type impurity. The impurity concentration of the n⁻ type semiconductor regions 12c is equal to that of the n⁻ type semiconductor regions for the 1.2V type MIS•FET of the LCD driver circuit.

Over the main surface (channel formation region) of the substrate 1S having the p well PW2 formed thereover, a gate insulating film 10h of the select MIS•FET QS2 is formed. The constitution of the gate insulating film 10h of the select MIS•FET QS2 is similar to that of the gate insulating film of the 1.2V type MIS•FET of the LCD driver circuit. In other words, the gate insulating film of the select MIS•FET QS2 is made of, for example, silicon oxide. The gate insulating film 10h of the select MIS•FET QS2 and the 1.2V type MIS•FET of the LCD driver circuit are formed in the same step. The thickness of the gate insulating film 10h of the select MIS•FET QS2 is therefore equal to that of the gate insulating film of the 1.2V type MIS•FET of the LCD driver circuit. The thickness of the gate insulating film 10h of the select MIS•FET QS2 is however made thinner than the gate insulating film 10e of the select MIS•FET QS2 or the gate insulating film 10b of the MIS•FET QR for reading data by a two-type gate process.

The two-type gate process has, for example, the following steps. A first gate insulating film having a predetermined thickness is formed over the main surfaces of the thick-film portion and thin-film portion of the substrate 1S simultaneously by subjecting the substrate 1S to first thermal oxidation treatment. The first gate insulating film on the thin film portion is selectively removed. While leaving the first gate insulating film on the thick-film portion, the substrate 1S is subjected to second thermal oxidation treatment. By this second thermal oxidation treatment, the gate insulating film on the thin film portion is adjusted to be a desired thickness, whereby a relatively thin gate insulating film is formed on the thin-film portion and at the same time, a relatively thick gate insulating film is formed on the thick-film portion.

The gate insulating film 10h thus formed has a gate electrode FGS2 of the select MIS•FET QS2 formed thereon. The constitution of the gate electrode FGS2 of the select MIS•FET QS2 is similar to that of the gate electrode of the 1.2V type MIS•FET of the LCD driver circuit. Described specifically, the gate electrode FGS2 of the select MIS•FET QS2 is made of, for example, low resistance n⁺ type polycrystalline silicon. The gate electrode FGS2 of the select MIS•FET QS2 and the gate electrode of the 1.2V type MIS•FET of the LCD driver circuit are formed in the same step. The gate length (which is a length of a shorter direction of the gate electrode FGS2 and also a length in the flowing direction of a drain current) Lg of the gate electrode FGS2 of the select MIS•FET QS2 is equal to the gate length Lg (minimum size) of the 1.2V type MIS•FET of the LCD driver circuit and is smaller than the gate length of the select MIS•FET QS2 or the gate length of the MIS•FET QR for reading data.

In Embodiment 9, a cap insulating film 28b is formed so as to cover the upper surface of the floating gate electrodes FG (capacitor electrode FGC, and gate electrodes FGW and FGR), the whole surface of the sidewalls SW and a portion of the main surface of the substrate 1S at the periphery of the side walls.

This cap insulating film 28b is made of, for example, silicon oxide and is formed between the upper surface of the floating gate electrodes FG and the insulating layer 6b so as to prevent direct contact between the insulating layer 6a made of silicon nitride and the upper surface of the floating gate electrodes because of the following reason. When the insulating layer 6a made of silicon nitride is formed by plasma chemical vapor deposition (CVD) or the like, the insulating layer 6a easily becomes a silicon-rich film in the initial stage of the deposition. When the insulating layer 6a is formed in direct contact with the upper surface of the floating gate electrodes FG, charges in the floating gate electrodes FG flow to the side of the substrate 1S via the silicon-rich portion of the insulating layer 6a and are sometimes released via a plug, resulting in deterioration in the data retention properties of the flash memory. The cap insulating film is formed in order to suppress or prevent such an inconvenience.

This cap insulating film 28b is also formed over a resistor element (not illustrated) disposed in the other region of the semiconductor substrate 1S. This resistor element can be formed simultaneously by the step of forming the above-described capacitor electrode FGC and gate electrodes FGW, FGR, FGS and FGS2. It is made of a polycrystalline silicon film. Formation of the cap insulating film 28b over such a resistor element makes it possible to form, over the resistor element, a region in which a silicide layer 5a is formed or a region in which the layer is not formed, selectively, whereby a resistor element having a desired resistance value can be formed.

In this Embodiment, by using the cap insulating film 28b, an insulating film for selectively forming the silicide layer 5a over the resistor element and an insulating film to be disposed between the upper surface of the floating gate electrodes and the insulating layer 6a are formed in one step. It is not necessary to form these insulating films by separate steps so that manufacturing steps can be simplified.

In Embodiment 9, by forming the cap insulating film 28b between the upper surface of the floating gate electrodes FG and the insulating layer 6b, emission of charges as described above can be suppressed or prevented, leading to improvement of data retention properties of the flash memory.

The silicide layer 6a is formed after the patterning of the cap insulating film 28b. The silicide layer 5a is therefore formed over the main surface ($p^+$ type semiconductor regions 13a and 15b, and $n^+$ type semiconductor region 12b) but not formed over the floating gate electrodes FG.

According to Embodiment 9, the below-described advantages as well as advantages obtained by the above-described embodiments are therefore available.

Since the gate length of the select MIS•FET QS2 is smaller than the gate length of the select MIS•FET QS and the thickness of the gate insulating film 10h is smaller than that of the gate insulating film 10e of the select MIS•FET QS, a greater current (drain current 1ds) can be obtained when the device is driven at a same voltage. This enables to increase a readout current of data so that the margin of the circuit can be enlarged.

In addition, an area occupied by the select MIS•FET QS2 can be reduced so that an area occupied by the flash memory can also be reduced. Particularly when plural memory cells MC are arranged in the array form, the area occupied by the flash memory can be reduced.

Embodiment 10

In Embodiment 10, a constitution for suppressing or preventing the formation of a depletion layer in the substrate 1S at the time of erasing or programming data by a flash memory.

Figure 43:
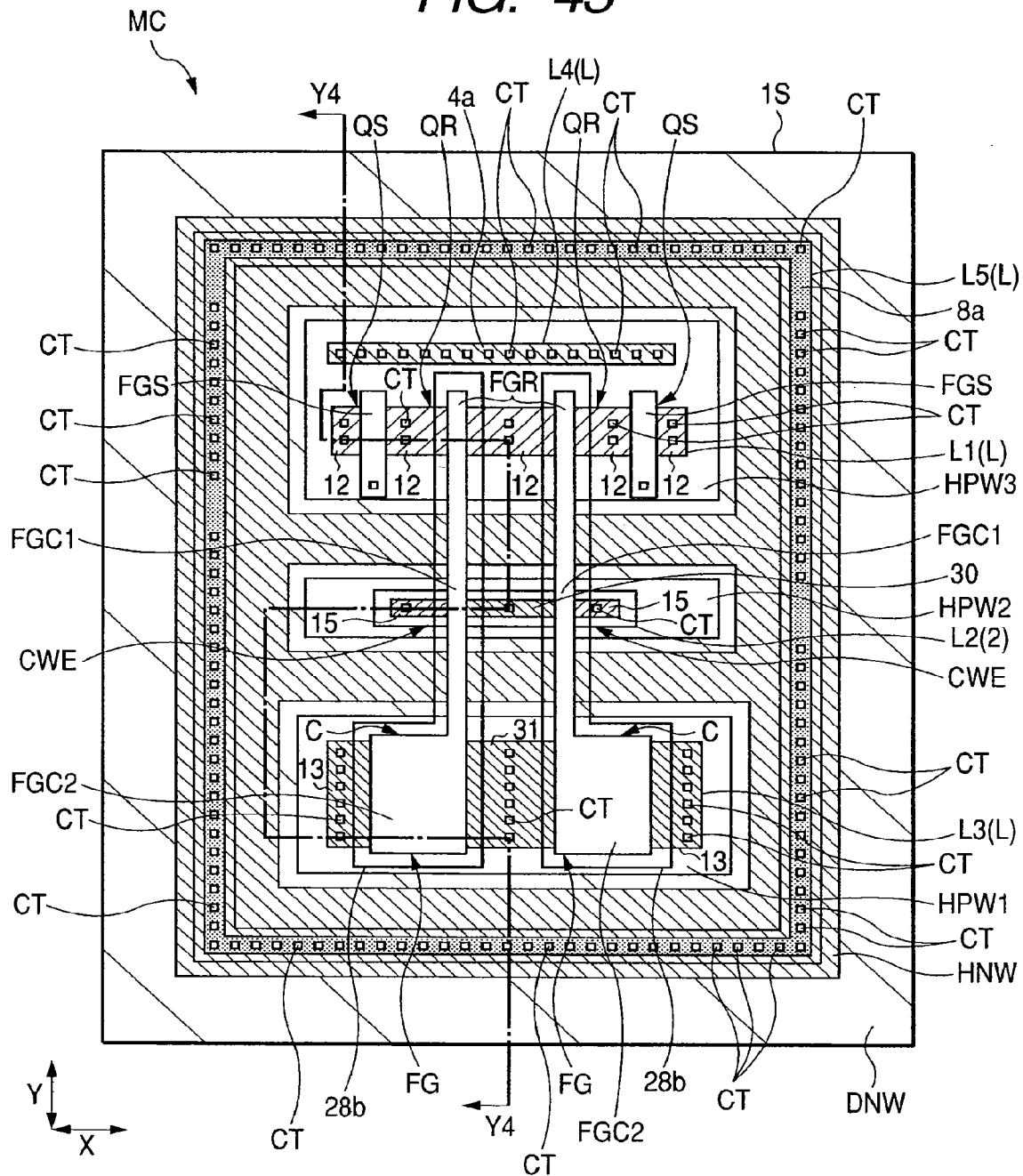
FIG. 43 is a plan view illustrating one example of a memory cell of a flash memory in a semiconductor device according a still further embodiment of the present invention.
Figure 44:
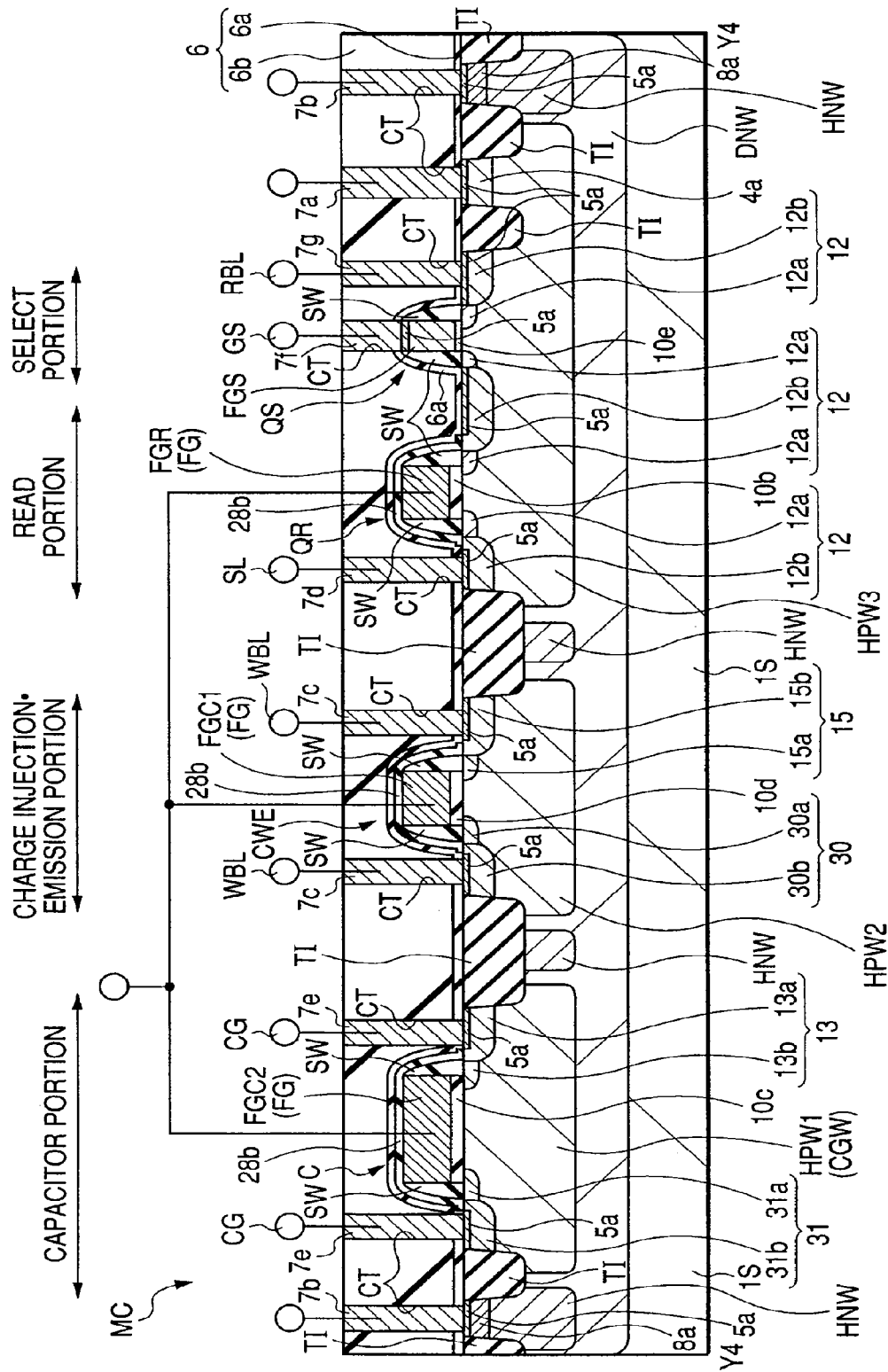
FIG. 44 is a cross-sectional view taken along a line Y4-Y4 of FIG. 43.

FIG. 43 is a plan view illustrating one example of a memory cell MC of a flash memory in a semiconductor device according to Embodiment 10; and FIG. 44 is a cross-sectional view taken along the line Y4-Y4 of FIG. 43. FIG. 43 is partially hatched to facilitate understanding of it.

In Embodiment 10, semiconductor regions having different conductivity types, that is, p type semiconductor region 15 and n type semiconductor region 30 are formed in the capacitor portion CWE for programming/erasing data. In other words, in the capacitor portion CWE for programming/erasing data, the conductivity types on both sides of the capacitor electrode FGC1 are asymmetric.

The n type semiconductor region 30 has an $n^-$ type semiconductor region 30a and $n^+$ type semiconductor region 30b which are electrically connected to each other. The $n^-$ type semiconductor region 30a starts from one end of the capacitor electrode FGC1, extends along the main surface of the substrate 1S and ends after having a length corresponding to the width of the sidewall SW. The $n^+$ type semiconductor region 30b, on the other hand, partially overlaps with the semiconductor region 30a at the end thereof, extends along the main surface of the substrate 1S from the overlapped position and ends at the isolation portion TI after having a desired length.

The $n^-$ type semiconductor region 30a and $n^+$ type semiconductor region 30b contain impurities of the same conductivity type such as phosphorus (P) or arsenic (As), but the impurity concentration in the $n^+$ type semiconductor region 30b is adjusted to be higher than that in the $n^-$ type semiconductor region 30a.

In Embodiment 10, the n type semiconductor region 30 is formed, as illustrated in FIG. 43, between two floating gate electrodes which are adjacent to each other. In other words, the n type semiconductor region 30 becomes a common region for two capacitor portions CWE for programming/erasing data.

In Embodiment 10, semiconductor regions having different conductivity types, that is, p type semiconductor region 13 and n type semiconductor region 31 are formed in the capacitor portion C. In other words, the conductivity types of the two semiconductor regions on both sides of the capacitor electrode FGC2 are asymmetric in the capacitor portion C.

The n type semiconductor region 31 has an $n^-$ type semiconductor region 31a and an $n^+$ type semiconductor region 31b which are electrically connected to each other. The $n^-$ type semiconductor region 31a starts from one end of the capacitor electrode FGC2, extends along the main surface of the substrate 1S and ends after having a length corresponding to the width of the sidewall SW. The $n^+$ type semiconductor region 31b, on the other hand, partially overlaps with the semiconductor region 31a at the end thereof, extends along the main surface of the substrate 1S from the overlapped position and ends at the isolation portion TI after having a desired length.

The n⁻ type semiconductor region 31a and n⁺ type semiconductor region 31b contain impurities of the same conductivity type such as phosphorus (P) or arsenic (As), but the impurity concentration in the n⁺ type semiconductor region 31b is adjusted to be higher than that in the n⁻ type semiconductor region 31a.

In Embodiment 10, the n type semiconductor region 31 is formed, as illustrated in FIG. 43, between two floating gate electrodes which are adjacent to each other. This means that the n type semiconductor region 31 becomes a common region for two capacitor portions C.

The above-described n⁻ type semiconductor regions 30a and 31a are formed simultaneously when the n⁻ type semiconductor regions 12a of the MIS•FET QR for reading data and select MIS•FET QS are formed. The above-described n⁺ type semiconductor regions 30b and 31b are formed simultaneously when the n⁺ type semiconductor region 12b of the MIS•FET QR for reading data and select MIS•FET QS are formed.

The reason for adopting such a constitution will next be described referring to FIGS. 45 to 48. In FIGS. 45 to 48, indicated by 35, 36 and e- are an inversion layer, a depletion layer and electron, respectively.

Figure 45:
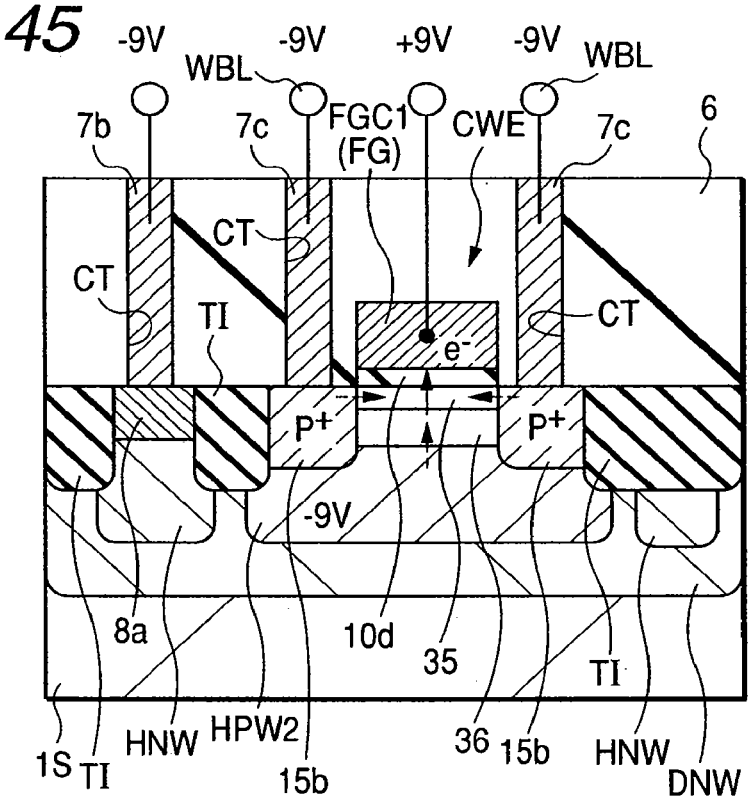
FIG. 45 is a cross-sectional view illustrating a semiconductor substrate in a charge injection/emission portion of a memory cell of a semiconductor device according to the embodiment of the present invention.

First, a charge injection/emission portion will be described. FIG. 45 is a cross-sectional view of the charge injection/emission portion of the memory cell MC of the above-described Embodiment along the second direction X of the substrate 1S. Upon programming data, a negative voltage of, for example, -9V is applied to the p well HPW2 in the charge injection/emission portion, whereby a depletion layer 36 is formed just below the capacitor insulating film 10d. This results in a reduction in the coupling capacity. It is presumed that injection efficiency lowers because electrons to be injected are also depleted. Accordingly, the data programming speed decreases and the data programming speed becomes unstable.

Figure 46:
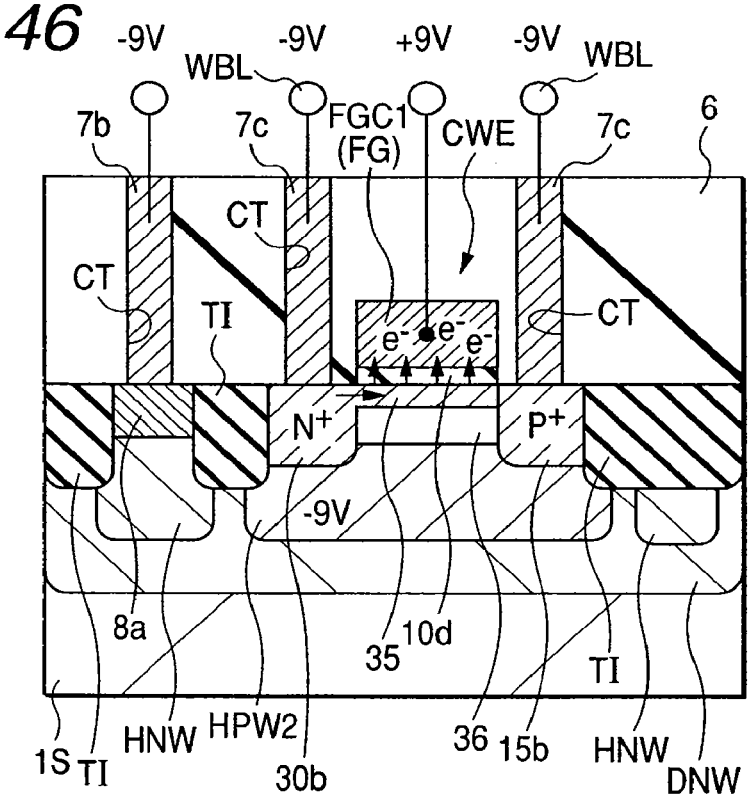
FIG. 46 is a cross-sectional view illustrating a semiconductor substrate in a charge injection/emission portion of the memory cell of the semiconductor device according to the still further embodiment of the present invention.

FIG. 46 is a cross-sectional view of the charge injection/emission portion of the memory cell MC of Embodiment 10 along the second direction X of the substrate 1S. Addition of the n⁺ semiconductor region 30b as described above contributes to the promotion of the formation of an inversion layer 35. Electrons are minority carriers in a p type semiconductor, while they are majority carriers in an n type semiconductor. Disposal of the n⁺ type semiconductor region 30b facilitates supply of injected electrons to the inversion layer 35 just below the capacitor electrode FGC1. As a result, an effective coupling capacity can be increased and the potential of the capacitor electrode FGC1 (floating gate electrode FG) can be controlled efficiently. Accordingly, the programming speed of data can be improved and in addition, the data programming speed can be made stable.

Figure 47:
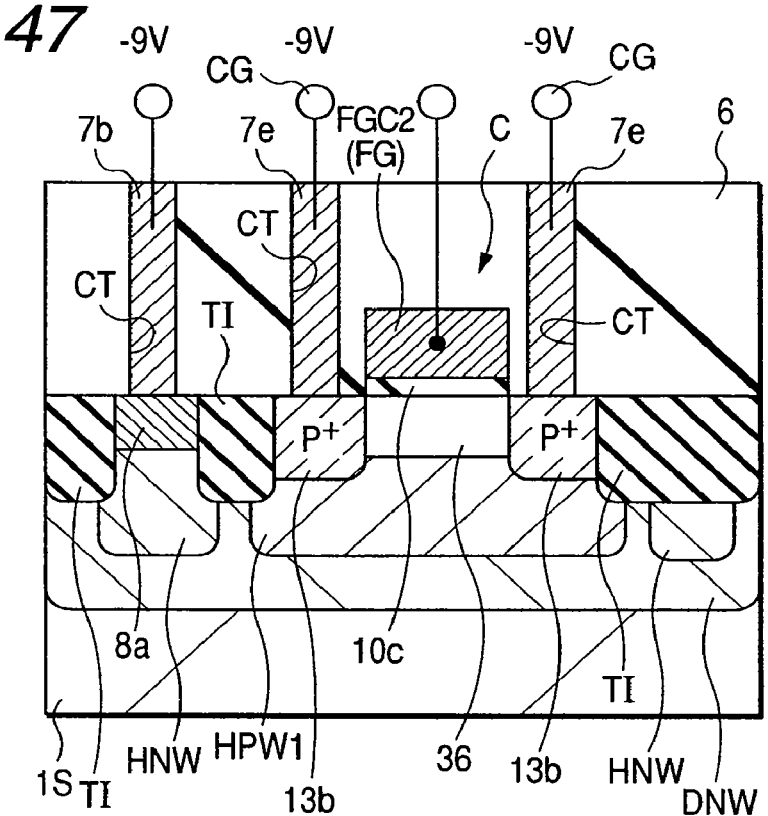
FIG. 47 is a cross-sectional view illustrating a semiconductor substrate in a capacitor portion of the memory cell of the semiconductor device according to the embodiment of the present invention.

The capacitor portion will next be described. FIG. 47 is a cross-sectional view of the capacitor portion of the memory cell MC of the above-described embodiment along the second direction X of the substrate 1S. Upon data erasing, a negative voltage of, for example, about -9V is applied to the p well HPW1 of the capacitor portion so that a depletion layer 36 is formed just below the capacitor insulating film 10c. As a result, a substantial reduction in coupling capacity occurs and erasing speed of the data decreases. In addition, the erasing speed of data becomes unstable.

Figure 48:
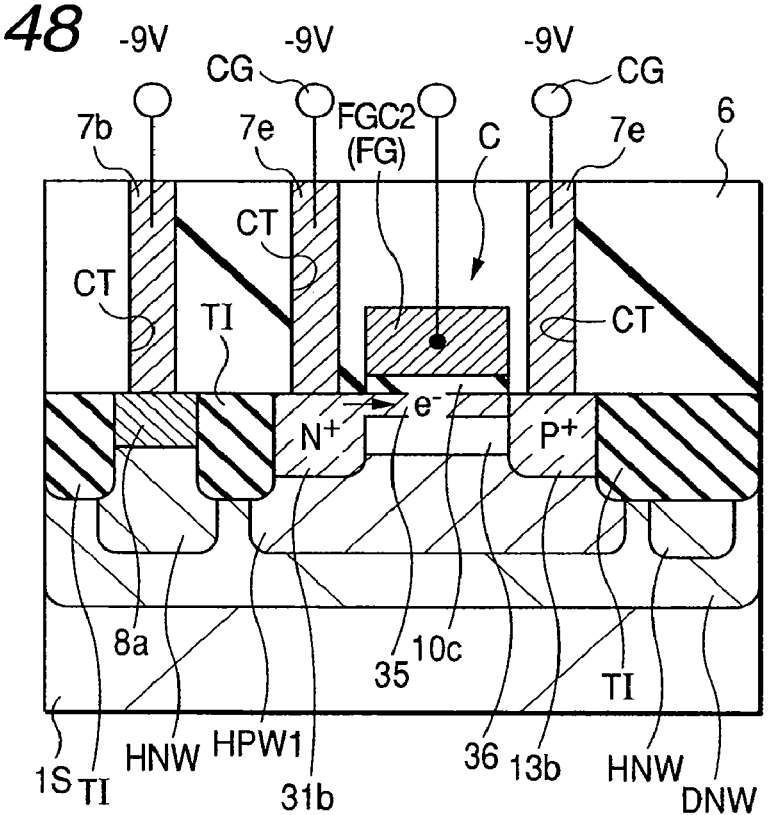
FIG. 48 is a cross-sectional view illustrating a semiconductor substrate in a capacitor portion of the memory cell in the semiconductor device according to the still further embodiment of the present invention.

FIG. 48 is a cross-sectional view of the capacitor portion of the memory cell MC of Embodiment 10 along the second direction X of the substrate 1S. Additional formation of the n⁺ type semiconductor region 31b as described above enables smooth supply of electrons to just below the capacitor insulating film 10c. This enables prompt formation of the inversion layer 35 so that the p well HPW1 can be fixed to -9V promptly. As a result, an effective coupling capacity can be increased and the potential of the capacitor electrode FGC2 (floating gate electrode FG) can therefore be controlled efficiently. Accordingly, the data erasing speed can be improved and in addition, the data erasing speed can be made stable.

According to Embodiment 10, programming speed and erasing speed of data can be improved by the disposal of both the p⁺ type semiconductor regions 15b and 13b and n⁺ semiconductor regions 30b, 31b in the charge injection/emission portion and capacitor portion, because in the charge injection/emission portion, the n⁺ semiconductor region 30b serves as a supply source of electrons at the time of charge injection, while in the capacitor portion, the n⁺ type semiconductor region 31b serves as a supply source of electrons to the inversion layer.

Figure 49:
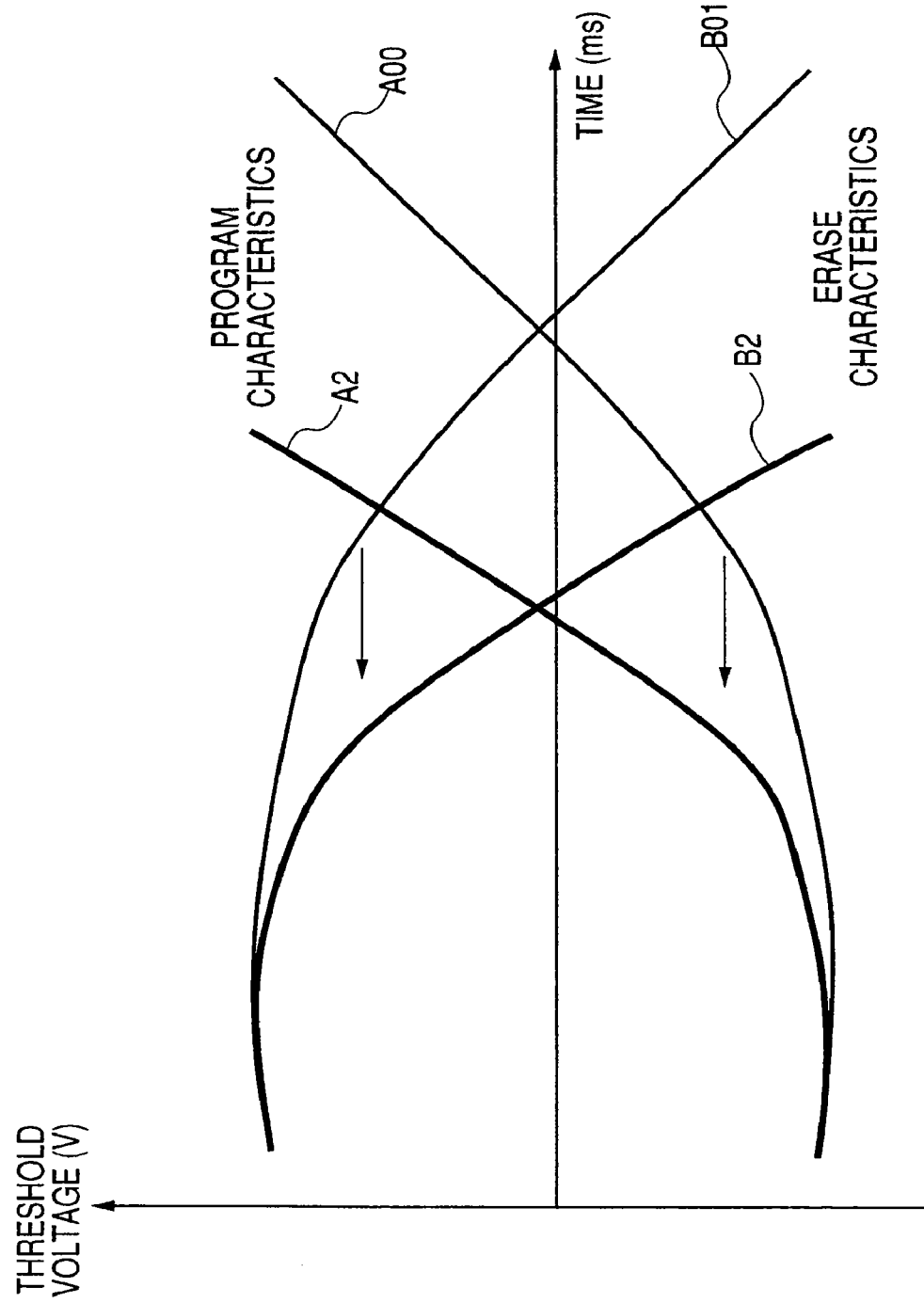
FIG. 49 is a graph showing comparison of data program-erase characteristics of the semiconductor devices according to the embodiment of the present invention and the still further embodiment of the present invention.
Figure 50:
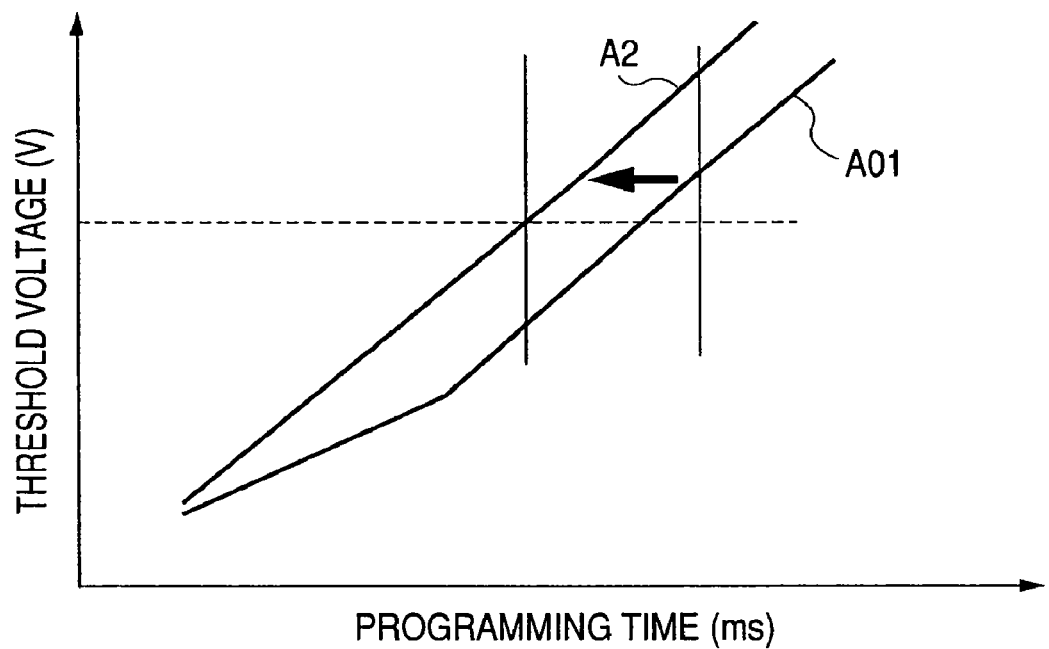
FIG. 50 is a graph showing comparison of data program characteristics of the semiconductor devices according to the embodiment of the present invention and the still further embodiment of the present invention.
Figure 51:
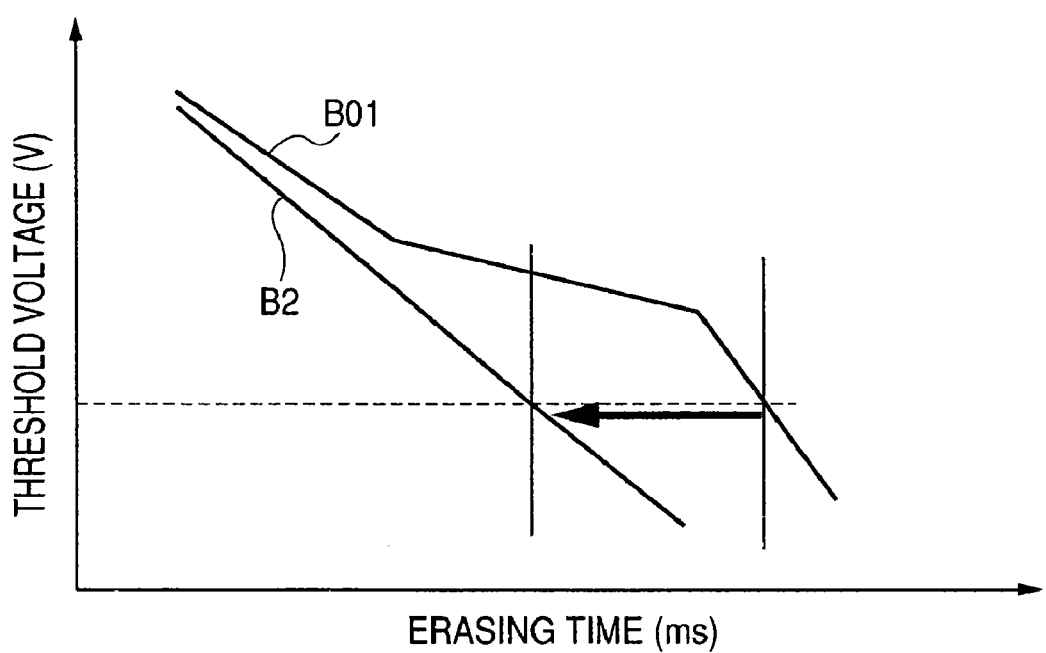
FIG. 51 is a graph showing comparison of data erase characteristics of the semiconductor devices according to the embodiment of the present invention and the still further embodiment of the present invention.

FIG. 49 is a graph showing the comparison of data programming/erasing characteristics between Embodiment 10 and the above-described embodiment. FIG. 50 illustrates only the data programming characteristics, while FIG. 51 illustrates only the data erasing characteristics.

Solid lines A2 and B2 show data programming characteristics and data erasing characteristics of Embodiment 10, respectively, while solid lines A01 and B01 show data programming characteristics and data erasing characteristics, respectively, when not n⁺ semiconductor regions 30b and 31 but only p⁺ type semiconductor regions 15b and 13b are formed.

According to Embodiment 10, data programming time can be reduced by 1.5 figures, while the data erasing time can be reduced by 2 figures.

In the above description, both the p⁺ type semiconductor regions 15b and 13b and n⁺ type semiconductor regions 30b and 31b are disposed in each of the charge injection/emission portion and capacitor portion. The present invention is however not limited to such a case.

When only the data erasing speed is increased, both the p type semiconductor region 13 (p⁺ type semiconductor region 13b) and n type semiconductor region 31 (n⁺ type semiconductor region 31b) may be disposed in the capacitor portion, while only the p type semiconductor region 15 (p⁺ type semiconductor region 15b) may be disposed in the charge injection/emission portion.

When only the data programming speed is increased, on the other hand, both the p type semiconductor region 15 (p⁺ type semiconductor region 15b) and n type semiconductor region 30 (n⁺ type semiconductor region 30b) may be disposed in the charge injection/emission portion, while only the p type semiconductor region 13 (p⁺ type semiconductor region 13b) may be disposed in the capacitor portion.

The constitution as described in Embodiment 10 may be used in combination with the constitution as described in Embodiment 3 from the viewpoint of suppression or prevention of depletion in the substrate 1S. In other words, also in this Embodiment 10, the p well PW may be disposed in the p wells HPW1 and HPW2 in the capacitor portions C and CWE.

One example of the formation method of the n type semiconductor regions 30 and 31 will next be described referring to FIGS. 52 to 54.

Figure 52:
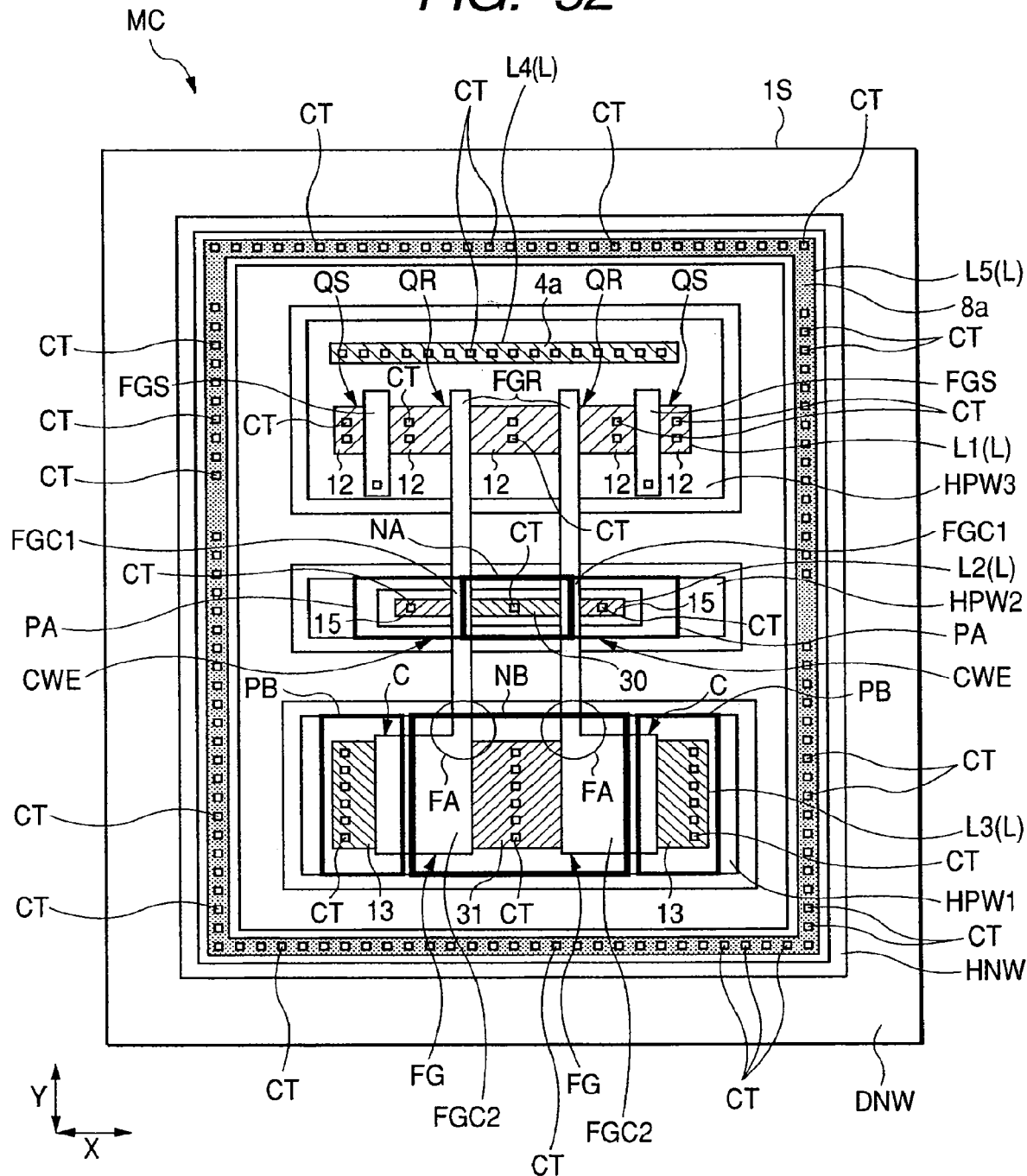
FIG. 52 is a plan view of a memory cell formation region over the main surface of a semiconductor substrate during a manufacturing step of a semiconductor device according to the still further embodiment of the present invention.

FIG. 52 is a plan view of a memory cell MC of the flash memory of the semiconductor device according to Embodiment 10, in which illustrated is a mask to be used when n type semiconductor regions 30 and 31 and p type semiconductor regions 13 and 15 are formed in the memory cell MC.

Opening portions NA and NB as illustrated in FIG. 52 are each an opening portion with a square plane formed in a first resist film (mask) deposited over the main surface of a substrate 1S (a thin semiconductor disc which is called "wafer" in this stage) during a manufacturing step of the semiconductor device of Embodiment 10. These opening portions NA and NB serve as regions for introducing an n type impurity for the formation of the n type semiconductor regions 30 and 31.

Two opening portions PA and two opening portions PB are opening portions with a square plane formed in a second resist film (mask) deposited over the main surface of the substrate 1S (the wafer in this stage) during a manufacturing step of the semiconductor device of Embodiment 10. These opening portions PA and PB serve as regions for introducing a p type impurity for the formation of the p type semiconductor regions 15 and 13.

The first resist film and the second resist film are respective films obtained separately by application, but in order to show the relative planar positional relationship among the opening portions NA, NB, PA and PB, they are shown in one diagram.

The opening portion NA to be disposed in the charge injection/emission portion is placed between two capacitor electrodes FGC1 (floating gate electrodes FG) which are adjacent to each other while overlapping, at both ends in the second direction X, with a portion of the two adjacent capacitor electrodes FGC1 (floating gate electrodes FG).

This opening portion NA is disposed to enclose therein a portion of the active region L2 between the two adjacent capacitor electrodes FGC1. The length of the opening portion NA in the second direction X extends from the center of one of the two adjacent capacitor electrodes FGC1 in the second direction X (shorter direction) to the center of the other capacitor electrode FGC1 in the second direction X (shorter direction). The length of the opening portion NA in the first direction Y substantially coincides with the length of the p well HPW2 in the first direction Y.

From the opening portion NA, the whole portion of the active region L2 between the two adjacent capacitor electrodes FGC1 and a half portion of each of the two capacitor electrodes FGC1 in the second direction X (shorter direction) are exposed.

Each of the two opening portions PA in the charge injection/emission portion are disposed so that one end of the opening portion in the second direction X partially overlaps with a portion of each of the two adjacent capacitor electrodes FGC1 (floating gate electrode FG). One end of each of these two opening portions PA in the second direction X ends at the center of each of the two adjacent capacitor electrodes FGC1 in the second direction X (shorter direction) so that from each of the two opening portions PA, the formation region (active region L2) of the p type semiconductor region 15 and in addition, a half portion of the two capacitor electrodes FGC1 in the second direction X (shorter direction) are exposed.

In each of the two capacitor electrodes FGC1 which are adjacent to each other, an n type semiconductor region formed by the introduction of an n type impurity from the opening portion NA and a p type semiconductor region formed by the introduction of a p type impurity from the opening portion PA are formed along the second direction X (shorter direction), with equal width.

The junction surface (barrier surface) between the n type semiconductor region and the p type semiconductor region of this capacitor electrode FCC1 is however formed so that it does not cross the longer direction (first direction Y) of the floating gate electrode FG. In other words, the junction surface between the n type semiconductor region and the p type semiconductor region of this capacitor electrode FGC1 is placed so that it extends along the longer direction (the first direction Y) of the floating gate electrode FG.

If the junction surface between the n type semiconductor region and the p type semiconductor region of this capacitor electrode FGC1 crosses the longer direction (the first direction Y) of the floating gate electrode FG, its pn junction surface crosses the potential supply direction, which deteriorates the transmission of the potential, resulting in deterioration of data program/erase characteristics or read characteristics.

When a silicide layer is formed over the upper surface of the floating gate electrode FG, the potential can be supplied via the silicide layer even if the pn junction surface is formed so as to cross the longer direction of the capacitor electrode FGC1. In Embodiment 10, on the other hand, no silicide layer is formed over the floating gate electrode FG so that the pn junction surface formed so as to cross the longer direction of the capacitor electrode FGC1 tends to cause deterioration of potential transmission. It is therefore preferred in Embodiment 10 that the pn junction surface, particularly that formed in the capacitor electrode FGC1, is disposed so as not to cross the longer direction of the capacitor electrode FGC1.

The floating gate electrode FG is made of $n^+$ type polycrystalline silicon as described above before the impurity introduction step from the opening portions NA and PA.

The opening portion NB disposed in the capacitor portion is placed between two capacitor electrodes FGC2 (floating gate electrodes FG) which are adjacent to each other while it overlaps partially with the two adjacent capacitor electrodes FGC2 (floating gate electrodes FG).

This opening portion NB is placed to enclose therein a portion of an active region L3 lying between the two adjacent capacitor electrodes FGC2. The opening portion NB extends, in the second direction X (shorter direction), from a desired position of one of the two adjacent capacitor electrodes in the second direction (X) to a desired position of the other capacitor electrode FGC2 in the second direction X (shorter direction). The length of the opening portion NB in the first direction Y is substantially equal to that of the p well HPW1 in the first direction Y.

From the opening portion NB, the whole of the portion of the active region L3 lying between the two adjacent capacitor electrodes FGC2 and a more than half portion of each of the two capacitor electrodes FGC2 are exposed. A neck portion FA (constricted portion, a boundary between the wide portion (capacitor electrode FGC2) and narrow portion of the floating gate electrode FG) is also exposed from the opening portion NB.

Each of the two opening portions PB in the capacitor portion is placed so that one end thereof in the second direction X partially overlaps with each of the two capacitor electrodes FGC2 (floating gate electrodes FG) which are adjacent to each other. From each of these two opening portions PB, exposed are a portion, in the second direction X (shorter direction), of each of the two capacitor electrodes FGC2 as well as the formation region (active region L3) of the p type semiconductor region 13.

In each of the two adjacent capacitor electrodes FGC2, an n type semiconductor region formed by the introduction of an n type impurity from the opening portion NB and a p type semiconductor region formed by the introduction of a p type impurity from the opening portion PB are arranged contiguous to each other. The junction surface between the n type semiconductor region and the p type semiconductor region of the capacitor electrode FGC2 is formed in the capacitor electrode FGC2 to extend along the longer direction (first direction Y) of the floating gate electrode FG.

In Embodiment 10, however, the junction surface (boundary surface) between the n type semiconductor region and p type semiconductor region is not formed at the neck portion FA of the floating gate electrode FG. The opening portion NB is therefore formed so that the long side (side crossing the longer direction of the floating gate electrode FG and extending along the second direction X) passes over the floating gate electrode FG at the small width portion thereof.

If the junction surface between the n type semiconductor region and p type semiconductor region is formed at the neck portion FA of the floating gate electrode FG so as to cross the longer direction (first direction Y) of the floating gate electrode FG, the pn junction surfaces crosses the potential supply direction, which deteriorates the transmission of a potential, thereby deteriorating the program-erase characteristics or read characteristics of data.

Figure 53:
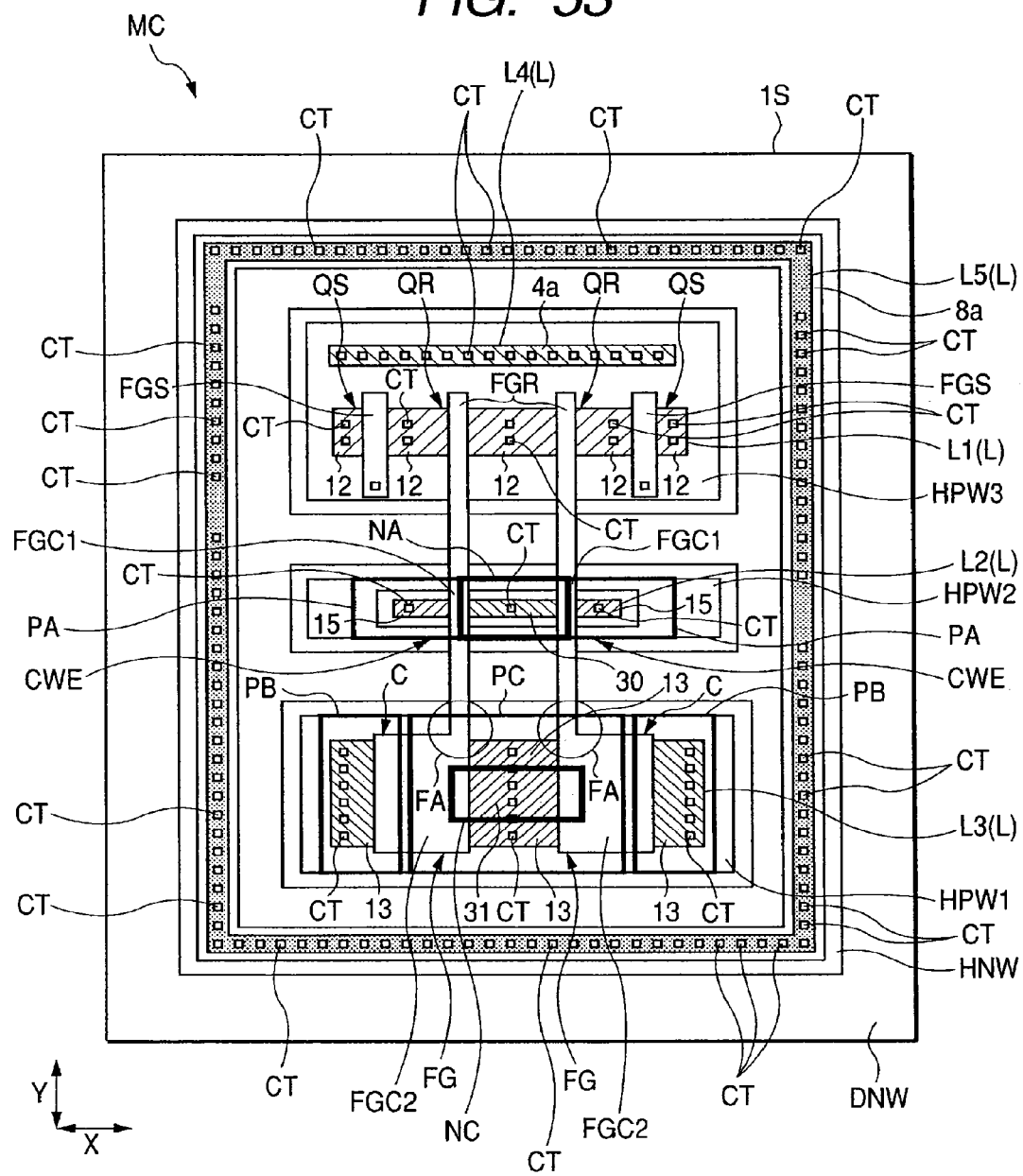
FIG. 53 is a plan view of a memory cell formation region on the main surface of a semiconductor substrate during a manufacturing step of a semiconductor device.

FIG. 53 illustrates one example of the formation of the pn junction surface at the neck portion FA. In this case, a resist film serving as a mask to be used at the time of introducing an n type impurity and a resist mask serving as a mask to be used at the time of introducing a p type impurity are respective resist films obtained separately by application.

An opening portion NC is an opening portion for introducing an n type impurity. This opening portion NC is placed between two capacitor electrodes FGC2 (floating gate electrodes FG) which are adjacent to each other while overlapping, at both ends thereof in the second direction X, with portions of these two capacitor electrodes FGC2 (floating gate electrodes FG). The length of the opening portion NC in the first direction Y is smaller than the length of the active region L3 in the first direction Y so that the neck portion FA is not exposed from this opening portion NC.

An opening portion PC is an opening portion for introducing a p type impurity. This opening portion PC is placed between two capacitor electrodes FGC2 (floating gate electrodes FG) adjacent to each other while overlapping, at both ends of the opening portion PC in the second direction X, with portions of these two capacitor electrodes FGC2 (floating gate electrodes FG). From the opening portion PC, exposed are the neck portion FA as well as the whole portion of the active region L3 between these two adjacent capacitor electrodes FGC2 and a larger portion, in the second direction X (shorter direction), of each of the two capacitor electrodes FGC2.

In this example, the n type semiconductor region 31 and p type semiconductor region 13 are formed in one active region L3 between the two capacitor electrodes FGC2. This structure is therefore effective to overcome the problem of depletion in the substrate 1S.

The floating gate electrode FG is made of n$^+$ polycrystalline silicon as described above so that the pn junction surface is formed inevitably at the neck portion FA so as to cross the longer direction of the floating gate electrode FG. The pn junction surface is therefore formed so as to cross the potential supply direction, which deteriorates the transmission of potential and as a result, deteriorates the program/erase characteristics or read-out characteristics of data.

When a silicide layer is formed on the upper surface of the floating gate electrode FG, existence of the pn junction surface to cross the longer direction of the floating gate electrode FG does not cause a problem, because potential can be supplied via the silicide layer. In Embodiment 10, on the other hand, no silicide layer is formed on the upper surface of the floating gate electrode FG so that formation of the pn junction surface to cross the longer direction of the floating gate electrode FG tends to deteriorate the transmission of potential. Accordingly, in this Embodiment 10, it is preferred not to form the pn junction surface particularly at the neck portion FA.

Figure 54:
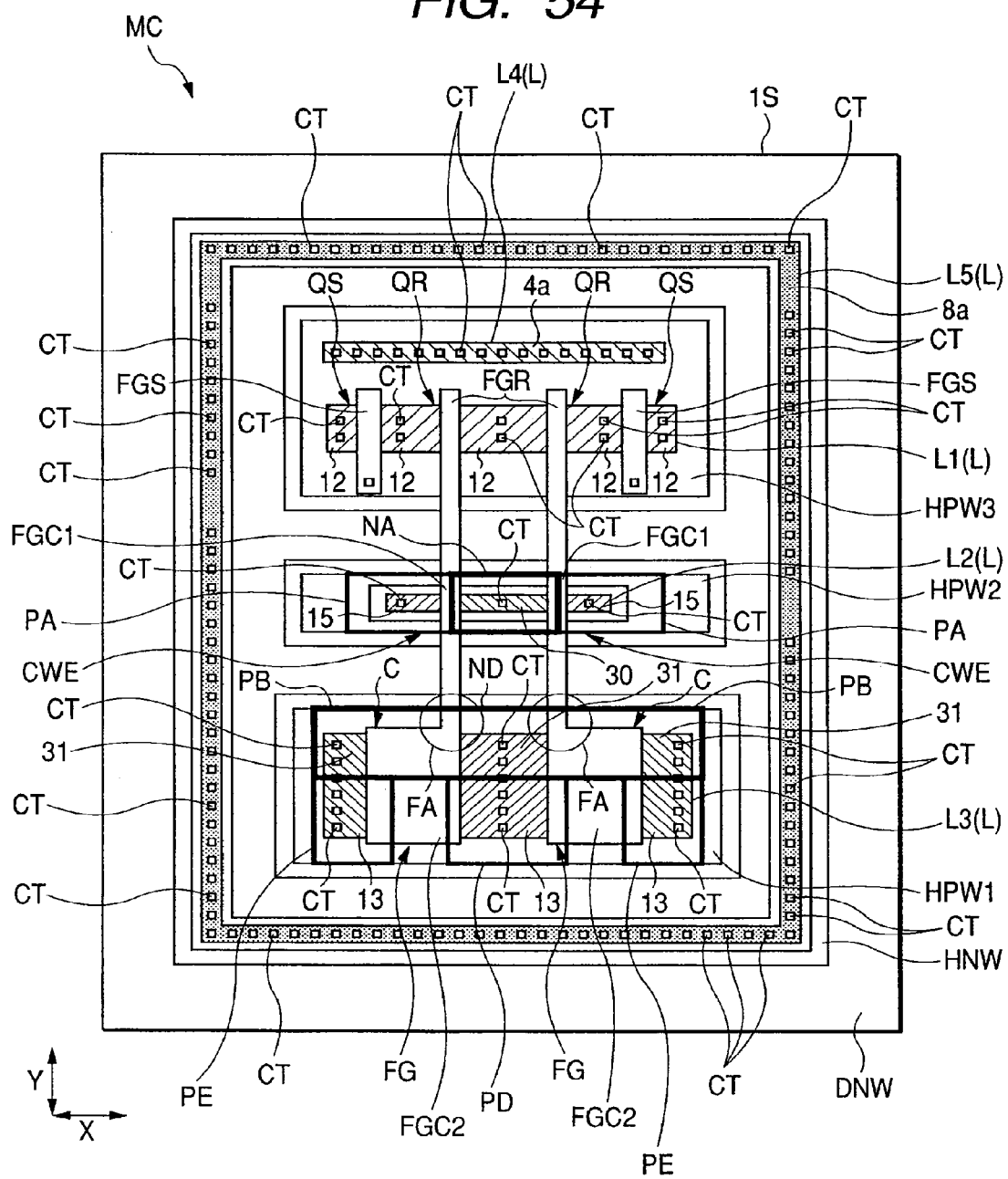
FIG. 54 is a plan view of a memory cell formation region on the main surface of a semiconductor substrate during a manufacturing step of a semiconductor device according to a still further embodiment of the present invention.

FIG. 54 illustrates another example in which the pn junction surface is not formed at the neck portion FA. Also in this case, a resist film serving as a mask to be used at the time of introducing an n type impurity and a resist film serving as a mask to be used at the time of introducing a p type impurity are respective resist films obtained separately by application.

An opening portion ND is an opening portion for introducing an n type impurity therefrom. This opening portion ND is placed so as to overlap with the upper portions of the two capacitor electrodes FGC2 (floating gate electrodes FG) adjacent to each other and active region L3. The length, in the first direction Y, of the opening portion ND is smaller than the length, in the first direction Y, of the active region L3, but from this opening portion ND, the neck portion FA is exposed. Opening portions PD and PE are those for introducing a p type impurity therefrom.

Formation of both the n type semiconductor region 31 and p type semiconductor region 13 in one active region L3 between two capacitor electrodes FGC as in this example is effective for overcoming the problem of a depletion layer in the substrate 1S. Since no pn junction surface is formed at the neck portion FA, this example is also effective for overcoming the problem of the deterioration in program/erase characteristics or read characteristics of data resulting from the deterioration in transmission of potential.

The formation of both the n type semiconductor region 31 and p type semiconductor region 13 in one active region L3 as in this example is however accompanied with the following problem. When a pn junction portion formed by the n type semiconductor region 31 and p type semiconductor region 13 is exposed to light during wet etching or washing, photovoltaic power is generated, causing a difference in an etching rate between the p type semiconductor region 31 and n type semiconductor region 13. In order to avoid such an inconvenience, the pn junction portion formed by the n type semiconductor region 31 and p type semiconductor region 13 of the semiconductor substrate 1S is not exposed to light during wet etching or washing. The constitution as illustrated in FIG. 54 can be adopted, but it is preferred not to form the pn junction in one active region L3.

Embodiment 11

In Embodiment 11, another constitution example for forming semiconductor regions different in the conductivity type for the floating gate electrode of a flash memory will be described.

Figure 55:
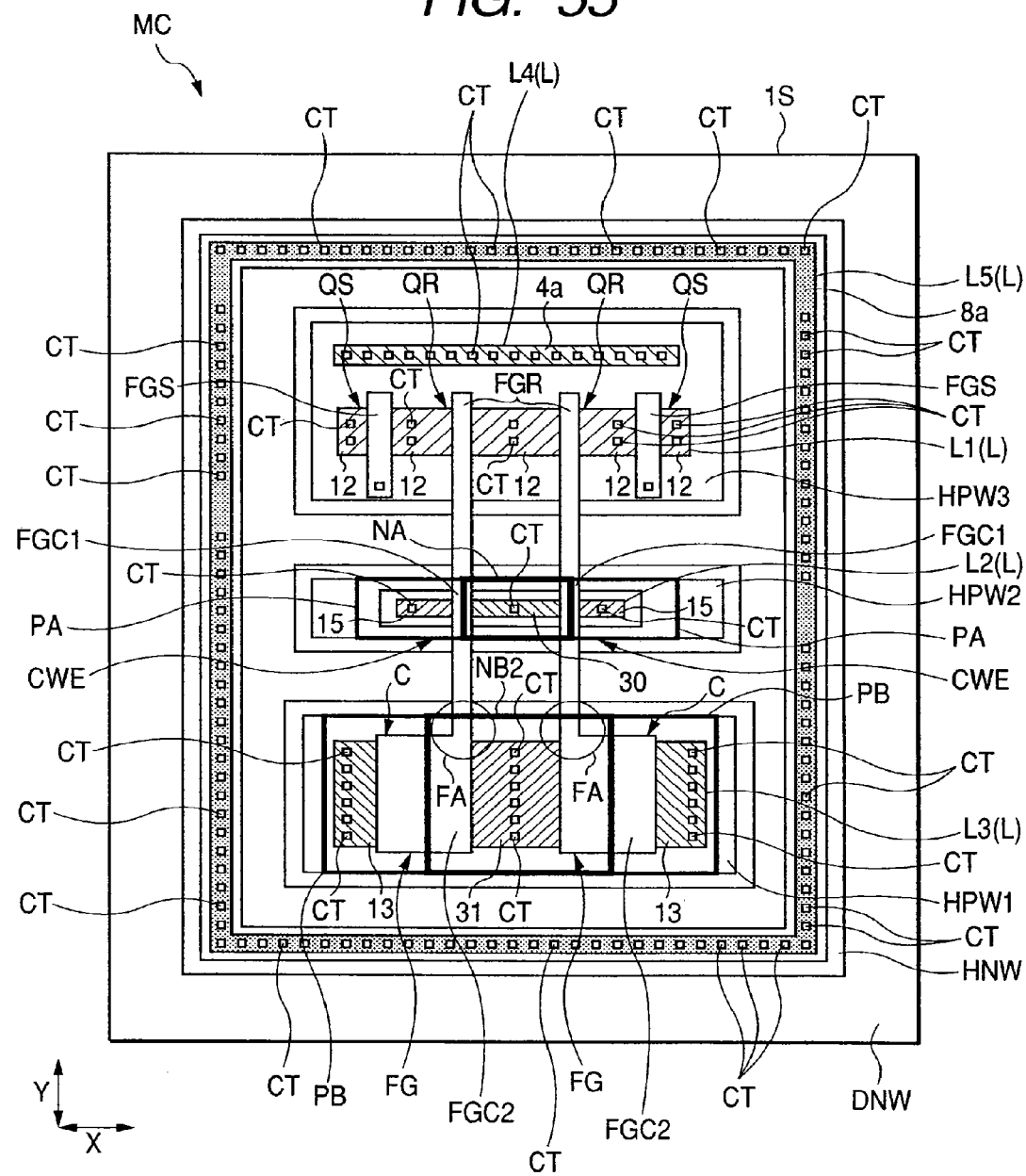
FIG. 55 is a plan view of a memory cell of a flash memory of a semiconductor device according to a still further embodiment of the present invention in which a mask to be used for the formation of n type semiconductor regions and p type semiconductor regions in the memory cell is illustrated.

FIG. 55 is a plan view of a memory cell MC of a flash memory of a semiconductor device according to Embodiment 11 in which a mask to be used for the formation of n type semiconductor regions 30 and 31 and p type semiconductor regions 13 and 15 in the memory cell MC is illustrated. Also in this example, a resist film serving as a mask to be used at the time of introducing an n type impurity and a resist mask serving as a mask to be used at the time of introducing a p type impurity are respective resist films obtained separately by application.

The memory cell MC of the flash memory according to Embodiment 11 which is illustrated in FIG. 55 is different from the constitution of the memory cell MC illustrated in FIG. 52 in the constitution of the opening portion NB2 in the capacitor portion. This opening portion NB2 is a plane square opening portion formed in the first resist film (mask) over the main surface of the substrate 1S (the wafer in this stage) during a manufacturing step of the semiconductor device according to Embodiment 11. It will be a region for introducing an n type impurity to form the n type semiconductor region 31.

The size or arrangement of this opening portion NB2 in the first direction Y is similar to that described above referring to FIG. 52. What is different in the opening portion NB2 is that the length, in the second direction X, of the opening portion NB2 extends from the center, in the second direction X (shorter direction), of one of two capacitor electrodes FGC2 adjacent to each other to the center, in the second direction X (shorter direction) of the other capacitor electrode FGC2. From the opening portion NB2, the whole of a portion of the active region L3 lying between the two adjacent capacitor electrodes FGC2 and a half portion, in the second direction X (shorter direction), of each of the two capacitor electrodes FGC2 are exposed.

Figure 56:
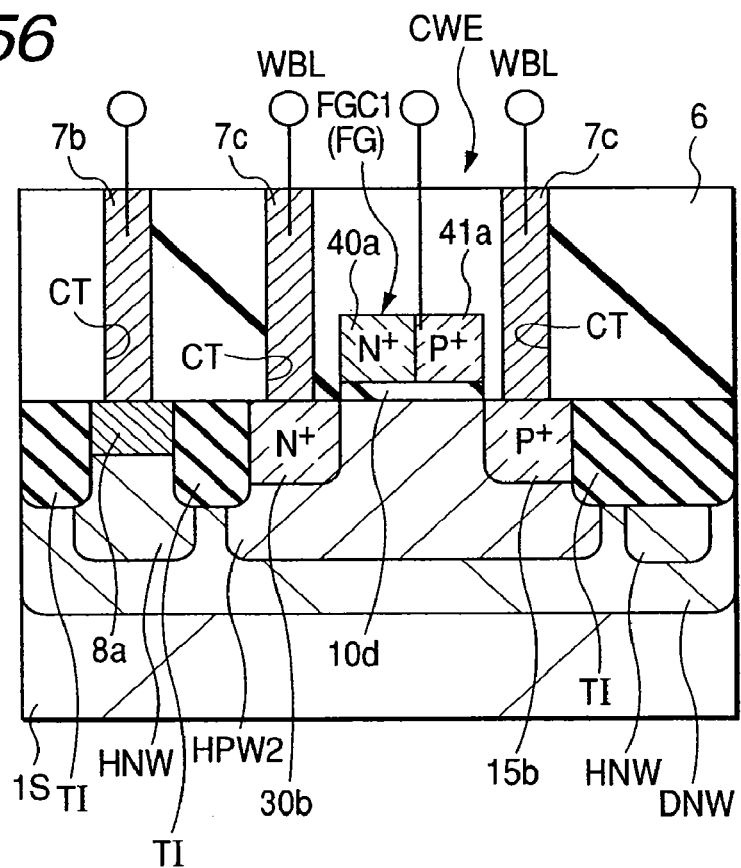
FIG. 56 is a fragmentary cross-sectional view, along the second direction X of a substrate, of the charge injection/emission portion of the memory cell in the flash memory of the semiconductor device according to the still further embodiment of the present invention.
Figure 57:
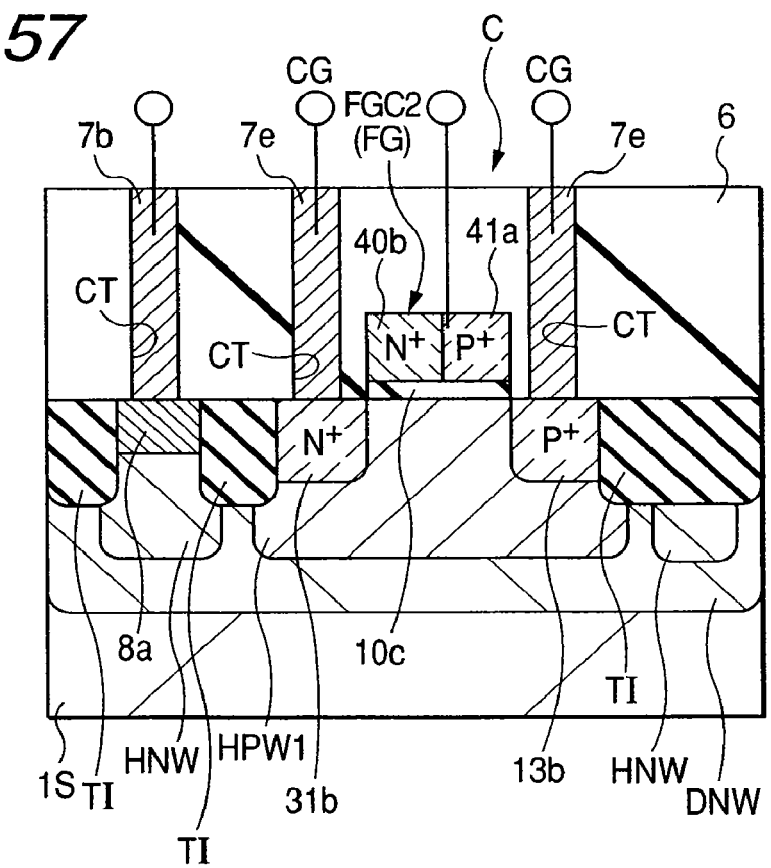
FIG. 57 is a fragmentary cross-sectional view, along the second direction X of the substrate, of a capacitor portion of the memory cell in the flash memory of the semiconductor device according to the still further embodiment of the present invention.

FIG. 56 is a fragmentary cross-sectional view, along the second direction X of the substrate 1S, of the charge injection/emission portion of the memory cell MC in the flash memory of the semiconductor device according to Embodiment 11; and FIG. 57 is a fragmentary cross-sectional view, along the second direction X of the substrate 1S, of the capacitor portion of the memory cell MC in the flash memory of the semiconductor device according to Embodiment 11.

In the capacitor electrodes FGC1 and FGC2 of the charge injection/emission portion and capacitor portion, as illustrated in FIGS. 56 and 57, each of $n^+$ type semiconductor regions 40a and 40b and each of $p^+$ type semiconductor regions 41a and 41b are arranged along the second direction, respectively. In portions other than the capacitor portions CWE and C, the floating gate electrode is an $n^+$ type. The other constitution of the floating gate electrode FG is similar to Embodiment 10.

Such a constitution is adopted because when the conductivity type of the capacitor electrode FGC1 or FGC2 is single, the whole surface below the capacitor electrodes FGC1 or FGC2 sometimes becomes depleted owing to a voltage applied to the p well HPW1 or HPW2. For example, when a entire portion of the capacitor electrode FGC1 or FGC2 is an $n^+$ type, application of a negative voltage to the p well HPW1 or HPW2 generates a depletion layer in the whole portion below the capacitor electrode FGC1 or FGC2 (on the side of a portion brought into contact with the gate insulating film 10c or 10d), though application of a positive voltage to the p well HPW1 or HPW2 does not cause such a problem. As a result, a reduction in effective coupling capacity lowers, which leads to a reduction in the potential control efficiency of the capacitor electrode FGC1 or FGC2 (floating gate electrode FG). This retards the programming speed and erasing speed of data and in addition, the data programming speed and erasing speed become unstable.

According to Embodiment 11, on the other hand, the formation of semiconductor regions having both conductivity types, that is, p type and n type, in the capacitor electrode FGC1 or FGC2 makes it possible to leave one of two halves, which lie below the capacitor electrode FGC1 or FGC2, undepleted even if either a positive or negative voltage is applied to the p well HPW1 or HPW2. This enables to increase the effective coupling capacity and thereby control the potential of the capacitor electrode FGC1 or FGC2 (floating gate electrodes FG) efficiently. Accordingly, the programming speed and erasing speed of data can be improved. In addition, the data programming speed or erasing speed can be made stable.

One example of the state of the capacitor portion C at the time of programming or erasing data in the memory cell MC will be described referring to FIGS. 58 and 59. The state of the capacitor portion C of the memory cell MC will be described here, but this also applies to the charge injection/emission portion (capacitor portion CWE).

Figure 58:
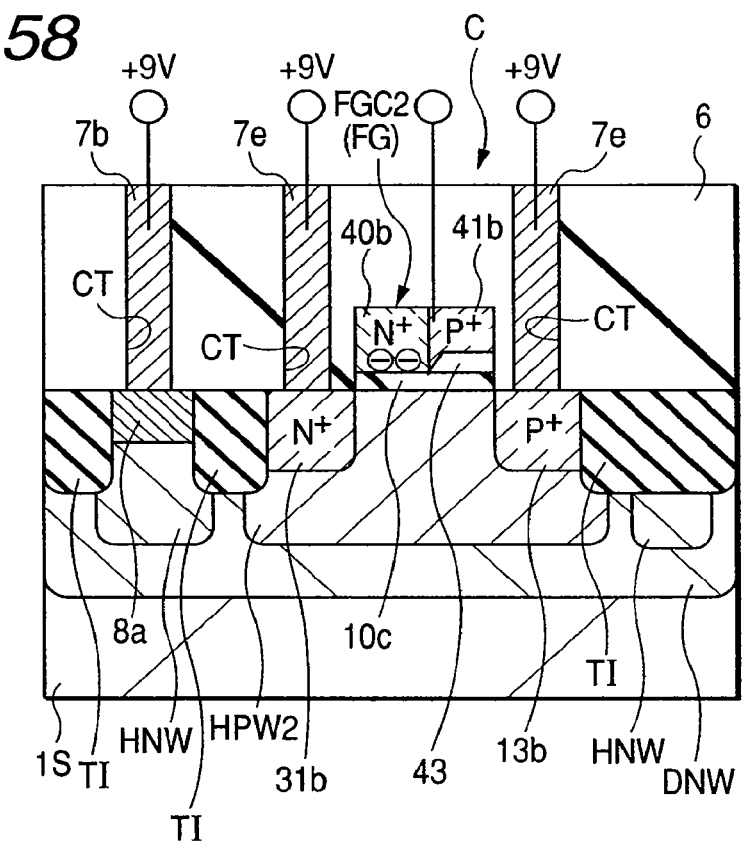
FIG. 58 is a fragmentary cross-sectional view, along the second direction of X of the semiconductor substrate, of the capacitor portion at the time of data program operation of the memory cell in the flash memory of the semiconductor device according to the still further embodiment of the present invention.

FIG. 58 is a fragmentary cross-sectional view, along the second direction of X of the semiconductor substrate 1S, of the capacitor portion C at the time of data programming in the memory cell MC according to Embodiment 11.

At the time of programming data, a positive voltage of, for example, about +9V is applied to the p well HPW1 of the capacitor portion C. In this case, a depletion layer 43 is formed in the $p^+$ type semiconductor region 41b of the capacitor electrode FGC2, but no depletion layer 43 is formed in the $n^+$ type semiconductor region 40b of the capacitor electrode FGC2. This makes it possible to maintain an effective coupling capacity so that the potential of the capacitor electrode FGC2 (floating gate electrode FG) can be controlled efficiently. The programming speed of data can therefore be improved. In addition, the data programming speed can be made stable.

Figure 59:
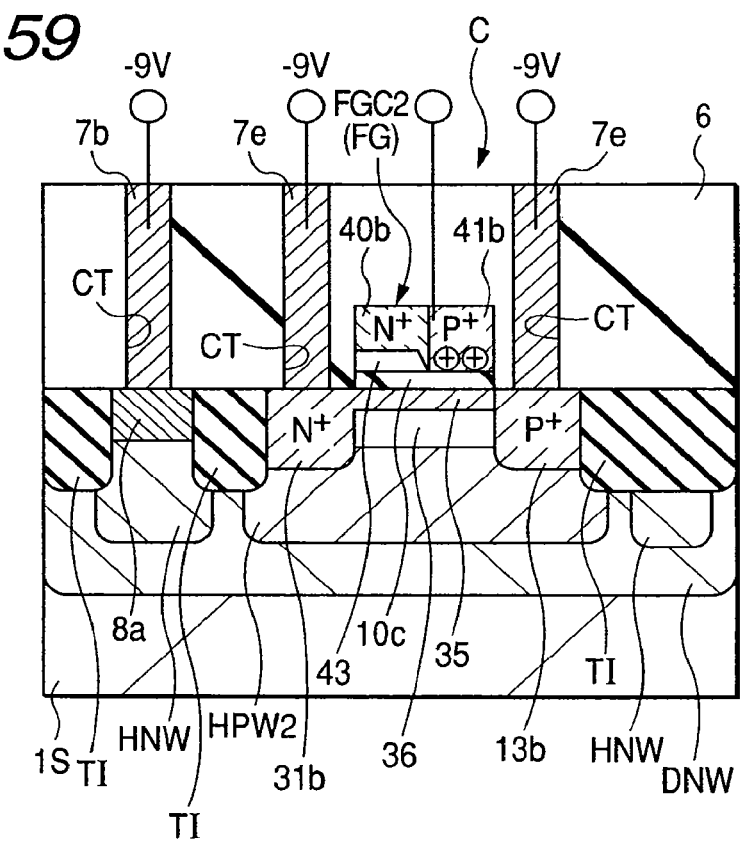
FIG. 59 is a fragmentary cross-sectional view, along the second direction X of the semiconductor substrate, of the capacitor portion at the time of data erase operation of the memory cell in the flash memory of the semiconductor device according to the still further embodiment of the present invention.

FIG. 59 is a fragmentary cross-sectional view, along the second direction X of the substrate 1S, of the capacitor portion C at the time of erasing data in the memory cell MC according to Embodiment 11.

At the time of erasing data, a negative voltage of, for example, about −9V is applied to the p well HPW1 of the capacitor portion C. In this case, a depletion layer 43 is formed in the $n^+$ type semiconductor region 40b of the capacitor electrode FGC2, but no depletion layer 43 is formed in the $p^+$ type semiconductor region 41b of the capacitor electrode FGC2. This makes it possible to maintain an effective coupling capacity so that the potential of the capacitor electrode FGC2 (floating gate electrode FG) can be controlled efficiently. The erasing speed of data can therefore be improved. In addition, the data erasing speed can be made stable.

The invention made by the present inventors was described specifically based on some embodiments. The invention is not limited to or by these embodiments. It is needless to say that various changes can be made without departing from the scope of the invention.

In the above description, the invention made by the present inventors is applied to a manufacturing method of a semiconductor device as the field of utilization which constitutes the background of the invention. The invention can be applied not only to it but also to various methods, for example, a manufacturing method of a micromachine. In this case, simple information of the micromachine has can be stored by forming the above-described flash memory on a semiconductor substrate having the micromachine formed thereon.

The present invention can be applied to the manufacturing industry of semiconductor devices having a nonvolatile memory.

The invention claimed is:

1. A semiconductor device having a nonvolatile memory cell, comprising:
   a semiconductor substrate;
   a first well having a first conductivity type and formed in the semiconductor substrate;
   a second well having a second conductivity type opposite to the first conductivity type and formed in the first well;
   a third well having the second conductivity type, formed in the first well and electrically separated from the second well; and
   a floating gate formed over the second and third wells, wherein the nonvolatile memory cell has an element for programming and erasing data arranged over the second well and a capacitor element arranged over the third well, wherein the element for programming and erasing data includes:

a first portion of the floating gate formed over the second well;

a first impurity region formed in the second well and having the first conductivity type;

a second impurity region formed in the second well, having the second conductivity type and having a higher concentration than the first impurity region;

a third impurity region formed in the second well and having the second conductivity type; and a fourth impurity region formed in the second well, having the second conductivity type and having a higher concentration than the third impurity region, wherein the capacitor element includes:

a second portion of the floating gate formed over the third well;

a fifth impurity region formed in the third well and having the first conductivity type;

a sixth impurity region formed in the third well, having the first conductivity type and having a higher concentration than the fifth impurity region;

a seventh impurity region formed in the third well and having the second conductivity type; and an eighth impurity region formed in the third well, having the second conductivity type and having a higher concentration than the seventh impurity region, wherein the first and second impurity regions are arranged on a first side of the floating gate, wherein the third and fourth impurity regions are arranged on a second side opposite to the first side of the floating gate, wherein the first and second impurity regions are physically away from the third and fourth impurity regions, wherein the fifth and sixth impurity regions are arranged the on the first side of the floating gate, wherein the seventh and eighth impurity regions are arranged on the second side of the floating gate, and wherein the fifth and sixth impurity regions are physically away from the seventh and eighth impurity regions.

2. A semiconductor device according to claim 1,
wherein the first conductivity type is n-type, and
wherein the second conductivity type is p-type.

3. A semiconductor device according to claim 1,
wherein silicide layers are formed on the second, fourth, sixth and eighth impurity regions, and
wherein the silicide layers are not formed on the floating gate.

4. A semiconductor device according to claim 1,
wherein the first portion of the floating gate has both a first conductivity type semiconductor region and a second conductivity type semiconductor region.

5. A semiconductor device according to claim 4,
wherein the floating gate is extended in a first direction, and
wherein the first conductivity type semiconductor region and the second conductivity type semiconductor region of the first portion of the floating gate are disposed so that the conductivity type of the floating gate is separated into the first conductivity type and the second conductivity type along a second direction that crosses the first direction.

6. A semiconductor device according to claim 1,
wherein the second portion of the floating gate has both a first conductivity type semiconductor region and a second conductivity type semiconductor region.

7. A semiconductor device according to claim 6,
wherein the floating gate is extended in a first direction, and
wherein the first conductivity type semiconductor region and the second conductivity type semiconductor region of the second portion of the floating gate are disposed so that the conductivity type of the floating gate is separated into the first conductivity type and the second conductivity type along a second direction that crosses the first direction.

8. A semiconductor device according to claim 1,
wherein each of the first and second portions of the floating gate has both a first conductivity type semiconductor region and a second conductivity type semiconductor region.

9. A semiconductor device according to claim 8,
wherein the floating gate is extended in a first direction, and
wherein the first conductivity type semiconductor region and the second conductivity type semiconductor region of each said portion of the floating gate are disposed so that the conductivity type of the floating gate is separated into the first conductivity type and the second conductivity type along a second direction that crosses the first direction.

10. A semiconductor device according to claim 1,
wherein, at a time of data writing operation, electrons are injected into the floating gate by FN tunneling in the element for programming and erasing data, and
wherein, at a time of data erasing operation, electrons are emitted from the floating gate by FN tunneling in the element for programming and erasing data.

11. A semiconductor device according to claim 1,
wherein, at a time of data writing operation, a negative voltage of a first absolute value is supplied to the second impurity region and the fourth impurity region, and a positive voltage of the first absolute value is supplied to the first well, the sixth impurity region and the eighth impurity region, and
wherein, at a time of data erasing operation, a negative voltage of the first absolute value is supplied to the first well, the second impurity region and the fourth impurity region, and a positive voltage of the first absolute value is supplied to the sixth impurity region and the eighth impurity region.

12. A semiconductor device according to claim 1, further comprising sidewalls of insulating film formed on sides of the floating gate,
wherein the first, third, fifth and seventh impurity regions are formed in self-alignment with the floating gate, and
wherein the second, fourth, sixth and eighth impurity regions are formed in self-alignment with the sidewalls.

13. A semiconductor device having a nonvolatile memory cell, comprising:

a semiconductor substrate;

a first well having a first conductivity type and formed in the semiconductor substrate;

a second well having a second conductivity type opposite to the first conductivity type and formed in the first well;

a third well having the second conductivity type, formed in the first well and electrically separated from the second well; and a floating gate formed over the second and third wells, wherein the nonvolatile memory cell has an element for programming and erasing data arranged over the second well and a capacitor element arranged over the third well, wherein the element for programming and erasing data includes:

a first portion of the floating gate formed over the second well;

a first impurity region formed in the second well and having the first conductivity type;

a second impurity region formed in the second well, having the second conductivity type and having a higher concentration than the first impurity region;

a third impurity region formed in the second well and having the second conductivity type; and a fourth impurity region formed in the second well, having the second conductivity type and having a higher concentration than the third impurity region, wherein the capacitor element includes:

a second portion of the floating gate formed over the third well;

a fifth impurity region formed in the third well and having the second conductivity type;

a sixth impurity region formed in the third well, having the second conductivity type and having a higher concentration than the fifth impurity region;

a seventh impurity region formed in the third well and having the second conductivity type; and an eighth impurity region formed in the third well, having the second conductivity type and having a higher concentration than the seventh impurity region, wherein the first and second impurity regions are arranged on a first side of the floating gate, wherein the third and fourth impurity regions are arranged on a second side opposite to the first side of the floating gate, and wherein the first and second impurity regions are physically away from the third and fourth impurity regions.

14. A semiconductor device according to claim 13,
wherein the first conductivity type is n-type, and
wherein the second conductivity type is p-type.

15. A semiconductor device according to claim 13,
wherein silicide layers are formed on the second, fourth, sixth and eighth impurity regions, and
wherein the silicide layers are not formed on the floating gate.

16. A semiconductor device according to claim 13,
wherein the first portion of the floating gate has both a first conductivity type semiconductor region and a second conductivity type semiconductor region.

17. A semiconductor device according to claim 16,
wherein the floating gate is extended in a first direction, and
wherein the first conductivity type semiconductor region and the second conductivity type semiconductor region of the first portion of the floating gate are disposed so that the conductivity type of the floating gate is separated into the first conductivity type and the second conductivity type along a second direction that crosses the first direction.

18. A semiconductor device according to claim 13,
wherein, at a time of data writing operation, electrons are injected into the floating gate by FN tunneling in the element for programming and erasing data, and
wherein, at a time of data erasing operation, electrons are emitted from the floating gate by FN tunneling in the element for programming and erasing data.

19. A semiconductor device according to claim 13,
wherein, at a time of data writing operation, a negative voltage of a first absolute value is supplied to the second impurity region and the fourth impurity region, and a positive voltage of the first absolute value is supplied to the first well, the sixth impurity region and the eighth impurity region, and
wherein, at a time of data erasing operation, a negative voltage of the first absolute value is supplied to the first well, the second impurity region and the fourth impurity region, and a positive voltage of the first absolute value is supplied to the sixth impurity region and the eighth impurity region.

20. A semiconductor device according to claim 13, further comprising sidewalls of insulating film formed on sides of the floating gate,
wherein the first, third, fifth and seventh impurity regions are formed in self-alignment with the floating gate, and
wherein the second, fourth, sixth and eighth impurity regions are formed in self-alignment with the sidewalls.

21. A semiconductor device having a nonvolatile memory cell, comprising:

a semiconductor substrate;

a first well having a first conductivity type and formed in the semiconductor substrate;

a second well having a second conductivity type opposite to the first conductivity type and formed in the first well;

a third well having the second conductivity type, formed in the first well and electrically separated from the second well; and a floating gate formed over the second and third wells, wherein the nonvolatile memory cell has an element for programming and erasing data arranged over the second well and a capacitor element arranged over the third well, wherein the element for programming and erasing data includes:

a first portion of the floating gate formed over the second well;

a first impurity region formed in the second well and having the second conductivity type;

a second impurity region formed in the second well, having the second conductivity type and having a higher concentration than the first impurity region;

a third impurity region formed in the second well and having the second conductivity type; and a fourth impurity region formed in the second well, having the second conductivity type and having a higher concentration than the third impurity region, wherein the capacitor element includes:

a second portion of the floating gate formed over the third well;

a fifth impurity region formed in the third well and having the first conductivity type;

a sixth impurity region formed in the third well, having the first conductivity type and having a higher concentration than the fifth impurity region;

a seventh impurity region formed in the third well and having the second conductivity type; and an eighth impurity region formed in the third well, having the second conductivity type and having a higher concentration than the seventh impurity region, wherein the fifth and sixth impurity regions are arranged on a first side of the floating gate, wherein the seventh and eighth impurity regions are arranged on a second side opposite to the first side of the floating gate, and wherein the fifth and sixth impurity regions are physically away from the seventh and eighth impurity regions.

22. A semiconductor device according to claim 21,
wherein the first conductivity type is n-type, and
wherein the second conductivity type is p-type.

23. A semiconductor device according to claim 21,
wherein silicide layers are formed on the second, fourth, sixth and eighth impurity regions, and
wherein the silicide layers are not formed on the floating gate.

24. A semiconductor device according to claim 21,
wherein the second portion of the floating gate has both a first conductivity type semiconductor region and a second conductivity type semiconductor region.

25. A semiconductor device according to claim 24,
wherein the floating gate is extended in a first direction, and
wherein the first conductivity type semiconductor region and the second conductivity type semiconductor region of the second portion of the floating gate are disposed so that the conductivity type of the floating gate is separated into the first conductivity type and the second conductivity type along a second direction that crosses the first direction.

26. A semiconductor device according to claim 21,
wherein, at a time of data writing operation, electrons are injected into the floating gate by FN tunneling in the element for programming and erasing data, and
wherein, at a time of data erasing operation, electrons are emitted from the floating gate by FN tunneling in the element for programming and erasing data.

27. A semiconductor device according to claim 21,
wherein, at a time of data writing operation, a negative voltage of a first absolute value is supplied to the second impurity region and the fourth impurity region, and a positive voltage of the first absolute value is supplied to the first well, the sixth impurity region and the eighth impurity region, and
wherein, at a time of data erasing operation, a negative voltage of the first absolute value is supplied to the first well, the second impurity region and the fourth impurity region, and a positive voltage of the first absolute value is supplied to the sixth impurity region and the eighth impurity region.

28. A semiconductor device according to claim 21, further comprising sidewalls of insulating film formed on sides of the floating gate,
wherein the first, third, fifth and seventh impurity regions are formed in self-alignment with the floating gate, and
wherein the second, fourth, sixth and eighth impurity regions are formed in self-alignment with the sidewalls.

* * * * *